(12) United States Patent
Rockwood

(10) Patent No.: US 11,907,617 B2
(45) Date of Patent: Feb. 20, 2024

(54) SURFACE PATCH TECHNIQUES FOR COMPUTATIONAL GEOMETRY

(71) Applicant: CAD-Sense LLC, Austin, TX (US)

(72) Inventor: Alyn P. Rockwood, Niwot, CO (US)

(73) Assignee: CAD-Sense LLC, Frisco, TX (US)

( * ) Notice: Subject to any disclaimer, the term of this patent is extended or adjusted under 35 U.S.C. 154(b) by 0 days.

(21) Appl. No.: 17/816,718

(22) Filed: Aug. 1, 2022

(65) Prior Publication Data

US 2023/0131481 A1    Apr. 27, 2023

Related U.S. Application Data

(63) Continuation of application No. 16/582,883, filed on Sep. 25, 2019, now Pat. No. 11,403,434, and a
(Continued)

(51) Int. Cl.
*G06F 30/00* (2020.01)
*G06T 17/10* (2006.01)
(Continued)

(52) U.S. Cl.
CPC ............ *G06F 30/00* (2020.01); *G06F 17/10* (2013.01); *G06T 15/10* (2013.01); *G06T 17/10* (2013.01); *G06T 17/30* (2013.01)

(58) Field of Classification Search
None
See application file for complete search history.

(56) References Cited

U.S. PATENT DOCUMENTS

| | | |
|---|---|---|
| 3,882,304 A | 5/1975 | Walters |
| 4,625,289 A | 11/1986 | Rockwood |

(Continued)

FOREIGN PATENT DOCUMENTS

| | | |
|---|---|---|
| EP | 0303706 | 2/1989 |
| HU | 212138 | 3/1992 |

(Continued)

OTHER PUBLICATIONS

Schmitt, Francis JM, Brian A. Barsky, and Wen-Hui Du. "An adaptive subdivision method for surface-fitting from sampled data." Proceedings of the 13th annual conference on Computer graphics and interactive techniques. 1986.*

(Continued)

*Primary Examiner* — Ryan M Gray

(57) ABSTRACT

A method and system for computer aided design (CAD) is disclosed for designing geometric objects, wherein interpolation and/or blending between such objects is performed while deformation data is being input. Thus, a designer obtains immediate feedback to input modifications without separately entering a command(s) for performing such deformations. A novel N-sided surface generation technique is also disclosed herein to efficiently and accurately convert surfaces of high polynomial degree into a collection of lower degree surfaces. E.g., the N-sided surface generation technique disclosed herein subdivides parameter space objects (e.g., polygons) of seven or more sides into a collection of subpolygons, wherein each subpolygon has a reduced number of sides. More particularly, each subpolygon has 3 or 4 sides. The present disclosure is particularly useful for designing the shape of surfaces. Thus, the present disclosure is applicable to various design domains such as the design of, e.g., bottles, vehicles, and watercraft. Additionally, the present disclosure provides for efficient animation via repeatedly modifying surfaces of an animated object such as a representation of a face.

20 Claims, 39 Drawing Sheets

(4 of 39 Drawing Sheet(s) Filed in Color)

Related U.S. Application Data continuation of application No. 15/043,880, filed on Feb. 15, 2016, now abandoned, which is a continuation of application No. 14/461,439, filed on Aug. 17, 2014, now Pat. No. 9,262,859, which is a continuation of application No. 13/607,590, filed on Sep. 7, 2012, now Pat. No. 8,836,701, which is a continuation of application No. 12/460,587, filed on Jul. 20, 2009, now abandoned.

(60) Provisional application No. 61/135,341, filed on Jul. 18, 2008, provisional application No. 61/211,714, filed on Apr. 1, 2009.

(51) Int. Cl.
G06T 17/30 (2006.01)
G06T 15/10 (2011.01)
G06F 17/10 (2006.01)

(56) References Cited

U.S. PATENT DOCUMENTS

| | | |
|---|---|---|
| 4,791,583 A | 12/1988 | Colburn |
| 4,821,214 A | 4/1989 | Sederberg |
| 5,123,087 A | 6/1992 | Newell et al. |
| 5,185,855 A | 2/1993 | Kato et al. |
| 5,237,647 A | 8/1993 | Roberts et al. |
| 5,251,160 A | 10/1993 | Rockwood et al. |
| 5,257,203 A | 10/1993 | Riley et al. |
| 5,299,302 A | 3/1994 | Fiasconaro |
| 5,321,766 A | 6/1994 | Fraas et al. |
| 5,345,546 A | 9/1994 | Harada et al. |
| 5,459,821 A | 10/1995 | Kuriyama et al. |
| 5,473,742 A | 12/1995 | Polyakov et al. |
| 5,481,659 A | 1/1996 | Nosaka et al. |
| 5,497,451 A | 3/1996 | Holmes |
| 5,510,995 A | 4/1996 | Oliver |
| 5,557,719 A | 9/1996 | Ooka et al. |
| 5,579,464 A | 11/1996 | Saito et al. |
| 5,608,856 A | 3/1997 | McInally |
| 5,619,625 A | 4/1997 | Konno et al. |
| 5,636,338 A * | 6/1997 | Moreton .......... G06T 17/30 345/442 |
| 5,731,816 A | 3/1998 | Stewart et al. |
| 5,745,666 A | 4/1998 | Gilley et al. |
| 5,748,192 A | 5/1998 | Lindholm |
| 5,774,359 A | 6/1998 | Taneja |
| 5,818,452 A | 10/1998 | Atkinson et al. |
| 5,856,828 A | 1/1999 | Letcher, Jr. |
| 5,963,209 A | 10/1999 | Hoppe |
| 5,966,133 A | 10/1999 | Hoppe |
| 6,133,922 A | 10/2000 | Opitz |
| 6,204,860 B1 | 3/2001 | Singh |
| 6,256,038 B1 | 7/2001 | Krishnamurthy |
| 6,268,871 B1 | 7/2001 | Rice et al. |
| 6,271,856 B1 * | 8/2001 | Krishnamurthy ....... G06T 11/40 345/581 |
| 6,281,905 B1 | 8/2001 | Massabo et al. |
| 6,369,815 B1 | 4/2002 | Celniker et al. |
| 6,718,291 B1 | 4/2004 | Shapiro et al. |
| 6,806,874 B2 * | 10/2004 | Biermann ............ G06T 17/20 345/420 |
| 7,196,702 B1 | 3/2007 | Rockwood et al. |
| 7,236,167 B2 | 6/2007 | Lee et al. |
| 7,417,635 B2 | 8/2008 | Rockwood et al. |
| 7,636,091 B2 | 12/2009 | Lee et al. |
| 7,755,623 B2 | 7/2010 | Rockwood et al. |
| 8,836,701 B1 * | 9/2014 | Rockwood ............. G06F 30/10 345/441 |
| 2006/0267978 A1 * | 11/2006 | Litke .................. G06T 17/20 345/419 |

FOREIGN PATENT DOCUMENTS

| | | |
|---|---|---|
| JP | 06-096163 | 4/1994 |
| WO | WO 95/11489 | 4/1995 |
| WO | WO 95/30209 | 11/1995 |
| WO | WO 01/08102 | 2/2002 |
| WO | WO 02/25587 | 3/2002 |

OTHER PUBLICATIONS

Celniker, George, and Dave Gossard. "Deformable curve and surface finite-elements for free-form shape design." Proceedings of the 18th annual conference on Computer graphics and interactive techniques. 1991.*

Celniker, G., and W. Welch. "Linear constrains for deformable B-spline surface." Proceedings of the Symposium on Interactive 3D Graphics. 1992.*

Welch, William, and Andrew Witkin. "Variational surface modeling." Acm Siggraph computer graphics 26.2 (1992): 157-166.*

Welch, William, and A. Witkin. Serious Putty: topological design for variational curves and surfaces. Diss. Carnegie Mellon University, 1995.*

Francis, George K. "The folded ribbon theorem. A contribution to the study of immersed circles." Transactions of the American Mathematical Society 141 (1969): 271-303.*

Zhao, Yan, and Alyn Rockwood. "A convolution approach ton-sided patches and vertex blending." Designing Fair Curves and Surfaces (1994): 295-314.

U.S. Appl. No. 12/460,587, filed Jul. 20, 2009, Rockwood. "A Technology Marketing White Paper: Dassault Acquires Spatial Technology: The think3 Position," think3, 1999, 7 pages.

"A Technology Marketing White Paper: Mass 3-D," think3, 1999, 23 pages.

"Global Shape Modeling, " think3, Oct. 2000, 2 pages.

"Mass 3-D Technology-Unsurpassed," think3, 2000, 2 pgs.

"Part Modeling User's. Guide: Surface Features," 1997, 39 pages.

"Product Demo: Surface Works Slide Show," AeroHydro, Inc., 1998, 1 page.

"Shape Modeling Description: New Computation Techniques for Shape Modeling and Design: Overview," publication believed to be 1996, 15 pages.

"Sweeps, Blends, and Advanced Features, " Parametric Technology Corp., 1998, pp. 1-46.

Adobe Premiere 3.0 User's Guide, 1993, 7 pages.

Albrecht, G., "A geometrical design handle for rational triangular Bezier patches," The Mathematics of Surfaces VII, Editors: Goodman and Martin, Information Geometers, 1997, pp. 161-171.

Amburn et al., "Managing Geometric Complexity with Enhanced Procedural Models," Computer Graphics Proceedings, (SIGGRAPH '86), 1986, vol. 20(4), 1986, pp. 189-195.

Amenta et al., "A New Voronoi-Based Surface Reconstruction Algorithm," SIGGRAPH 98, Orlando, Florida, Jul. 19-24, 1998, pp. 415-421.

Atteia et al., "Spline elastic Manifolds," Mathematical Methods in Computer Aided Geometric Design, Editors: Lynch and Schumaker, 1989, pp. 45-50.

Baining Guo, "Avoiding Topological Anomalies in Quadric Surface Patches," from Mathematical Methods for Curves and Surfaces, Editors: Lyche and Schumaker, copyright Vanderbilt University Press 1995, pp. 177-186, ISBN 8265-1268-2.

Bajaj et al., "Smoothing Polyhedra using Implicit Algebraic Splines," Computer Graphics, vol. 26, No. 2, 1992, pp. 79-88.

Ball, A.A., "CAD: master or servant of engineering?," The Mathematics of Surfaces VII, Editors: Goodman and Martin, Information Geometers, 1997, pp. 17-33.

Barghiel et al., "Pasting Spline Surfaces," from Mathematical Methods for Curves and Surfaces, Editors: Lyche and Schumaker, copyright Vanderbilt University Press 1995, pp. 31-40, ISBN 8265-1268- 2.

Barnhill, R.E., "Computer Aided Surface Representation and Design," Surfaces in Computer Aided Geometric Design, NorthHolland Publishing, 1983, pp. 1-24.

(56) References Cited

OTHER PUBLICATIONS

Barnhill, R.E., "Surfaces in Computer Aided Geometric Design: A survey with new results," Surfaces in CAGD '84, Elsevier Science Publishers B.V. (North-Holland), 1984, pp. 1-17.
Barry et al., "A Recursive Evaluation Algorithm for a Class of Catmull-Rom Splines," Computer Graphics, (SIGGRAPH '88), vol. 22, No. 4, 1988, pp. 199-204.
Barry et al., "What is the Natural Generalization of a Bezier Curve?," Mathematical Methods in Computer Aided Geometric Design, Editors: Lynch and Schumaker, 1989, pp. 71-85.
Bartels et al., "Curve-to-Curve Associations in Spline-Based Inbetweening and Sweeping," Computer Graphics, vol. 23, No. 3, 1989, pp. 167-174.
Billera et al., "Grobner Basis Methods for Multivariate Splines," Mathematical Methods in Computer Aided Geometric Design, Editors: Lynch and Schumaker, 1989, pp. 93-104.
Blanc et al., "X-Splines: A Spline Model Designed for the End-User," Computer Graphics Proceedings, (SIGGRAPH '95), 1995, pp. 377-386.
Bloomenthal et al., "Convolution Surfaces," Computer Graphics, vol. 25, No. 4, 1991, p. 251256.
Bloomenthal et al., "Introduction to Implicit Surfaces, Chapter 3-Implicit Surface Patches, " pp. 99-125, 1997.
Bloomenthal et al., "Introduction to Implicit Surfaces, Chapter 6-Blending, " pp. 197-221, 1997.
Bloomenthal et al., "Introduction to Implicit Surfaces, Chapter ?----Convolution of Skeletons," pp. 223-241, 1997.
Bloomenthal et al., "Introduction to Implicit Surfaces, Chapter 9-Implicit Surfaces in Physically Based Animation," pp. 271-293, 1997.
Bloomenthal et al., Polygonization of Non-manifold Implicit Surfaces, Computer Graphics Proceedings, (SIGGRAPH '95), 1995, pp. 309-316.
Bloor et al., "The PDE method in geometric and functional design," The Mathematics of Surfaces VII, Editors: Goodman and Martin, Information Geometers, 1997, pp. 281-307.
Boehm, W., "Generating the Bezier Points of Triangular Splines," Surfaces in Computer Aided Geometric Design, North-Holland Publishing, 1983, pp. 77-91.
Boehm, Wolfgang, On the efficiency of knot insertion algorithms, Computer Aided Geometric Design 2, Elsevier Science Publishers B.V. (North-Holland), 1985, pp. 141-143.
Boehm, Wolfgang, "Smooth Curves and Surfaces, " Geometric Modeling: Algorithms andNewTrends, Editor: Farin, 1987, pp. 175-184.
Boehm, Wolfgang, "The De Boor Algorithm for Triangular Splines," Surfaces in Computer Aided Geometric Design, North-Holland Publishing, 1983, pp. 109-120.
Brunnett et al., "Spline elements on Spheres" from Mathematical Methods for Curves and Surfaces, Editors: Lyche and Schumaker, copyright Vanderbilt University Press 1995, pp. 49-54, ISBN 8265-1268-2.
Buhmann et al., "Spectral Properties and Knot Removal for Interpolation by Pure Radial Sums," from Mathematical Methods for Curves and Surfaces, Editors: Lyche and Schumaker, copyright Vanderbilt University Press 1995, pp. 55-62, ISBN 8265-1268-2.
Cavaretta et al., "The Design of Curves and Surfaces by Subdivision Algorithms," Mathematical Methods in Computer Aided Geometric Design, Editors: Lynch and Schumaker, 1989, pp. 115153.
Celniker et al., "Deformable Curve and Surface Finite-Elements for Free-Form Shape Design," Computer Graphics, vol. 25, No. 4, 1991, pp. 257-266.
Chang et al., "Rendering Cubic Curves and Surfaces with Integer Adaptive Forward Differencing," Computer Graphics, vol. 23, No. 3, 1989, pp. 157-166.
Change et al., "A Generalized de Casteljau Approach to 3D Freeform Deformation," Computer Graphics Proceedings, (SIGGRAPH 94), 1994, pp. 257-260.
Christensen, "Product Data Representation and Exchange: Parametriuzation and Constraints for Explicit Geometric Product Models, " NIST, Jun. 1, 1998, 29 pgs.
Clarke, "Polished Surfaces," C3mag.com, 2001, 5 pgs.
Coutts et al., "Rendering with Streamlines," 1997, (Annote).
Crocker et al., "Boundary Evaluation of Non-Convex Primitives to Produce parametric Trimmed Surfaces," Computer Graphics, vol. 21, No. 4, 1987, pp. 129-136.
Dahmen et al., "Multivariate Splines-A New Constrictive Approach," Surfaces in Computer Aided Geometric Design, NorthHolland Publishing, 1983, pp. 191-215.
Dahmen, Wolfgang, "Smooth Piecewise quadric Surfaces," Mathematical Methods in Computer Aided Geometric Design, Editors: Lynch and Schumaker, 1989, pp. 181-193.
De Boor, Carl, "B-Form Basics," Geometric Modeling: Algorithms and New Trends, Editor: Farin, pp. 131-148, 1987.
Deboor et al., "B-Splines Without Divided Differences," Geometric Modeling: Algorithms and New Trends, Editor: Farin, pp. 21-27, 1987.
Decarlo et al., "Blended Deformable Models," IEEE Trans .: Pattern Analysis and Machine Intelligence, Apr. 1996, 18(4), pp. 1-15.
Degen, W.L.F., "High Accuracy Approximation of Parametric Curves," from Mathematical Methods for Curves and Surfaces ( eds., Lyche and Schumaker), Vanderbilt University Press, 1995, ISBN 8265-1268-2, pp. 83-98.
Derose, T.D., "Applications of Multiresolution Surfaces," The Mathematics of Surfaces VII ( eds., Goodman and Martin), Information Geometers, 1997, pp. 1-15.
Desbrun et al., "Animating Soft Substances with Implicit Surfaces," Computer Graphics Proceedings, (SIGGRAPH '95), 1995, pp. 287-290.
Driskill, "Towards the Design, Analysis, and Illustration of Assemblies," University of Utah, Dept. of Science, 1996, (Abstract).
Dyn et al., "Piecewise Uniform Subdivision Schemes," from Mathematical Methods for Curves and Surfaces, Editors: Lyche and Schumaker, copyright Vanderbilt University Press 1995, p. 111119, ISBN 8265-1268-2.
Ellens et al., "An Approach to C(1) and C(O) Feature Lines," from Mathematical Methods for Curves and Surfaces, Editors: Lyche and Schumaker, copyright Vanderbilt University Press 1995, pp. 121-132, ISBN 8265-1268-2.
Farin et al., "Discrete Coons Patches," Computer Aided Geometric Design 16, Nov. 1999, pp. 691-700.
Farin, G., "Rational Curves and Surfaces," Mathematical Methods in Computer Aided Geometric Design, Editors: Lynch and Schumaker, 1989, pp. 215-238.
Farin, G., "The Geometry of Cl Projective curves and Surfaces," from Mathematical Methods for Curves and Surfaces, Editors: Lyche and Schumaker, copyright Vanderbilt University Press 1995, pp. 133-139, ISBN 8265-1268-2.
Farin, Gerald, "Smooth Interpolation to Scattered 3 D Data," Surfaces in Computer Aided Geometric Design, North-Holland Publishing, 1983, pp. 43-62.
Farouki, Rida T., "Direct Surface Section Evaluation," Geometric Modeling: Algorithms and New Trends, Editor: Farin, pp. 319-334, 1987.
Ferguson et al., "Topological Design of Sculptured Surfaces," Computer Graphics, vol. 26, No. 2, 1992, pp. 149-156.
Field, David A., "Mathematical Problems in Solid Modeling: A brief Survey," Geometric Modeling: Algorithms and New Trends, Editor: Farin, pp. 91-107, 1987.
Filip, Daniel J., "Blending Parametric Surfaces," ACM Transactions on Graphics, Jul. 1989, vol. 8(3), XP-002346192, pp. 164-173.
Finkelstein et al., "Multiresolution Curves," Computer Graphics Proceedings, SIGGRAPH '94), 1994, pp. 261-268.
Firebaugh, "Chapter 5: Two-Dimensional Graphics-Representation," Wm. C. Brown Communications, Inc., publication date believed to be 1993, 39 pages.
Floater, M.S., "Rational Cubic Implicitization," from Mathematical Methods for Curves and Surfaces, Editors: Lyche and Schumaker, copyright Vanderbilt University Press 1995, pp. 151-159, ISBN 8265-1268-2.

(56) References Cited

OTHER PUBLICATIONS

Forsey et al., "Hierarchical B-Spline Refinement," Computer Graphics, (SIGGRAPH '88), vol. 22, No. 4, 1988, pp. 205-212.
Franke, Richard, "Thin plate splines with tension," Computer Aided Geometric Design 2, Elsevier Science Publishers B.V. (North-Holland), 1985, pp. 87-95.
Froumentin et al., "Quadric surfaces: a survey with new results," The Mathematics of Surfaces VII, Editors: Goodman and Martin, Information Geometers, 1997, pp. 363-381.
Fuller, "Using AutoCAD," Release 10 with 3-D, third edition, 1989, 193 pages.
Glossary, Alias/Wavefront, a Silocon Graphics Company, 1997, 22 pgs.
Goldman, Ronald N., "The Role of Surfaces in Solid Modeling," Geometric Modeling: Algorithms and New Trends, Editor: Farin, pp. 69-90, 1987.
Goshtasby, A., "Fitting Parametric Curves to Engineering Data," Wright State University, 1998, pp. 1-13.
Gregory, John A., Cl Rectangular and Non-Rectangular Surface Patches, Surfaces in Computer Aided Geometric Design, NorthHolland Publishing, 1983, pp. 25-33.
Grimm et al., "Modeling Surfaces of Arbitrary Topology using Manifolds," Computer Graphics Proceedings, (SIGGRAPH '95), 1995, pp. 359-368.
Hadenfeld, Jan, "Local Energy Fairing of B-Spline Surfaces," from Mathematical Methods for Curves and Surfaces, Editors: Lyche and Schumaker, copyright Vanderbilt University Press 1995, pp. 203-212, ISBN 8265-1268-2.
Hagen, Hans, "Geometric spline curves," Computer Aided Geometric Design 2, 1985, pp. 223-227.
Hall et al., "Shape modification of Gregory patches," The Mathematics of Surfaces VII, Editors: Goodman and Martin, Information Geometers, 1997, pp. 393-408.
Halstead et al., "Efficient, Fair Interpolation using Catmull-Clark Surfaces," Computer Graphics Proceedings, Annual Conference Series, 1993, pp. 35-44.
Hermann et al., "Techniques for Variable Radius Rolling Ball Blends," from Mathematical Methods for Curves and Surfaces, Editors: Lyche and Schumaker, copyright Vanderbilt University Press 1995, pp. 225-236, ISBN 8265-1268-2.
Hollig, Klaus, "Box-Spline Surfaces," Mathematical Methods in Computer Aided Geometric Design, Editors: Lynch and Schumaker, 1989, pp. 385-402.
Hoppe et al., "Piecewise Smooth Surface Reconstruction," Computer Graphics Proceedings, (SIGGRAPH '94), 1994, pp. 295-302.
Hoppe et al., "Surface Reconstruction from Unorganized Points," Computer Graphics, vol. 26, No. 2, 1992, pp. 71-78.
Hoschek et al., "Interpolation and Approximation with Developable B-Spline Surfaces," from Mathematical Methods for Curves and Surfaces, Editors: Lyche and Schumaker, copyright Vanderbilt University Press 1995, pp. 255-264, ISBN 8265-1268-2.
Hoschek, Josef, "Dual Bezier Curves and Surfaces," Surfaces in Computer Aided Geometric Design, North-Holland Publishing, 1983, pp. 147-156.
Hoschek, Josef, "Smoothing of curves and surfaces," Computer Aided Geometric Design 2, Elsevier Science Publishers B.V. (North-Holland), 1985, pp. 97-105.
Houghton et al., "Implementation of a divide-and-conquer method for intersection of parametric surfaces," Computer Aided Geometric Design 2, Elsevier Science Publishers B. V. (North-Holland), 1985, pp. 173-183.
Hsu et al., "Direct Manipulation of Free-Form Deformations," Computer Graphics, vol. 26, No. 2, 1992, pp. 177-184.
Hwang et al., "N-Sided Hold Filling and Vertex Blending Using Subdivision Surfaces," Journal ofInformation Science and Engineering, 2003, vol. 19, pp. 857-879.
Igarashi et al., "Teddy: A Sketching Interface for 3D Freeform Design," SIGGRAPH 99, Los Angeles, California, Aug. 8-13, 1999, pp. 409-416.

Ives-Smith et al., "Methods of surface airing of spline surfaces within shipbuilding," The Mathematics of Surfaces VII, Editors: Goodman and Martin, Information Geometers, 1997, pp. 209-221.
James eta !. , "Accurate Real Time Deformable Objects," SIGGRAPH 99, Los Angeles, California, Aug. 8-13, 1999, pp. 65-72.
Jefferis et al., "AutoCAD for Architecture R13," Autodesk Press, (Jun. 1997), pp. 242-274.
Joe, Barry, "Discrete Beta-Aplines," Computer Graphics, vol. 21, No. 4, 1987, pp. 137-144.
Jones, Alan K., "Shape Control of Curves and Surfaces through Constrained Optimization," Geometric Modeling: Algorithms and New Trends, Editor: Farin, 1987, pp. 265-279.
Kadi et al., "Conformal maps defined about polynomial curves," Computer Aided Geometric Design, Publisher: Elsevier Science B.V., 1998, pp. 323-337.
Kahnmann, Juergen, "Continuity of Curvature Between Adjacent Bezier Patches," Surfaces in Computer Aided Geometric Design, North-Holland Publishing, 1983, pp. 65-75.
Kato, K., "Generation ofn-sided surface patches with holes," Computer- Aided Design, 1991, vol. 23(10), pp. 676-683.
Kato, K., "N-sided Surface Generation from Arbitrary Boundary Edges, " Curve and Surface Design: Saint-Malo, 1999 (Laurent, p. J., et al., eds.) pp. 173-182.
Kim et al., "A General Construction Scheme of Unit Quaternion curves with Simple High Order Derivatives," Computer Graphics Proceedings, (SIGGRAPH '95), 1995, pp. 369-376.
Kimura, Fumihiko, "Design Methods of Free-Form Surfaces and Their Integration into the Solid Modeling Package Geomap-III," Solid Modeling by Computers, Symposium sponsored by the General Motors Research Laboratories, pp. 211-236, 1984.
Kobbelt, Leif, "Interpolatory Refinement as a Low Pass Filter," from Mathematical Methods for Curves and Surfaces, Editors: Lyche and Schumaker, copyright Vanderbilt University Press 1995, pp. 281-290, ISBN 8265-1268-2.
Kolb et al., "Surface Reconstruction Based Upon Minimum Norm Networks," from Mathematical Methods for Curves and Surfaces, Editors: Lyche and Schumaker, copyright Vanderbilt University Press 1995, pp. 293-304, ISBN 8265-1268-2.
Letcher et al., NURBS Considered Harmful for Gridding (Alternative Offered), AeroHydro, Inc., Jan. 1996, pp. 1-9.
Letcher et al., "Parametric Design and Gridding Through Relational Geometry," AeroHydro, Inc., 15 pgs. (Prior to Nov. 1995).
Levin, Adi, "Filling an N-sided hole using combined subdivision schemes," Tel Aviv University, 1999, pp. 1-8.
Levin, Adi, "Interpolating Nets of Curves by Smooth Subdivision Surfaces," SIGGRAPH 99, Los Angeles, California, Aug. 8-13, 1999, pp. 57-64.
Lighten et al., "Integrating Sculptured Surfaces into a Polyhedral Solid Modeling System," Geometric Modeling: Algorithms and New Trends, Editor: Farin, pp. 109-122, 1987.
Little, Frank F., "Convex Combination Surfaces," Surfaces in Computer Aided Geometric Design, North-Holland Publishing, pp. 99-107 (1983).
Liu et al., "Shape control and modification ofrational cubic B-spline curves," The Mathematics of Surfaces VII, Editors: Goodman and Martin, Information Geometers, 1997, pp. 383-391.
Lodha et al., "Duality between Degree Elevation and Differentiation ofB-bases and L-bases," from Mathematical Methods for Curves and Surfaces, Editors: Lyche and Schumaker, copyright Vanderbilt University Press 1995, pp. 305-314, ISBN 8265-1268-2.
Loop et al., "Generalized B-spline Surfaces of Arbitrary Topology," Computer Graphics, vol. 24, No. 4, 1990, pp. 347-356.
Loop, Charles, Smooth Spline Surfaces over Irregular Meshes, Computer Graphics Proceedings, (SIGGRAPH '94), 1994, pp. 303-310.
Lorensen et al., "Marching Cubes: A High Resolution 3D Surface Construction Algorithm," Computer Graphics, vol. 21, No. 4, 1987, pp. 163-169.
Lorentz, R.A., "Uniform bivariate Hermite Interpolation," Mathematical Methods in Computer Aided Geometric Design, Editors: Lynch and Schumaker, 1989, pp. 435-444.

(56) References Cited

OTHER PUBLICATIONS

Lyche et al., "Knot line refinement algorithms for tensor product B-spine surfaces," Computer Aided Geometric Design 2, 1985, Elsevier Science Publishers B. V. (North-Holland), pp. 133-139.

Ma et al., "NURBS Curve and Surface Fitting and Interpolation," from Mathematical Methods for Curves and Surfaces, Editors: Lyche and Schumaker, copyright Vanderbilt University Press 1995, pp. 315-322, ISBN 8265-1268-2.

MacCracken et al., "Free-Form Deformations with Lattices of Arbitrary Topology," Computer Graphics Proceedings, Annual Conference Series 1996, 1996, pp. 181-188.

Mann, Stephen, "Using Local Optimization in Surface Fitting," from Mathematical Methods for Curves and Surfaces (eds., Lyche and Schumaker), Vanderbilt University Press, 1995, ISBN 8265-1268-2, pp. 323-332.

Manni et al., "Cl Comonotone Hermite Interpolation via Parametric Surfaces," from Mathematical Methods for Curves and Surfaces, Editors: Lyche and Schumaker, copyright Vanderbilt University Press 1995, pp. 333-342, ISBN 8265-1268-2.

Markosian et al., "Skin: A Constructive Approach to Modeling Freeform Shapes," SIGGRAPH 99, Los Angeles, California, Aug. 8-13, 1999, pp. 393-400.

Markus et al., "Genetic Algorithms in Free Form Curve Design," from Mathematical Methods for Curves and Surfaces (eds., Lyche and Schumaker), Vanderbilt University Press, 1995, ISBN 8265-1268-2, pp. 43-354.

Mehl um, Even, "Appeal and the Apple (Nonlinear Splines in Space)," from Mathematical Methods for Curves and Surfaces, Editors: Lyche and Schumaker, copyright Vanderbilt University Press 1995, pp. 365-384, ISBN 8265-1268-2.

Middleditch et al., "Blend Surfaces for set Theoretic vol. Modeling Systems," SIGGRAPH '85, vol. 19, No. 3, pp. 161-170 (1985).

Moreton et al., "Functional Optimization for Fair Surface Design," Computer Graphics, vol. 26, No. 2, 1992, pp. 167-176.

Nasri, A., "Curve interpolation in recursively generated B-spline surfaces over arbitrary topology," Computer Aided Geometric Design, Publisher: Elsevier Science B.V., 1997, pp. 15-30.

Nasri, A., "Interpolation of open B-spline curves by recursive subdivision surfaces," The Mathematics of Surfaces VII (eds., Goodman and Martin), Information Geometers, 1997, pp. 173-188.

Ocken et al., "Precise Implementation of Cad Primitives Using Rational parameterizations of Standard Surfaces," Solid Modeling by Computers, Symposium sponsored by the General Motors Research Laboratories, pp. 259-273, 1984.

Owen et al., "Intersection of General Implicit Surfaces," Geometric Modeling: Algorithms and New Trends, Editor: Farin, pp. 335-345, 1987.

Pedersen et al., "Displacement Mapping Using Flow Fields," Computer Graphics Proceedings, (SIGGRAPH '94), 1994, pp. 279-286.

Peters et al., "Smooth blending of basic surfaces using trivariate box splines, " The Mathematics of Surfaces VII, Editors: Goodman and Martin, Information Geometers, 1997, pp. 409-426.

Peterson, "Twists through Space," Science News, Aug. 29, 1998, vol. 154, p. 143.

Piegl et al., "Filling n-sided regions with NURBS patches," The Visual Computer Journal, Apr. 8, 1999, pp. 77-89.

Piegl, Laszlo, "Representation of quadric primitives by rational polynomials," Computer Aided Geometric Design 2, Elsevier Science Publishers B.V. (North-Holland), 1985, pp. 151-155.

Pottmann et al., "Principal surfaces," The Mathematics of Surfaces VII, Editors: Goodman and Martin, Information Geometers, 1997, pp. 337-362.

Pottmann, Helmut, "Studying NURBS curves and Surfaces with Classical Geometry," from Mathematical Methods for Curves and Surfaces, Editors: Lyche and Schumaker, copyright Vanderbilt University Press 1995, pp. 413-438, ISBN 8265-1268-2.

Pratt, M.J., "Classification and characterization of supercyclides," The Mathematics of Surfaces VII, Editors: Goodman and Martin, Information Geometers, 1997, pp. 25-41.

Pratt, M.J., "Smooth parametric surface approximations to discrete data," Computer Aided Geometric Design 2, Elsevier Science Publishers B.V. (North-Holland), 1985, pp. 165-171.

Pratt, Vaughan, "Direct Least-Squares Fitting of Algebraic Surfaces," Computer Graphics, 1987, vol. 21(4), pp. 145-152.

Pratt, Vaughan, "Techniques for conic Splines," SIGGRAPH, 1985, vol. 19(3), pp. 151-159.

Prautzsch, Hartmut, "Generalized subdivision and convergence," Computer Aided Geometric Design 2, Elsevier Science Publishers B.V. (North-Holland), 1985, pp. 69-75.

Rausch et al., "Computation of medial curves on surfaces," The Mathematics of Surfaces VII, Editors: Goodman and Martin, Information Geometers, 1997, pp. 43-68.

Reiss et al., "Line-Art Rendering of 3D-Models, " Max-PlanckInstitute for Computer Sciences, (2000), 10 pgs.

Rockwood et al., "Real-Time Rendering ofTrimmed surfaces," Computer Graphics, (SIGGRAPH '89), vol. 23, No. 3, 1989, pp. 107-116.

Rockwood, Alyn P., "Introduction Sculptured Surfaces into a Geometric Modeler," Solid Modeling by Computers, Symposium sponsored by the General Motors Research Laboratories, 1984, pp. 237258.

Sabin, Malcolm, "Open Questions in the Application of Multivariate B-splines," Mathematical Methods in Computer Aided Geometric Design, Editors: Lynch and Schumaker, 1989, pp. 529-537.

Sanglikar et al., "Parametric Blends for Shape Modelling," Fourth IEEE Region 10 Int. Conference, Nov. 22, 1989, XP-10087959, pp. 377-381.

Sarraga et al., "Free-Form Surfaces in GMSOLID: Goals and Issues," Solid Modeling by Computers, Synposium Sponsored by the General Motors Research Laboratories, pp. 187-209, 1984.

Sarraga, Ramon F., "A Variation Method for Fitting a Cl Surface to Scattered Data Triangulated in R3 With Arbitrary Topology," General Motors Corporation Research and Development Center, 1998, pp. 1-36.

Schaback, R., "Creating Surfaces from Scattered Data Using Radial Basis Functions," from Mathematical Methods for Curves and Surfaces, Editors: Lyche and Schumaker, copyright Vanderbilt University Press 1995, pp. 477-496, ISBN 8265-1268-2.

Schichtel, Markus, "G2 Blend Surfaces and Filling of N-Sided Holes," IEEE Computer Graphics and Applications, Sep. 1, 1993, vol. 13(5), XP-000511131, pp. 68-73.

Schmitt et al., An adaptive subdivision method for surface-fitting from sampled data, SIGGRAPH Comput. Graph., Aug. 1986, vol. 20(4), pp. 179-188.

Sclaroff et al., "Generalized Implicit Functions for Computer Graphics," Computer Graphics, vol. 25, No. 4, 1991, pp. 247-250.

Sederberg et al. "Scan Line Display of Algebraic Surfaces," Computer Graphics, (SIGGRAPH '89), vol. 23, No. 3, 1989, pp. 147-156.

Sederberg et al., "2-D Shape Blending: An Intrinsic Solution to the Vertex Path Problem," Computer Graphics Proceedings, Annual Conference Series, 1993, pp. 15-18.

Sederberg et al., "Implicitization using Moving Curves and Surfaces," Computer Graphics Proceedings, (SIGGRAPH '95), 1995, pp. 301-308.

Sederberg et al., "Non-Uniform Recursive Subdivision Surfaces," SIGGRAPH 98, Orlando, Florida, Jul. 19-24, 1998, pp. 387-394.

Sederberg, "Shape Blending of 2-D Piecewise Curves," from Mathematical Methods for Curves and Surfaces, Editors: Lyche and Schumaker, copyright Vanderbilt University Press 1995, pp. 497-506, ISBN 8265-1268-2.

Sederberg, Thomas W., "Algebraic Geometry for Surface and Solid Modeling," Geometric Modeling: Algorithms and New Trends, ( eds. Farin), 1987, pp. 29-42.

Sederberg, Thomas W., "Surface Patches," Computer Aided Geometric Design 2, Elsevier Science Publishers B.V. (North-Holland), 1985, pp. 53-59.

Seidel, H-P, "A General Subdivision Theorem for Bezier Triangles," Mathematical Methods in Computer Aided Geometric Design, Editors: Lynch and Schumaker, 1989, pp. 573-581.

(56) References Cited

OTHER PUBLICATIONS

Shantz et al., "Rendering Trimmed NURBS with Adaptive Forward Differencing," Computer Graphics Proceedings, (SIGGRAPH '88), 1988, pp. 189-198.
Shook et al., "Relational Geometry and Solids," AeroHydro, Inc., Nov. 1994, pp. 1-14.
Singh et al., "Wires: A Geometric Deformation Technique," SIGGRAPH 98, Orlando, Florida, Jul. 19-24, 1998, pp. 405-414.
Stam, "Exact Evaluation of Catmull-Clark Subdivision Surfaces at Arbitrary Parameter Values," SIGGRAPH 98, Orlando, Florida, Jul. 19-24, 1998, pp. 395-404.
Svenneby et al., "Surface Works and the Shape Feature," Aero Hydro, Inc., believed to be 1998, 2 pgs.
Szeliski et al., "Surface Modeling with Oriented Particle Systems," Computer Graphics, vol. 26(2), 1992, pp. 185-194.
Taubin, Gabriel, "A Signal Processing Approach to Fair Surface Design," Computer Graphics Proceedings, (SIGGRAPH '95), 1995, pp. 351-358.
Toth, Daniel L., "On Ray tracing Parametric Surfaces," SIGGRAPH '85, 1985, vol. 3(19), p. 171179.
Tumblin et al., "Lcis: A Boundary Hierarchy for Detail-Preserving Contrast Reduction," Proceedings of SIGGRAPH, Aug. 1999, (Annote).
Ueda, Kenji, "Normalized Cyclide Bezier Patches," from Mathematical Methods for Curves and Surfaces, Editors: Lyche and Schumaker, copyright Vanderbilt University Press 1995, pp. 507-516, ISBN 8265-1268-2.
Varady et al., "Vertex Blending Based on the Setback Split," from Mathematical Methods for Curves and Surfaces (eds., Lyche and Schumaker), Vanderbilt University Press, 1995, ISBN 8265-1268-2, pp. 527-542.
Vida et al., "A Survey of Blending Methods That Use Parametric Surfaces, " Barking, GB, May 1, 1994, vol. 26(5), XP-000442375, pp. 341-365.
Wallner et al., "Spline Orbifolds," Proceedings of Chamenix, Vanderbilt University Press, 1996, pp. 1-20.
Warren, J., "Binary Subdivision Schemes for Functions over Irregular Know Sequences," from Mathematical Methods for Curves and Surfaces, Editors: Lyche and Schumaker, copyright Vanderbilt University Press 1995, pp. 543-562, ISBN 8265-1268-2.
Weiss, "Be Vision, A Package of IBM 7090 FORTRAN Programs to Draw Orthographic Views of Combinations of Plane and Quadric Surfaces," Bell Telephone Laboratories, Inc., Murray Hill, New Jersey, Apr. 1996, pp. 194-204.
Welch et al., "Free-Form Shape Design Using Triangulated Surfaces," Computer Graphics Proceedings, (SIGGRAPH '94), 1994, pp. 247-256.
Welch et al., "Variational Surface Modeling," Computer Graphics, 1992, vol. 26(2), 1992, p. 157166.
Weller et al., "Tensor-Product Spline Spaces with Knot Segments," from Mathematical Methods for Curves and Surfaces (eds., Lyche and Schumaker), Vanderbilt University Press, 1995, ISBN 8265-1268-2, pp. 563-572.
Witkin et al., "Using Particles to Sample and Control Implicit Surfaces," Computer Graphics Proceedings, (SIGGRAPH '94), 1994, pp. 269-277.
Zorn et al., "Interpolating Subdivision for Meshes with Arbitrary Topology," Computer Graphics Proceedings, Annual Conference Series 1996, 1996, pp. 189-192.
International Search Report for International (PCT) Patent Application No. PCT/US99/16844, dated Oct. 25, 1999.
International Preliminary Examination Report for International (PCT) Patent Application No. PCT/US99/16844, dated Dec. 14, 2001.
Examiner's Report for Canadian Patent Application No. 2,379,459, dated Nov. 8, 2006.
European Intellectual Property Office Examiner's Communication for European Patent Application No. 99939655.9 dated Oct. 10, 2005, 4 pages.
Search Report for European Patent Application No. 99939655, dated Dec. 27, 2005.
Examination Report for European Patent Application No. 99939655, dated Nov. 20, 2007.
Search Report for Hungarian Patent Application No. P0700118, dated Apr. 19, 2007.
Preliminary Notice of Rejection for Japanese Patent Application No. 2001-513115, dated Jun. 23, 2009.
Official Action for U.S. Appl. No. 09/360,029, dated Dec. 19, 2001.
Official Action for U.S. Appl. No. 09/360,029, dated Oct. 24, 2002.
Notice of Allowance for U.S. Appl. No. 09/360,029, dated May 19, 2003.
Notice of Allowance for U.S. Appl. No. 09/360,029 , dated Jun. 2, 2004.
Notice of Allowance for U.S. Appl. No. 09/360,029, dated Oct. 24, 2005.
Notice of Allowance for U.S. Appl. No. 09/360,029 , dated Sep. 6, 2006.
Official Action for U.S. Appl. No. 10/689,693, dated Feb. 25, 2005.
Notice of Allowance for U.S. Appl. No. 10/689,693, dated Oct. 7, 2005.
Notice of Allowance for U.S. Appl. No. 10/689,693 , dated Aug. 7, 2006.
Official Action for U.S. Appl. No. 11/681,077, dated Sep. 21, 2007.
Notice of Allowance for U.S. Appl. No. 11/681,077, dated Mar. 24, 2008.
Supplemental Notice of Allowability for U.S. Appl. No. 11/681,077, dated May 21, 2008.
Supplemental Notice of Allowability for U.S. Appl. No. 11/681,077, dated Jun. 2, 2008.
Official Action for U.S. Appl. No. 11/733,122, dated May 7, 2009.
Official Action for U.S. Appl. No. 11/733,122, dated Oct. 15, 2008.
Notice of Allowance for U.S. Appl. No. 11/733,122, dated Aug. 7, 2009.
Supplemental Notice of Allowability for U.S. Appl. No. 11/733,122, dated Oct. 6, 2009.
Official Action for U.S. Appl. No. 12/253,165, dated May 28, 2009.
Notice of Allowance for U.S. Appl. No. 12/253,165, dated Dec. 29, 2009.
Supplemental Notice of Allowability for U.S. Appl. No. 12/253,165, dated Mar. 29, 2010.
Supplemental Notice of Allowability for U.S. Appl. No. 12/253,165, dated Apr. 15, 2010.
Official Action for U.S. Appl. No. 12/460,587, dated Mar. 7, 2012.
Official Action for U.S. Appl. No. 13/607,590, dated Oct. 25, 2012.
Official Action for U.S. Appl. No. 13/607,590, dated May 14, 2013.
Notice of Allowance for U.S. Appl. No. 13/607,590, dated Jan. 7, 2014.
Notice of Allowance for U.S. Appl. No. 13/607,590, dated Apr. 29, 2014.

\* cited by examiner

CURVE INTERPOLATION (PT1, PT2, TAN1, TAN2)

START

1004

FOR ANY OF THE PARAMETERS PT1, PT2, TAN1, TAN2 NOT DEFINED, PROVIDE VALUES FOR THEM AS FOLLOWS:

PT1 ← GET A FIRST POINT TO BE ON THE INTERPOLATED CURVE.
PT2 ← DETERMINE A SECOND POINT TO BE ON THE INTERPOLATING CURVE
TAN1 ← DETERMINE A VECTOR THAT IS TO BE THE TANGENT VECTOR AT PT1 TO THE INTERPOLATING CURVE.
TAN2 ← DETERMINE A VECTOR THAT IS TO BE THE TANGENT VECTOR AT PT2 TO THE INTERPOLATING CURVE.

1008

$B_1$ ← DETERMINE A FIRST BLENDING FUNCTION FOR BLENDING TAN1 INTO THE INTERPOLATING CURVE SO THAT THE INTERPOLATING CURVE HAS TAN1 AS ITS DERIVATIVE VECTOR AT PT1.

1012

$B_2$ ← DETERMINE A SECOND BLENDING FUNCTION FOR BLENDING TAN2 INTO THE INTERPOLATING CURVE SO THAT THE INTERPOLATING CURVE HAS TAN2 AS ITS DERIVATIVE VECTOR AT PT2.

GENERATE THE DESIRED INTERPOLATING CURVE, C, BY EXECUTING THE FOLLOWING STATEMENT FOR VALUES OF u, $0 \leq u \leq 1$.

$$C(u) \leftarrow B_1(D_1(u)) * \left[ PT1 + (1-u) * TAN1 \right]$$
$$+ B_2(D_2(u)) * \left[ PT2 + (u-1) * TAN2 \right]$$

WHERE $D_1(u) = u$ AND $D_2(u) = u$.

1016

RETURN C(u)

FIG. 26

SURFACE PATCH TECHNIQUES FOR COMPUTATIONAL GEOMETRY

CROSS REFERENCE TO RELATED APPLICATIONS

The present application is a continuation of U.S. patent application Ser. No. 16/582,883 filed Sep. 25, 2019 (now U.S. Pat. No. 11,403,434), which is a continuation of U.S. patent application Ser. No. 15/043,880 filed Feb. 15, 2016, which is a continuation of U.S. patent application Ser. No. 14/461,439 filed Aug. 17, 2014 (now U.S. Pat. No. 9,262,859), which is a continuation of U.S. patent application Ser. No. 13/607,590 filed Sep. 7, 2012 (now U.S. Pat. No. 8,836,701), which is a continuation of U.S. patent application Ser. No. 12/460,587 filed Jul. 20, 2009, which claims the benefit of U.S. Provisional Patent Application Ser. No. 61/135,341 filed Jul. 18, 2008, and claims the benefit of U.S. Provisional Patent Application Ser. No. 61/211,714 filed Apr. 1, 2009; all of the above-referenced applications are incorporated herein by reference in their entirety.

FIELD OF THE INVENTION

The present invention relates to a system and method for performing computer aided design, and, in particular, to efficient computational techniques for blending between representations of geometric objects, and more particularly to computer implemented methods for designing shapes.

BACKGROUND

A designer using a computer aided design (CAD) computational system will typically approach the design of a free form geometric object (such as a surface) by first specifying prominent and/or necessary subportions of the geometric object through which the object is constrained to pass. Subsequently, a process is activated for generating the geometric object that conforms to the constraining subportions provided. In particular, such subportions may be points, curves, surfaces and/or higher dimensional geometric objects. For example, a designer that designs a surface may construct and position a plurality of curves through which the intended surface must pass (each such curve also being denoted herein as a "feature line" or "feature curve"). Thus, the intended surface is, in general, expected to have geometric characteristics (such as differentiability and curvature) that, substantially, only change to the extent necessary in order to satisfy the constraints placed upon the surface by the plurality of curves. That is, the designer expects the generated surface to be what is typically referred to as "fair" by those skilled in the art. Thus, the designer typically constructs such feature curves and positions them where the intended surface is likely to change its geometric shape in a way that cannot be easily interpolated from other subportions of the surface already designed.

As a more specific example, when designing containers such as bottles, an intended exterior surface of a bottle may be initially specified by subportions such as: (a) feature curves positioned in high curvature portions of the bottle surface, and (b) surface subareas having particular geometric characteristics such as having a shape or contour upon which a bottle label can be smoothly applied. Thus, the intention of a bottle surface designer is to construct a bottle design that satisfies his/her input constraints and that is also fair. Moreover, the designer may desire to generate holes for handles, as well as, e.g., ergonomic bottle grips by deforming various portions of the bottle surface and still have the bottle surface fair.

There has heretofore, however, been no CAD system wherein a designer (or more generally, user) of geometric objects can easily and efficiently express his/her design intent by inputting constraints and having the resulting geometric object be fair. That is, the designer/user may encounter lengthy delays due to substantial computational overhead and/or the designer/user may be confronted with non-intuitive geometric object definition and deformation techniques that require substantial experience to effectively use. For example, many prior art CAD systems provide techniques for allowing surfaces to be designed and/or deformed by defining and/or manipulating designated points denoted as "control points." However, such techniques can be computationally expensive, non-intuitive, and incapable of easily deforming more than a local area of the surface associated with such a control point. Additionally, some prior art CAD systems provide techniques for defining and/or deforming surfaces via certain individually designated control vectors. That is, the direction of these vectors may be used to define the shape or contour of an associated surface. However, a designer's intent may not easily correspond to a surface design technique using such control vectors since each of the control vectors typically corresponds to only a single point of the surface isolated from other surface points having corresponding control vectors. Thus, such techniques are, at most, only able to deform an area of the surface local to such points having corresponding control vectors.

Additionally, such prior art CAD systems may also have difficulties in precisely performing blending and trimming operations. For example, two geometric objects intended to abut one another along a common boundary may not be within a insufficient tolerance to one another at the boundary. That is, there may be sufficiently large gaps between the geometric objects that the boundary may not be considered "water tight," which may be problematic in certain machining operations and other operations like Boolean operations on solids.

Prior art discloses techniques for generating multisided surface patches for geometric modeling. Such techniques are disclosed in U.S. Pat. No. 7,236,167 filed Oct. 20, 2003 by Lee et. al. which is fully incorporated herein by reference. Surfaces resulting from such techniques are able to represent N-sided object space surfaces (also referred to as NSS herein) for substantially all reasonable values for the number N (e.g., N≤20), wherein N is the number of boundary curves of the resulting surface (which is sometimes referred to as a "patch"). As an illustrative example, FIG. 45 shows a pentagon 3009 in parametric space, wherein each of its five sides is mapped into a corresponding portion of the boundary of the surface 3011 in object space, and the interior of the pentagon 3009 maps into the interior of the surface 3011 so that this interior smoothly meets this boundary. Moreover, various continuity constraints and/or smooth transitions across the boundaries between two or more such object space patches 3011 may be imposed as' one skilled in the art will understand. Furthermore, there are various computational methods for expressing NSS.

Assuming an NSS surface is represented by a polynomial (and accordingly, its boundary curves are also representable by polynomials), the polynomial degree of NSS is important in that the higher degree, the greater flexibility to generate, e.g., desired curves and/or contoured surfaces. However, such flexibility comes at a price; e.g., geometric objects generated from high degree polynomial mappings are computationally expensive to generate and manipulate. Additionally, such high degree polynomial mappings can also affect the precision of various computations, e.g., due to the accumulation of computational errors. Accordingly, many (if not most) commercially successful geometric modelers limit the polynomial degree of the curves, surfaces and/or solids that they generate and manipulate to be below a predetermined value. For example, the geometric modeler by ACIS™ uses polynomials having a maximum of degree 25, and the geometric modeler by Rhino™ uses polynomials having a maximum of degree 32. Accordingly, when a geometric object representation is desired to be imported into such a commercial geometric modeler, it is very desirable for the object representation to have as low a polynomial degree as possible, and certainly below the maximum polynomial degree for which the target geometric modeler has been tested for reliability and accuracy. In particular, if the polynomial degree of the geometric object is imported directly into such a modeler, and the object's degree is above such the maximum recommended degree for the modeler, unexpected results may occur, e.g., the modeler may crash, an unacceptable build up computational errors may occur, and/or very lengthy processing times may be experienced, or even worse, undetected errors/inaccuracies may be incorporated into a geometric model generated by the modeler. Alternatively, prior to be imported, a geometric object having a representation of a too high degree may be converted into, e.g., a plurality of lower degree objects that are acceptable to the target modeler such that when these lower degree objects are combined, they approximate the original high degree object. However, such a conversion presents its own set of difficulties. In particular, there may be both computational efficiency difficulties and possibly difficulties maintaining certain tolerances in the target modeler. Moreover, there is very likely to be inaccuracies in the conversion process. For instance, the speed of computation in downstream processes within such a target modeler after such a conversion of a geometric object may grow greater than linearly with the degree of the object representation being converted. For example, a geometric object having representation with degree 50 may, when converted to, e.g., a plurality of 25 degree approximations subsequently require, e.g., four to five times the computational time that a geometric object represented by a polynomial representation of 25 degrees.

Accordingly, it would be very desirable to have a CAD system that includes one or more geometric design techniques for allowing CAD designers/users to more easily, efficiently and precisely design geometric objects. Further, it would be desirable to have such a system and/or computational techniques for graphically displaying geometric objects, wherein there is greater user control over the defining and/or deforming of computational geometric objects, and in particular, more intuitive global control over the shape or contour of computationally designed geometric objects. Additionally, it would be desirable to provide surfaces that smoothly blend into one another, wherein the surface representations have a low polynomial degree.

Moreover, one important quality of a surface is its smoothness. However, it is nontrivial to quantitatively measure what is meant by "smoothness". For example, a know technique to measure the smoothness at a join of two surfaces is to use the continuity of the derivatives of the surface generating functions for those two surfaces. However, this measure of smoothness does not always work for parametric functions used in design. For instance, sometimes two functions can form a smooth curve or surface while their-derivatives do not agree at a joint between the curves or surfaces. On the other hand, there could be a sharp cusp even if the derivatives are the same. In order to describe "smoothness", certain terms are used in the art. In particular, various continuity criteria are used to describe smoothness. More precisely, let there be two parametric curves f(u) and g(v), where u and v are in the intervals [a,b] and [m,n], respectively. For describing the smoothness of a join of these curves, consider the "right-end" of curve f(u), i.e., f(b), and the "left-end" of curve g(v), i.e., g(m). If f(b)=g(m), we say curves f and g are $C^0$ continuous at f(b)=g(m). If for all i<=k, the $i^{th}$ derivatives at f(b) and g(m) are equal, we shall say that the curves are $C^k$ continuous at point f(b)=g(m).

Curvature is another measure that can be used to evaluate the smoothness between curves (and eventually surfaces). In particular, for a parametric function f the curvature is defined by $$k=|f'(t)\times f''(t)|/|f'(t)|^3 \qquad (1)$$

If the curvatures of curves at a join thereof are equal, we will say they are curvature continuous at the join. Intuitively, two curves are curvature continuous if the turning rate is the same at the join; however, the second derivatives of these curves may not be the same at the join. In other words, curvature continuity is not always $C^2$ continuity with parametric functions. For example, the following curve consists of two parabolic segments:

$$f(u)=(u,-u^2) \text{ and } g(v)=(v,v^2),$$

where the left curve f and the right curve g have domains [−1,0] and [0,1], respectively.

Consider the continuity of the two curves at the origin where they join, i.e., $$f'(u)=(1,-2u)$$

$$f''(u)=(0,-2)$$

$$g'(v)(1,2v)$$

$$g''(v)=(0,2)$$

Since f'(0)=g'(0)=(1, 0), these two curves are $C^1$ continuous at the origin. However, since f"(0)=(0, −2) is not equal to g"(0)=(0, 2), they are not $C^2$ continuous at the origin. In fact, f" (u) points to the south while g" (u) points to north, and both are constant. Therefore, when a moving point crosses the origin from one curve to the other, the second derivative changes its direction abruptly. However, the curvature of f(u) is $k_f=2/(1+4u^2)^{1.5}$ and the curvature of g(v) is $k_g=2/(1+4v^2)^{1.5}$. Accordingly, the two curve segments are curvature continuous at the join. Thus, we see that two curve segments may be $C^1$ and curvature continuous, but not $C^2$ continuous.

Consider yet another simple example. Let $$f(u)=A+u(B-A)$$

$$g(v)=B+v(C-B)$$

where A, B and C are three collinear points as shown in FIG. 1.

The functions f(u) and g(v) are obviously $C^0$ continuous at the join B. Is it $C^1$ continuous? We have:

$$f'(u)=B-A$$

$$g'(v)=C-B$$

Clearly, f'(u)=B−A is not equal to g'(v)=C−B, for most values of A, B, and C. Consequently such line segments are, in general, not $C^1$ continuous at B.

This poses a problem for parametric forms that is not seen in explicit forms where the derivative is a scalar—the slope. It is a result of the derivative being a vector with both magnitude and direction. If we replace the direction vectors B−A and C−B with unit-length vectors and change the domain of parameters u and v, this problem will disappear. That is, the above equations are re-parameterized to the following:

$$F(u)=A+u(B-A)/|B-A|$$

$$G(v)=B+v(C-B)/|C-B|$$

where u∈[0, |B−A|] and v∈[0, |C−B|]. Now, since we have F'(u)=G'(v) equal to the unit-length vector in the direction of A to C, the line segments are $C^1$ continuous. Thus, re-parameterizing the curve segments overcomes the problem.

Many $C^1$ continuous curves are curvature continuous, but they are not $C^2$ continuous at their join(s); some of them may not even be twice differentiable. However, these curves can appear smooth at the join(s), and having a smooth join is an important feature of computational design.

Therefore, we introduce the notion of Geometric Continuity defined in the following:

Two curve segments are said to be $G^k$, equivalently, $G^k$ geometric continuous, and $G^k$ continuous (and have $G^k$ Geometry Continuity) at their join if and only if there exist two parameterizations, one for each curve segment, such that all $i^{th}$ derivatives, i≤k, agree at the join. Reference: Hoschek and Lasser.

The idea of $G^n$ geometric continuity (n≥1) may be extended to surfaces as follows: two surfaces are $G^n$ geometric continuous at a join thereof if and only if for each point of the join of the two surfaces, each curve on the surfaces that crosses the join at the point is $G^n$ geometric continuous. Note that in the disclosure hereinbelow a surface (S) is described as being a $G^n$ surface or $G^n$ continuous when there is $G^n$ geometric continuity for each joined pair of surfaces in S. Moreover, when there is no ambiguity, the surface S may be simply referred to as a "$G^n$ surface".

$G^2$ geometric continuity is highly desirable for creating smoothness in design because it makes surfaces with smooth reflections and improves fluid flow among other advantages.

Therefore it would be desirable to have a computationally effective and efficient technique for describing "smoothness", and in particular, using such a technique for generating designs of objects whose composite surfaces are visually smoother than typically provided by the prior art.

Definitions

This section provides some of the fundamental definitions that are used in describing the computational features disclosed herein. These definitions are also illustrated in FIGS. 15 and 16.

A "parametric geometric object" S is a geometric object that is the image of a function f, wherein the domain of f is in a geometric space embedded within a coordinate system (denoted the "parameter space") and the range of f is in another geometric space (denoted the "object space"). Typically, the inverse or pre-image, $f^{-1}$, of a geometric object such as S will be a geometrically simpler object than its image in object space. For example, the pre-image of a curve 170 in object space may be a simple line segment 172, L, in parameter space. Thus if S denotes the curve in object space, then notationally f and S are sometimes identified such that for u∈L, a corresponding point in the curve S is denoted S(u). Similarly, the pre-image of an undulating surface 204 (FIG. 16) in object space may be a simple bounded plane 180 in parameter space. Thus, if S denotes the undulating surface 204, then for (u,v)∈$f^{-1}$(S), S(u,v) denotes a corresponding point on the undulating surface 204.

A "profile" 200 (FIG. 16) is a geometric object, such as a curve in object space, through which an associated object space geometrically modeled object (e.g. surface 204) must pass. That is, such profiles 200 are used to generate the geometrically modeled object. Thus, profiles provide a common and natural way for artists and designers to geometrically design objects, in that such a designer may think in terms of the feature or profile curves when defining the characteristic shape of a geometric object (surface) being designed. For example, profile curves on a surface may substantially define the geometry of a resulting derived geometric object; e.g., its continuity, curvature, shape, boundaries, kinks, etc. Note, that for many design applications, profiles are typically continuous and differentiable. However, such constraints are not necessary. For example, a profile may, in addition to supplying a general shape or trend of the geometric object passing therethrough, also provide a texture to the surface of the geometric object. Thus, if a profile is a fractal or fractal-like, the fractal contours may be in some measure imparted to the surface of the derived geometric object adjacent the profile. Further note that it is within the scope of the present disclosure to utilize profiles that are of higher dimension (≥2). Thus, a profile may also be a surface or a solid. Accordingly, if a profile is a surface, then a solid having locally (i.e., adjacent to the profile) at least some of the geometric characteristics of the profile may be derived.

Moreover, profiles (and/or segments thereof) may have various computational representations such as linear (e.g., hyperplanes), elliptic, NURBS, or Bezier. Note, however, that regardless of the computational representation, a method (such as interpolation) for deforming or reshaping each profile is preferable. More particularly, it may be preferable that such a method results in the profile satisfying certain geometric constraints such as passing through (or substantially so) one or more predetermined points, being continuous, being differentiable, having a minimal curvature, etc. Further, note that such a deformation method may also include the ability to decompose a profile into subprofiles, wherein the common boundary (e.g., a point) between the subprofiles may be "slidable" along the extent of the original profile.

A "marker" 208 (FIG. 16) is a point on a profile that can be moved to change the shape of the profile 200 in a region about the marker. A marker also designates a position on a profile where the shape of a geometric object having the profile thereon can be deformed.

A "profile handle" 212 (FIG. 16) is a geometric object tangent to the profile 200. Such a profile handle may control the shape of the profile locally by modifying the slope (derivative) of the profile at the marker 208. Alternatively, for non-differentiable profiles, a profile handle may be used to control the general shape of the profile by indicating a trend direction and magnitude of the corresponding profile. For example, if the profile is a fractal or other nondifferentiable geometric object, then a profile handle may, for example, provide a range within the object space to which the profile must be confined; i.e., the range may be of a tubular configuration wherein the profile is confined to the interior of the tubular configuration, Note that the profile handle 212 affects the fullness of the profile 200 (e.g., the degree of convexity deviating from a straight line between markers on the profile) by changing the length of the profile handle.

An "isocline boundary" 220 is the boundary curve opposite the profile 200 on the isocline ribbon 216. In one embodiment, at each point on the profile 200 there is a paired corresponding point on the isocline boundary 200, wherein each such pair of points defines a vector 224 (denoted a "picket") that is typically transverse to a tangent vector at the point on the profile. More particularly, for a parameterized profile, the isocline boundary 220 can be viewed as a collection of pickets at all possible parameter values for the profile 200.

An "isocline ribbon" (or simply isocline) is a geometric object, such as a surface 216, which defines the slope of the geometric object (e.g., surface) 204 (more generally a geometric object 204) at the profile 200. Equivalently, the isocline ribbon may be considered as the representation of a geometric object delimited by the profile 200, the isocline handles 218a and 218b (discussed hereinbelow), and the isocline boundary 220. In other words, the geometric object 204 must "heel" to the isocline ribbon 216 along the profile 200. Said another way, in one embodiment, the geometric object 204 must be continuous at the isocline 216 and also be continuously differentiable across the profile 200. In an alternative embodiment, the geometric object 204 may be constrained by the isocline 216 so that the object 204 lies within a particular geometric range in a similar manner as discussed above in the description of the term "profile." Note that there may be two isocline ribbons 216 associated with each profile 200. In particular, for a profile that is a boundary for two abutting surfaces (e.g. two abutting surfaces 204), there can be an isocline ribbon along the profile for each of the two surfaces. Thus we may speak of a right and a left hand isocline ribbon.

An "isocline handle" 228 is a geometric object (e.g., a vector) for controlling the shape of the isocline ribbon 216 at the marker 208, wherein the profile handle and isocline handle at the marker may define a plane tangent to the surface 204. Hence the isocline handle is used to determine the shape of the surface 204 (or other underlying geometric object) about the marker. In particular, an isocline handle 228 is a user manipulatable picket 224. If all the profile handles 212 and isocline handles 228 (e.g., for two or more abutting surfaces) are coplanar at a marker 208, then the surface 204 will be smooth at the marker (assuming the surface is continuously differentiable), otherwise the surface may have a crease or dart. Note that by pulling one of the handles (either isocline or profile) out of the plane of the other handles at a marker, one may intentionally generate a crease in the surface 204 along the profile 200.

The part of the profile 200 between two markers 208 is denoted a "profile segment" 232. Similarly, the part of the isocline ribbon 216 between two isocline handles 228 is denoted a ribbon segment 240.

A "boundary segment" 244 denotes the part of the boundary 220 between two isocline handles 228.

The vector 246 that is the derivative tangent to the isocline boundary 220 at an isocline handle 228 is denoted a "ribbon tangent." Note that modifications of ribbon tangents can also be used by the computational system of the present disclosure to control and/or modify the shape of an underlying geometric object such as surface 204.

Isocline handles 228 may be generalized to also specify curvature of the surface 204. That is, instead of straight vectors as isocline handles, the handles may be curved and denoted as "isocline ribs" 248. Thus, such ribs may facilitate preserving curvature continuity between surfaces having associated isocline ribbons along a common profile boundary, wherein the isocline ribbons are composed of isocline ribs. Accordingly, the curvature of such surfaces will match the curvature of their corresponding isocline ribs, in much the same way as they match in tangency.

A "developable surface" is a surface that can be conceptually rolled out flat without tearing or kinking. It is a special case of a "ruled surface," this latter surface being defined by being able to lay a ruler (i.e., straight edge) at any point on the surface and find an orientation so that the ruler touches the surface along the entirety of the ruler. For a developable surface, the surface perpendiculars are all equal in direction along the ruling.

"Label surfaces" denote special 2-dimensional (developable or nearly developable) surfaces wherein a label may be applied on, e.g., a container. Label surfaces allow application of a decal without tearing or creasing. These surfaces are highly constrained and are not typically deformed by the geometric modification of an isocline ribbon 216.

A "trim profile" is a geometric object (curve) that is a profile for trimming another geometric object (e.g., a surface). The trim profile may have a single corresponding isocline ribbon 216 since if the surface to be trimmed is a label surface, it will not be modified and, accordingly, no isocline ribbon can be used to change its shape.

A trim profile (curve) can be used to delimit any surface, not just a label surface. A surface, S, that is blended along a trim profile with one or more other surfaces is called an "overbuilt surface" when the surface S overhangs the trim profile. For example, in FIG. 11, surface 130 is an overbuilt surface, wherein the portion of the surface outside of the area 134 is typically not shown to the designer once it has been trimmed away.

A convex combination of arguments $F_i$ is a summation $$\sum_i c_i F_i$$

where the $c_i$ are scalar coefficients and scalar multiplication is well-defined for the $F_i$ (e.g., $F_i$ being vectors, functions, or differential operators), and where $c_i \geq 0$ and $$\sum_i c_i = 1.$$

If the $F_i$ are points in space, for instance, then the set of all possible such combinations yields the convex hull of the points $F_i$, as one skilled in the art will understand.

A "forward evaluation" is a geometric object evaluation technique, wherein in order to generate a set of sample values from a function, f(x), argument values for x are incremented and f is subsequently evaluated. This type of evaluation is usually fast and efficient, but does not give function values at chosen positions between the increments.

An "implicit function" is one written in the form f(x)=0. $\chi \in \mathbb{R}^N$ When a parametric curve or surface is converted to an implicit form, the conversion is called "implicitization." Hence f(t)=(sin(t), cos(t)) in parametric form may be implicitized by $f(x,y)=x^2+y^2-1=0$. Both forms describe a circle.

Dividing a vector by its length "normalizes" it. The normalized vector then has unit length. A vector function may be divided by its gradient, which will approximate unit length, as one skilled in the art will understand.

Given a function defined by a $$\sum_i p_i(t) F_i(t)$$

where $p_i(t)$ are weighting functions, if $$\sum_i p_i(t) = 1$$

for all values of t, then the $p_i$ are said to form a "partition of unity."

"G1" continuity denotes herein a geometric continuity condition wherein direction vectors along a continuous parametric path on a parametrically defined geometric object are continuous, e.g., tangent vector magnitudes are not considered.

SUMMARY OF THE INVENTION

The present disclosure presents a computational geometric design system that is capable of sufficiently efficient computations so as to allow real-time deformations to objects such as surfaces while a user is supplying the object modifying input. Thus, the present disclosure presents a paradigm shift away from typical CAD systems since, in a typical CAD system the user must supply input for changing or modifying a geometric object and subsequently explicitly request processing of the input to commence. Thus, in such prior art CAD systems, the user receives feedback about his/her design at discrete user requested times. Instead, with the computational system of the present disclosure, updates may be processed in real-time immediately upon input receipt without the user explicitly indicating that update processing is to be performed.

Given the enhanced computational efficiency of the present disclosure, a user can more efficiently perform iterative approximations to a geometric object being designed. The user may speedily design without the need to precisely calculate design geometric characteristics for portions of the object where such precision may not be necessary. That is, the user can be less concerned about getting it "right the first time" since the ease of modification and speed of computing modifications allows the user to more rapidly approximate and/or prototype a geometric object. Thus, the present disclosure provides substantial efficiency benefits in that for many geometrically designed objects (including machined parts), substantial portions of such objects may be satisfactorily designed with a wide range of geometric characteristics.

A CAD system according to the present disclosure enables novel design techniques by providing a novel computational technique for blending between two parametric geometric objects such as surfaces. In one embodiment of the present disclosure, this novel blending technique blends between two parametric surfaces $S_1(u,v)$ and $S_2(u,v)$, wherein each surface has, e.g., the unit square as its parameter space. Assuming each surface $S_1$ and $S_2$ has a respective blending function $B_1(u,v)$ and $B_2(u,v)$ such that each of the blending functions has, for example, (0,1) as its range for u and v (as well as satisfying other properties given hereinbelow), a new surface, S, may be defined by the following formula:

$$S(u,v) = S_1(u,v) \cdot B_1(u,v) + S_2(u,v) \cdot B_2(u,v) \qquad (1)$$

Note that the blending functions $B_1$ and $B_2$ are typically chosen so that the resulting blended surface S is the same as $S_1$ on a boundary with $S_1$, and the same as $S_2$ on a boundary with $S_2$. This is achieved by devising $B_1$ and $B_2$ so that $B_1=1$ and $B_2=0$ on the boundary with S, while having $B_2=1$ and $B_1=0$ on the boundary with $S_2$.

In a more general embodiment, an embodiment of the present disclosure may be used for blending between a plurality of geometric objects, $S_i$, i=1, ..., N, wherein each of the geometric objects is parameterized by a corresponding function $f_{S_i}$ whose domain includes a parameter space PS common to all $f_{S_i}$. Thus, for the resulting blended surface S, substantially every one of its points, S(q), for q in PS is determined using a weighted sum of points obtained from the points $f_{S_i}(q)$. Moreover, since it is desirable to blend S to a boundary portion $P_i$ of each $S_i$, when interpreting S as a function from PS to the common geometric space GS having the geometric objects $S_i$, then $S(f_{S_i}^{-1}(P_i)) \subseteq P_i$. Additionally, S may be also continuous at each $f_{S_i}^{-1}(P_i)$.

Note that Formula (1) above is representative of various formulas for generating a blended surface (more generally, geometric object) S, other embodiments of such formulas are provided in the Detailed Description hereinbelow. Further note that such formulas may be generalized wherein the parameter space coordinates (u,v) of Formula (1) above can be replaced by representations of other parameter space coordinates such as triples (u,v,w) or merely a single coordinate u. Moreover, the blending functions $B_1$ and $B_2$ may also be defined for such other parameter spaces. Additionally, it is worthwhile to note that such blending functions $B_1$ and $B_2$ may be considered as weights of a weighted sum of points selected from the surfaces (more generally, geometric objects) $S_1$ and $S_2$. Further, this weighted sum notion may also be extended in various ways. For example, referring to the more general embodiment wherein a plurality of geometric objects $S_i$, i=1, ..., N are provided, a corresponding weight/blending function $B_i$ may be provided for each value of i so that the following variation of Formula (1) is obtained:

$$S(q) = \sum_{i=1}^{N} B_i(q) S_i(q)$$

for points q in a common parameter space for the $S_i$.

In another aspect of the present disclosure, it is within its scope to also generate blended geometric objects S, wherein at least some of the $S_i$ geometric objects used to generate S are of a higher dimension than 2. For example, if $S_i$ and $S_2$ are parameterized solids, then S may be generated as a solid blended from $S_1$ and $S_2$ using another variation of Formula (1), as one skilled in the art will understand. Thus, S may extend between $S_i$ and $S_2$ so that a surface $P_1$ of $S_1$ and a surface $P_2$ of $S_2$ are also boundaries of S, and S is represented as a weighted sum of points of $S_1$ and $S_2$ similar to Formula (1).

In yet another aspect of the present disclosure, one or more of the parametric geometric objects $S_i$ of Formula (1) (or variations thereof such as Formula (2), (4), (5), (5.02), (5.03), etc. provided in the Detailed Description hereinbelow) may have one of: a Bezier, NURBS, or some other multivariant parametric computational representation instead of, e.g., isocline ribbons as illustratively used in the description herein. Moreover, as one skilled in the art will also understand, it is within the scope of the present disclosure that the underlying geometric objects that define the $S_i$'s (e.g., for the $S_i$ being isocline ribbons, such underlying geometry being markers, profiles, isocline handles and profile handles) may be different for a different computational representation. For example, in a Bezier or NURBS representation of an $S_i$ "control points" and/or geometric entities derived therefrom, may be used to change a shape of the $S_i$ and therefore change the shape of the resulting geometric object S derived therefrom.

In another aspect of the present disclosure, when a blended surface S is generated from one or more isocline ribbons $S_1, \ldots, S_N$, $N \geq 2$, the surface S can be deformed by changing geometric characteristics of the isocline ribbons $S_i$. In particular, by changing the shape of one of the isocline ribbon boundaries for some $S_i$, the points $S_i(u,v)$ change and accordingly, the blended surface S changes since it is a weighted sum of such points. In particular, rates of change of geometric characteristics of S (such as curvature, tangent vectors, and/or tangent planes) may be determined by the shape of the isocline ribbons $S_i$. More particularly, assuming a substantially linear parameterization along each isocline picket, the greater the relative magnitude of such pickets for a particular isocline ribbon, the more the shape of S will be skewed in the direction(s) of such pickets. Moreover, as the direction of such pickets changes, the curvature of S changes. That is, since the weighted sums, such as Formula (1), cause S to always heel to the surfaces $S_i$, the shape of S will change so that S heels to the isocline ribbon(s) $S_i$ having pickets whose directions have changed. Thus, the shape of the blended surface S may be changed by any user interaction technique that: (a) changes one or more geometric characteristics of one or more of the $S_i$, wherein such changes may include: changing a shape of S, (wherein shape denotes a plurality of geometric characteristics such as continuity, differentiability, curvature, and higher order continuity), (b) changes a parameterization of an $S_i$.

Also note that such user interaction techniques for deforming a blended surface may also be used with higher dimensional geometric objects. For example, if the $S_i$ geometric objects are solids rather than surfaces, then a resulting blended solid, S may be deformed by changing a shape of one or more of the solids $S_i$ used in determining S.

It is also within the scope of the present disclosure that the geometric objects $S_i$ used to generate a blended geometric object S may be such that the $S_i$'s can be modified indirectly via other geometric objects from which the $S_i$'s may be themselves generated. For example, if S is a surface blended from isocline ribbons $S_1$ and $S_2$ (having corresponding profiles $P_1$ and $P_2$, respectively), and the ribbon $S_1$ is interpolated from the profile handle, the isocline handle, and the ribbon tangent at the end points of $P_1$, then the present disclosure provides user interaction techniques for modifying such handles and/or ribbon tangents for thereby modifying the blended surface S. Moreover, in one user interface technique, only the handles may be displayed, wherein such handles are displayed as connected to the blended surface S. Thus, by changing such handles, the blended surface changes. Note that such user interaction techniques may be responsive in real time to user changes to such handles and/or ribbon tangents. Thus, a user's design intent may be immediately displayed while the user is inputting such changes. Accordingly, using the present disclosure, user interactions in the design process may become closer to the techniques in used in constructing actual geometric models rather than prior art CAD user interaction techniques.

It is another aspect of the present disclosure that various geometric constraint criteria are capable of being applied to geometric objects generated according to the present disclosure. In particular, features and/or subgeometry of a geometric object $O_0$ are capable of being constrained to lie within another geometric object, $O_1$, so that as $O_1$ is deformed, the features and/or subgeometry of $O_0$ deform correspondingly, and thereby cause $O_0$ to deform accordingly. For example, the present disclosure allows an object space point p to be defined (i.e., parameterized) so that it must remain in/on a given geometric object $O_1$, where $O_1$ may be a curve, surface, volume or solid. Thus, as $O_1$ is deformed, $O_0$ also deforms. Moreover, instead of a point p, other geometric subobjects may also be similarly constrained, such as curves, surfaces or solids. Additionally, features of a geometric object $O_0$ such as control points, handles (of various types, e.g., profile and isocline), normals, twist vectors, etc. may also be similarly constrained by the present disclosure so that as $O_1$ is deformed, $O_0$ is caused to also deform. For instance, using the geometric object interpolation techniques provided by the present disclosure, e.g., Formula (1) and variations thereof, the geometric object $O_0$ can be efficiently regenerated (e.g., reinterpolated) substantially in real-time when constrained features and/or subgeometries of $O_0$ are correspondingly deformed with a deformation of $O_1$. More particularly, this aspect of the present disclosure provides for the combining of various geometric objects hierarchically so that geometric deformation control of a parent object causes corresponding geometric changes in dependent child geometric objects. For example, when a surface patch represents fine scale detail of a larger surface, it may be advantageous to attach the fine detail surface patch to the larger surface to thereby give a user automatic control over the shape of the fine detail surface patch by controlling the shape of the larger surface. Moreover, similar hierarchical control can be provided with other geometric objects of types such as curves, points and three-dimensional deformation spaces.

Note that such hierarchical control may be also used with a persistent deformation space wherein it is desirable for a geometric object in this space to be repeatedly deformed and restored to its original non-deformed state. Note that this is difficult to do in real-time by repeatedly applying a one-time deformation. Accordingly, by utilizing such hierarchical control of the present disclosure, a geometric object embedded in such a three-dimensional deformation space and/or the control structures of the geometric object embedded therein provides for the deformation of the geometric object when the three-dimensional deformation space is deformed. Further, if one or more such deformation spaces are, in turn, made dependent upon a simpler geometry such as a surface or curve, then substantial control over the shape of the geometric object, however complex, can be provided by manipulating the shape of the simpler geometry.

A novel aspect of the present disclosure is an N-sided surface generation technique which is applicable for efficiently and accurately converting surfaces of high polynomial degree into a collection of lower degree surfaces. In particular, the N-sided surface generation technique disclosed herein subdivides parameter space objects (e.g., polygons) of seven or more sides into a collection of subpolygons, wherein each subpolygon has a reduced number of sides. More particularly, each subpolygon has 3 or 4 sides.

In one embodiment, for a parameter space object having N sides ($N \geq 7$), the novel technique disclosed herein determines a point in a central portion of the parameter space object, and an edge to each vertex of the object is introduced for subdividing the object. Such subdivision creates N triangular patches. As an illustrative example, FIG. 2 shows an octagon 10 in parametric space that is subdivided into eight 3-sided areas 12a-12h, wherein for each of these areas 12a-12h of the parameterization domain, the N-sided surface generation technique disclosed herein provides a corresponding one of the mappings 14a-14h to a corresponding patch 16a-16h in object space (e.g., area 12c maps to patch 16c via mapping 14c). Moreover, the resulting object space patches 16a-16h are advantageously watertight, i.e., there are no gaps between the images of the parameter space subdivisions where:

these subdivisions have a common edge, and
  such gaps would allow water to leak through if the surface were manufactured out of a water tight material.

Such patches, resulting from the application of the present N-sided surface generation technique to parameter space subdivisions having a common side, form a composite surface having a smooth change in surface tangency across the (object space) boundaries of these patches. In particular, and importantly, composite surface tangents along the image of a common boundary between parameter space subdivisions are identical regardless of how such tangents are determined in the composite surface.

The novel N-sided surface generation technique disclosed herein generates analytic representations of N-sided object space surfaces (each surface also referred to herein as an NSS), wherein the polynomial degree of such an NSS is reduced over what is provided in the prior art. Such reduction in the polynomial degree of an NSS results in substantially greater computational efficiency in the generating of surfaces, and in performing geometric modeling therewith. Additionally, the present N-sided surface generation technique can be used in converting object space surfaces of high polynomial degree to corresponding surfaces of lower degree, wherein each of the converted surfaces is effectively a copy of its corresponding surface of high polynomial degree in that the discrepancies between the two surfaces can be made insignificant. Accordingly, when the present the N-sided surface generation technique is embodied as a converter for converting surfaces of high polynomial degree to a composite of surfaces of lower polynomial degree, interoperability between various geometric modeling systems is facilitated. In particular, in a geometric modeling system that generates at least some surfaces of high polynomial degree, such surfaces can be converted into a corresponding collection of surfaces having lower polynomial degrees, and accordingly, data for the resulting composite surface obtained from the collection can be appropriately used by a commercial geometric modeler that would be unable to appropriately use the corresponding surface of high polynomial degree. More particularly, since the generated N-sided surfaces of low polynomial degree can be further converted into, e.g., trimmed Bezier surface representations and/or trimmed non-uniform b-spline surface (NURBS) representations, the present surface generation technique effectively allows for the use of surfaces having excessively high polynomial degrees to be acceptable to commercial surface generation computational systems such as those provided by Alibre™, Solidworks™, and Spatial Technologies™.

The conversion process provided by the present N-sided surface generation technique may be used to effectively import into a commercial geometric modeler (expecting all geometric representations to have a low polynomial degree, e.g., less than or equal to 25) an excessively high polynomial degree surface. In particular, surfaces having a parametric patch with a large number of sides, e.g., greater than seven sides, may be effectively imported into such a geometric modeler by converting such excessively high degree surface patches into a collection of lower degree patches that match the high degree surface as closely as desired. Thus, such a conversion is more effective than prior art conversion techniques.

In one embodiment of the novel surface generation technique disclosed herein, this technique approximates each N-sided patch, for N>7, by a collection of 3 and/or 4-sided patches, wherein the computational reliability and modeling accuracy can be maintained. In particular, the modeling accuracy provided by the present conversion is such that the error between the original N-sided patch of N≥7, and the collection of 3 and/or 4-sided patches can be made as small as the computer computational tolerance will allow. Moreover, when the presently disclosed technique is applied to N-sided patches where N=3 to 7, the conversion is exact. In particular, note that 4-sided patches have an exact conversion, which is important because such patches are of reasonably low degree, and many useful engineering surfaces such as planar, extrusion and rotational surfaces can be exactly reproduced with 4-sided patches.

In one embodiment, novel surface generation technique disclosed herein performs the following steps:

Step 1: Divide N-sided patches into 3-sided and/or 4-sided patches, where N≥4;
  Step 2: Convert the 3 or 4 sided patches (with or without corresponding surface tangent information), using conversion matrices, into Bezier patches; and
  Step 3: Convert Bezier patches into B-spline patches.

Moreover, the presently disclosed surface generation technique provides advances in such computationally difficult geometric modeling issues as water tightness, isoparameter behavior and tangency due to the increased exactness of surface conversions afforded by the presently disclosed surface generation technique.

Furthermore, the present disclosure provides techniques for $G^2$ continuity (also known as "G2 geometry continuity") between such patches, which produce. surfaces with improved visual and functional characteristics.

The computational features disclosed herein can be applied to industries such as, but not limited to, internet advertising, animation, automotive styling, CAD/CAM, product design, and computer gaming models, etc.

Other features and benefits of the present disclosure are provided in the Detailed Description and the drawings provided herewith.

BRIEF DESCRIPTION OF THE DRAWING

The patent or application file contains at least one drawing executed in color. Copies of this patent or patent application publication with color drawing(s) will be provided by the Office upon request and payment of the necessary fee.

FIG. 26 is a flowchart showing the steps for computing an interpolating curve according to the present disclosure using a one-dimensional embodiment of the computational techniques novel to the present disclosure.

DETAILED DESCRIPTION

1. Introduction

Figure 1:
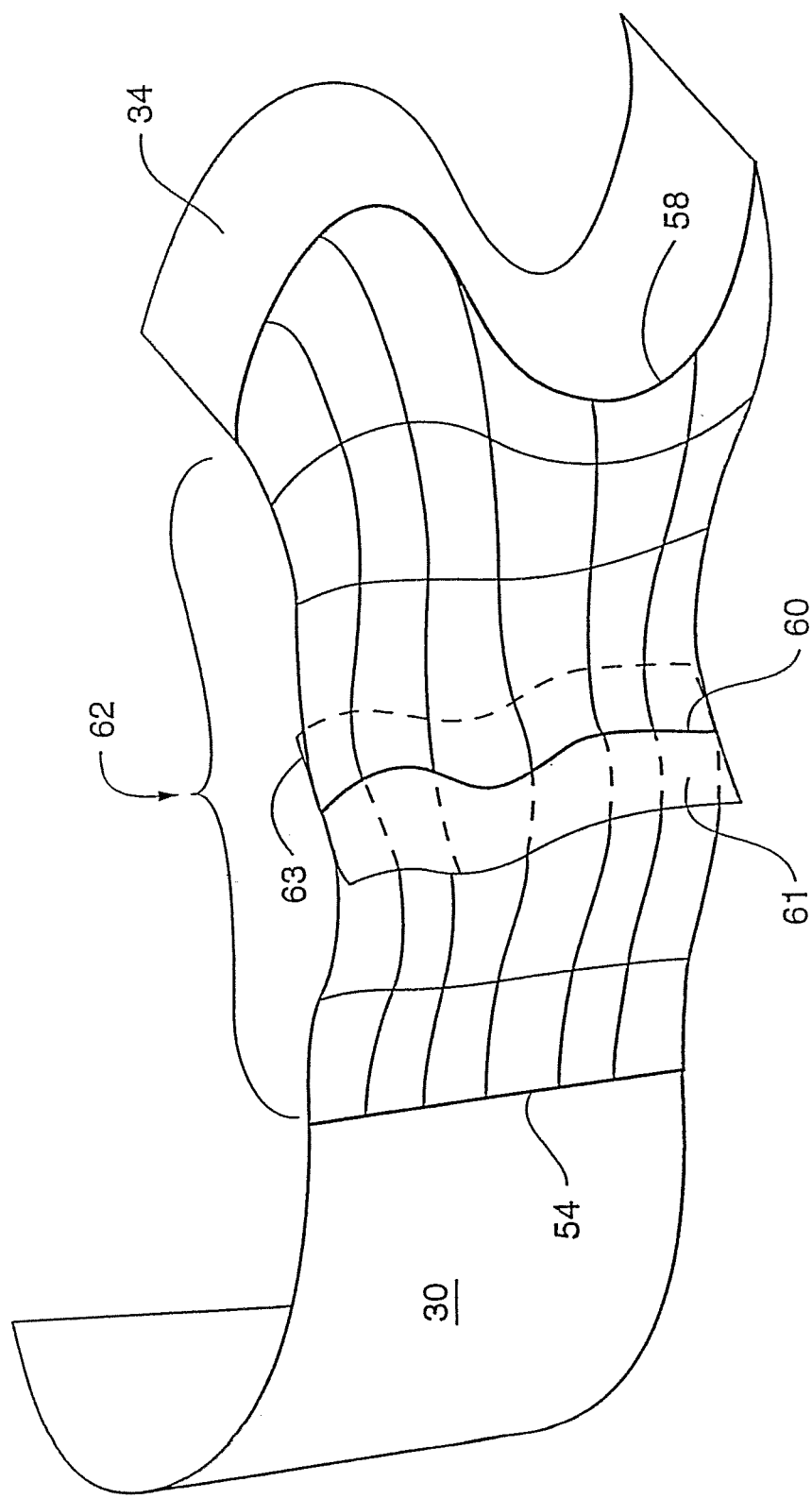
FIG. 1 shows a surface 62 generated according to the present disclosure, wherein the surface interpolates between the surfaces 30 and 34, and also passes through the curves 54, 58 and 60 at predetermined directions according to the isocline ribbons 61 and 63.

FIG. 1 illustrates the use of an embodiment of the present disclosure for designing a surface 62 that interpolates any two parametric surfaces such as between the half cylinder surface 30 and the surface 34. That is, the surface 62 is generated via a novel surface interpolation process, wherein constraints on surface 62 shape are provided by the feature curves 54, 58 and 60, and their associated novel control geometry (e.g., isocline ribbons). In particular, the following constraints are satisfied by the surface 62:

(a) one or more geometric characteristics of the surface 30 along the feature curve 54 are imposed on the surface 62, (b) one or more geometric characteristics of the surface 34 along the feature curve 58 are imposed on the surface 62, and (c) the surface 62 interpolates through the feature curve 60, wherein the surface 62 tangents along the extent of curve 60 are derived from (e.g., identical to) the isocline ribbons 61 and 63.

Thus, using a computational system as contemplated by the present disclosure, a designer can design a surface specified in terms of: (a) a relatively small number of carefully constructed and positioned feature curves, and (b) the desired slope(s) of the surface along the extent of these feature curves (via isocline ribbons). Moreover, using a computational system as contemplated by the present disclosure, such a designed surface not only interpolates fairly between the feature curves but also may obey other imposed constraints such as convexity, concavity, and/or predetermined curvature ranges.

Figure 2:
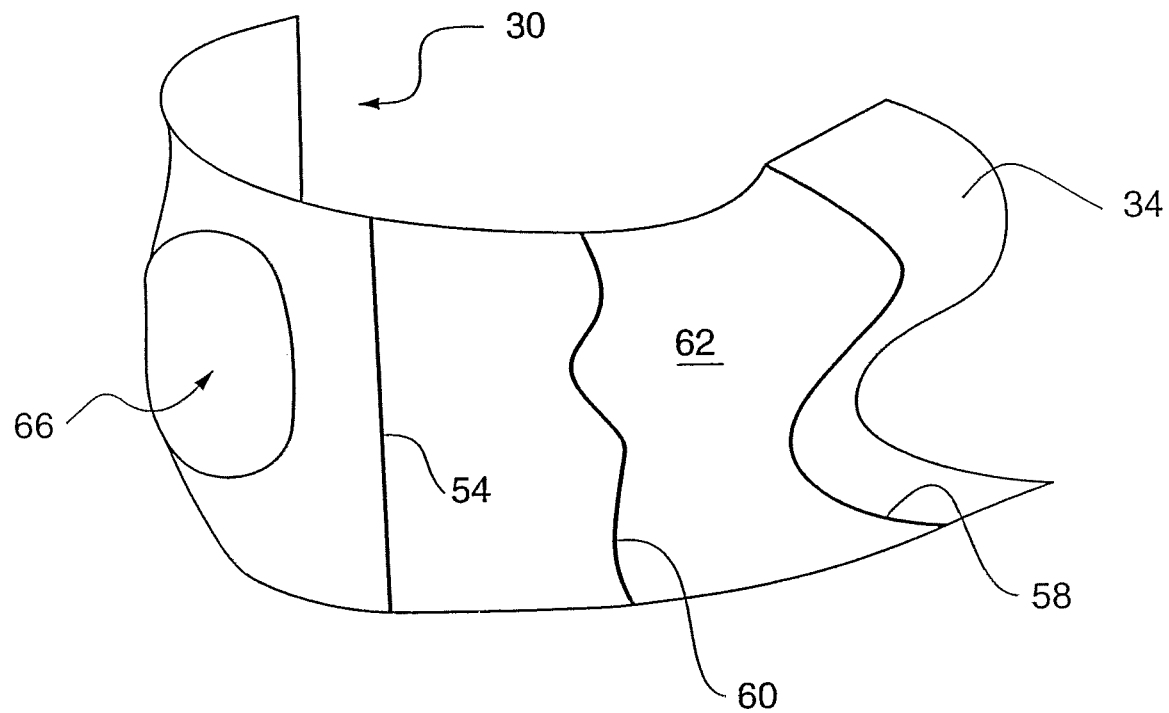
FIG. 2 shows a further modification of the surfaces of FIG. 1, wherein the surface 30 has a circular disk 66 blended thereto according to a method of the present disclosure.

Additionally, a computational system according to the present disclosure can be used to blend a surface region into an object being designed. For example, FIG. 2 illustrates the blending of a circular disk 66 into the cylindrical surface 30. Moreover, a computational system according to the present disclosure can also be used to construct bosses, dimples, logos, and embossing as well as to recursively design surfaces as one skilled in the art will come to appreciate from the disclosure herein.

At least one embodiment of a computational system according to the present disclosure differs from traditional approaches to computer-aided design (CAD) in that with a computational system according to the present disclosure, a desired geometric object (e.g., a surface) that may be created as a plurality of geometrically and computationally unrelated patches (e.g., three-, four-, five-sided bounded surfaces), which may be subsequently pieced together in a way that satisfies certain constraints at the boundaries between the patches. Thus, the desired geometric object can be designed by piecing together the plurality of unrelated geometric sub-objects (subsurfaces) in a manner that interpolates, blends and/or trims these sub-objects so that, across the boundaries and/or regions therebetween, constraints such as continuity, differentiability, and/or curvature are satisfied. This is fundamentally different from the traditional approaches to CAD in that only four-sided NURBS, Bezier, Hermite, Coons, Gordon or Booleans of implicit surfaces are patched together in prior art systems.

2. Blending Between Geometric Objects

A fundamental geometric object design technique of the present disclosure presents the blending between two parametric geometric objects such as surfaces and, more particularly, the manner in which such blending is performed. As defined in the Definitions Section above, a "parametric geometric object" (e.g. a surface) may be defined as a result of a mapping from a (simple) coordinatized geometric object (parameter space) such as a bounded plane to another (typically, more complex) geometric object (object space). When the parameter space is a bounded plane, two coordinates or parameters (denoted u and v) may by way of example be used to uniquely identify each point in the parameter space. When the object space is three-dimensional, for every (u,v) point in the bounded plane parameter space, a function may associate a point (x,y,z) in the object space.

By convention, a planar parameter space is usually assumed to be the unit square, which means that both u and v vary between 0 and 1, although it is within the scope of the present disclosure to utilize other parameter space geometries and coordinate ranges.

In one embodiment of a computational system according to the present disclosure, in order to blend between two parametric surfaces $S_1(u,v)$ and $S_2(u,v)$ each having the unit square as their parameter space, each surface $S_1$ and $S_2$ has associated therewith a respective blending function $B_1(u,v)$ and $B_2(u,v)$, wherein each of the blending functions has, for example, (0,1) as its range (as well as satisfying other properties given hereinbelow). Consequently, a new surface may be defined by the following formula:

$$S(u,v)=S_1(u,v) \cdot B_1(u,v)+S_2(u,v) \cdot B_2(u,v) \qquad (1)$$

Figure 3:
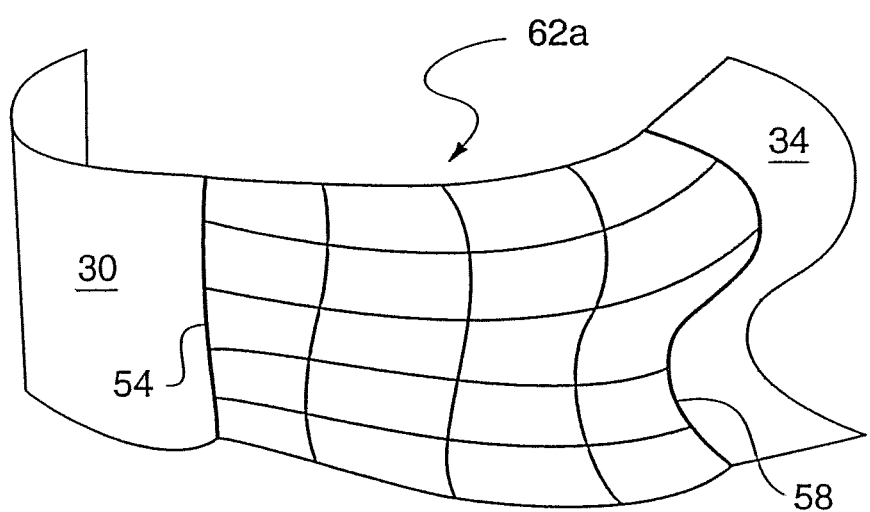
FIG. 3 shows a blended surface 62a generated according to the present disclosure between the surfaces 30 and 34, wherein the surface 62a passes through the curves 54 and 58 and wherein the blending is performed according to a novel surface generation formula provided herein (Formula (1)).

Note that the blending functions $B_1$ and $B_2$ are typically chosen so that the resulting blended surface S is the same as S, on a boundary with $S_1$, and the same as $S_2$ on a boundary with $S_2$. This is achieved by devising $B_1$ and $B_2$ so that $B_1=1$ and $B_2=0$ on the boundary with S, while having $B_2=1$ and $B_1=0$ on the boundary with $S_2$. In FIG. 3, for example, if S, is the surface 30 and $S_2$ the strip 34, and one boundary is the vertical line 54 of the surface 30 and the other boundary is the curve 58 on the strip 34, then the surface 62a is S, which runs between these two boundaries and is tangent to $S_1$ and $S_2$ at the boundaries.

2.1. The Blending Functions

Blending functions may be provided for blending between geometric objects of various types. For example, blending functions for blending between two volume filling geometric objects can be provided. However, to simplify (and clearly illustrate) the novel blending process and the associated blending functions of the present disclosure, the discussion here is initially limited to blending between two curves, or blending between two surfaces. Accordingly, for two surfaces $S_1$ and $S_2$ to be blended together, the blending functions $B_1(u,v)$ and $B_2(u,v)$, respectively, are appropriately set to either 0 or 1 on the boundaries of a blended surface generated by a computational system according to the present disclosure.

Figure 4:
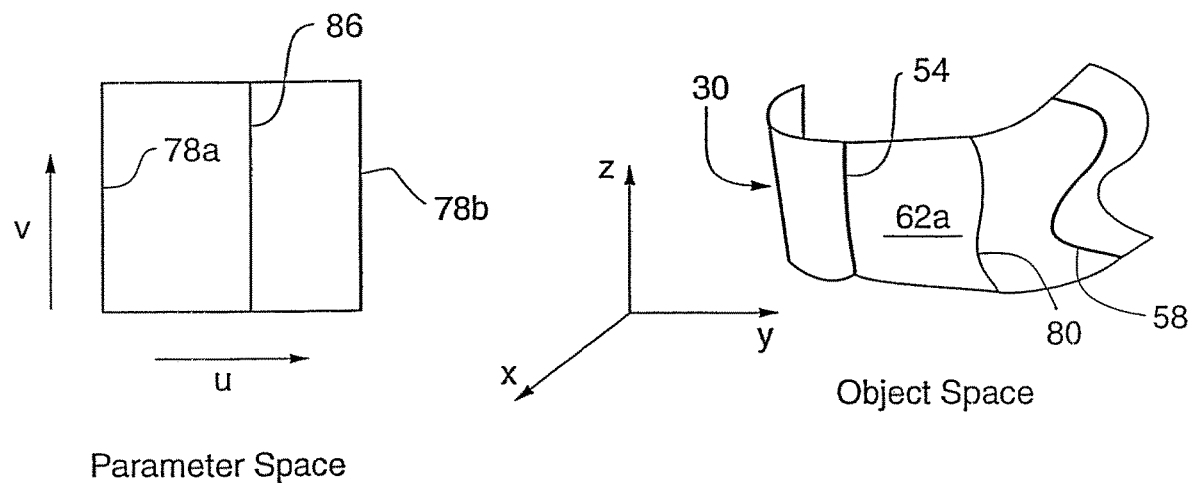
FIG. 4 illustrates a correspondence between geometric entities in parameter space and geometric entities in object space, wherein lines 78a and 78b of parameter space have object space images of curve 54 and 58, respectively, and additionally, parameter space line 86 has as an object space image curve 80.

Referring to FIG. 4, wherein it is assumed that the boundaries 78a, 78b in parameter space correspond to the profiles 54 and 58 in object space, for any curve 80 on the blended surface such as surface 62a, there is a related pre-image (e.g., line 86) defined in parameter space as indicated. Note that for simplicity the boundaries 78a and 78b, and the pre-image of curve 80 are straight, but they need not be so.

Assuming (again for simplicity) the blending functions $B_1(u,v)$ and $B_2(u,v)$ have their domains in the unit square (as their parameter space), for any point (u, v) in this parameter space it is important to determine some measure of how "close" the point (u,v) is to the boundary curves (e.g., boundary curves 78a and 78b) and, more generally, to the pre-images of profile curves. Such closeness or distance-like measurements may be used in specifying the blending functions and/or their resulting values. Note that there are many ways to compute such a closeness or distance-like measurement in parameter space. For instance, if a boundary 78 (or profile pre-image) is a straight line, then such a parametric distance to a (u,v) point is easily calculated as the length of a perpendicular line segment to the boundary line through the point. Additional techniques for computing parametric distances are described hereinbelow (e.g., Sections 2.3 and 2.4).

Assuming parameter space is still the 2-dimensional space of (u,v) points, a blending function $\tilde{B}_1$ (wherein $1 \le i \le N$ for some fixed N number of boundary curves) can be computed as a function of a univariate distance-like function $\tilde{B}_i(D_i)$, where $D_i$ is in turn a function of (u,v) so that $B_i(D_i)=\tilde{B}_i(D_i(u,v))=B_i(u,v)$, wherein $D_i(u,v)$ is a distance-like function to the pre-image $C_i^{-1}$ of a boundary curve $C_i$ (in object space) of a surface S. Note that such distance-like functions must satisfy the condition that as (u,v) gets arbitrarily close to the $i^{th}$ boundary curve pre-image $C_i^{-1}$ (such as measured in conventional Euclidian distance), then $D_i(u,v)$ gets arbitrarily close to zero. Examples of such blending functions $\tilde{B}_i$ and distance-like functions $D_i$ are provided hereinbelow.

Since many of the most useful blending functions $B_i$ are of the form $\tilde{B}_i(D_i)$, unless additional specificity is required, $B_i$ will be used hereinbelow to denote both: (a) the blending function $B_i(u,v)$ initially discussed above, and (b) the blending function $\tilde{B}_i(D_i)$ for some distance-like function $D_i$. If, however, a clear distinction is required between the blending functions of (a) and (b), the domain of the blending function can be used to indicate which blending function is indicated. As an aside, note that Formula (1) applies equally well for the blending functions $\tilde{B}_i(D_i)$, i=1, 2; that is, $$S(u,v)=S_1(u,v) \cdot \tilde{B}_1(D_1)+S_2(u,v) \cdot \tilde{B}_2(D_2). \qquad (2)$$

If a point (u,v) is close to the $i^{th}$ pre-image boundary i=1, 2, then $\tilde{B}_i(D_i)$ is expected to be small and the point is mapped (into object space) close to the $i^{th}$ boundary.

Figure 5:
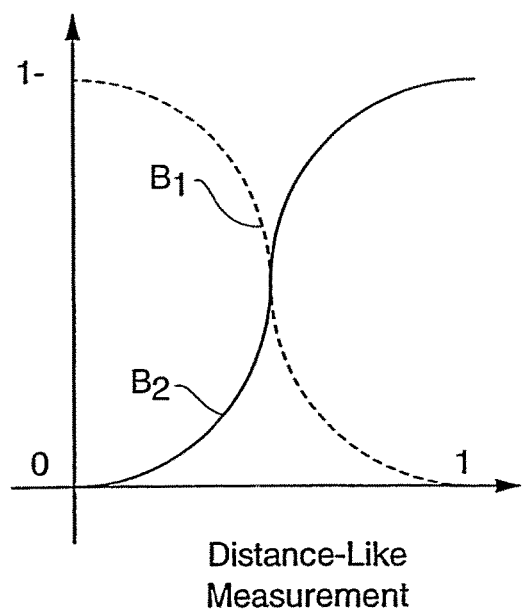
FIG. 5 provides a graphical representation of two blending functions, $B_1$ and $B_2$, utilized in some embodiments of the present disclosure.

A good collection of blending functions $B_i$ not only allows the mapping, S, of a blended surface to be coincident with the desired perimeter (profile) curves, but will do so in a manner so that the resulting blended surface between two or more such perimeter curves of, e.g. for example, different initial surfaces will preserve such characteristics as the continuity of curvature with these initial two surfaces. That is, the blended surface "heels" to each of the initial surfaces. Also, it is preferred that the blending functions $B_i$ allow the new surface to be fair. FIG. 5 shows a graph of a pair of desirable blending functions for $B_i$, i=1, 2.

For profile curves $P_1$, $P_2$ of two surfaces $S_1$ and $S_2$, wherein a blended surface is desired between $P_1$ and $P_2$, assume that the profiles $P_1$ and $P_2$ have parametric pre-images that correspond, respectively, to u=0, u=1 of the unit square $\{(u,v)|0 \le u \le 1$ and $0 \le v \le 1\}$, then some useful properties for blending functions $B_1$ and $B_2$ are:

(1.1) $B_1=1$ at u=0 and $B_1=0$ at u=1. $B_2=0$ at u=0 and $B_2=1$ at u=1.

(1.2) The derivatives $B_1'$ and $B_2'$ equal 0 wherever $D_i(u,v)=0$ and $D_i(u,v)=1$, i=1, 2. This enforces smooth (tangent continuous) transitions between the blended surface S and the initial surfaces $S_1$ and $S_2$. If higher order derivatives are also zero, then higher order continuity between surfaces can be realized, usually improving its fairness.

(1.3) $B_1+B_2=1$ for all points (u,v). This is called a "partition of unity," and it provides for the generation of a convex combination of the surfaces $S_1$ and $S_2$ to which a new blended surface abuts. Note that this tends to keep the new blended surface from drifting too far from the initial surfaces $S_1$ and $S_2$.

There are numerous embodiments for defining blending functions. One useful embodiment is:

$$B_1(D_1) = \cos^2\left(D_1 \frac{\pi}{4}\right) \text{ and } B_2(D_2) = \sin^2\left(D_2 \frac{\pi}{4}\right) \quad (3)$$

which gives arbitrarily high order continuity of the blending functions, which is needed to achieve the same high order continuity between the initial blended surfaces. Another alternative is to choose polynomial functions with the above properties (1.1) through (1.3). For example, a quintic polynomial can be chosen with zero second derivative at D=0 and D=1, thereby providing beneficial curvature characteristics (see Section 4.4).

In addition to the blending functions described herein above, the following are examples of additional blending functions:

$B_1(x)$ and $B_2(x)$ are polynomials satisfying the following constraints:

$B_1(0)=1, B'_1(0)=0, B(1)=0$, and $B'(1)=0$ $B_2(x)=1-B_1(x)$

Note that additional constraints regarding high order derivatives (e.g., equal to 0 at x=0 and/or 1) may also be imposed. For example, if $B''_i(0)=B''_i(1)=0$, i=1, 2, then $C^2$ continuity is attained with the objects from which interpolating and/or blending is performed.

An example of polynomial blending functions satisfying these constraints is:

$B_1(x) = (1-x)^2 + 5x(1-x)^4 + 10x^2(1-x)^3$ $B_2(x) = 1-B_1(x).$

Figure 6A:
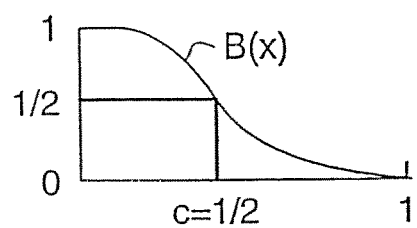
FIGS. 6A-6D show graphs of additional blending functions that may be used with the present disclosure.
Figure 6B:
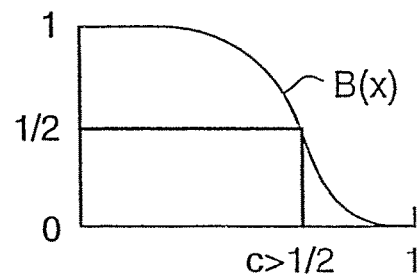
Figure 6C:
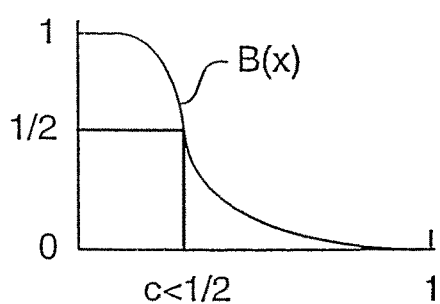
Figure 6D:
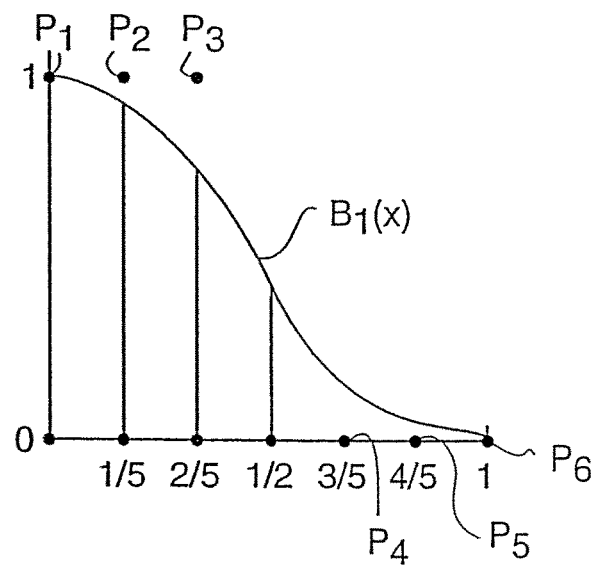

Note that $B_1(x)$ may be derived as a Bezier curve with six control points, $P_1, \ldots, P_6$, as shown in FIG. 6D. Moreover, note that since $B'_1(x) = -30x^2 \cdot (1-x)^2$ and $B''_2(x) = 60x \cdot (1-x)^2 - 60x^2 \cdot (1-x),$ that $B'_1(1)=0, B''(0)=0, B''_1(1)=0, B'_2(0)=0, B'_2(1)=0, B''_2(1) =0,$ $B'_1(0)=0$ and $B''_2(0)=0.$ (c) Any composition of blending functions as described hereinabove with a bijective (e.g., one-to-one and onto) parameterization function $P:[0,1] \to [0,1]$ may be composed with a blending function to obtain another blending function. As a specific example, let $P(x)=2c(x-x^2)+x^2$, where c is a constant "skew" factor, then a new blending function may be construed as $B(P(x))$. Thus, when c=½, P(x)=x. Moreover, as c varies, the inflection point of the graph of P(x) moves as shown in FIGS. 6A-6C. Note that the blending function of FIG. 6B (wherein c>½) will cause the blending curve (and/or surface or other geometric object) to retain the geometric characteristics of the object used for blending that corresponds to the x=0 axis in the graph of FIG. 6B for a larger part of the surface.

To reduce the real-time design computational overhead incurred for evaluating blending functions, the values for the blending functions may, in one embodiment, be tabulated prior to a design session at a sufficiently high resolution and stored in memory in a manner that allows efficient indexed access to a closest approximation to the actual blending function value.

2.2. Extending Blending to N-Sided Regions

In one embodiment of a computational system according to the present disclosure, a novel general form for blending over a region that is bounded by each edge $e_i$ of a parametric surface S, (i=1, 2, ..., N and N≥2) is the following weighted sum of points $S_i(u_i(p),v_i(p))$:

$$S(p) = \sum_{i=1}^{N}\left[\prod_{\substack{j=1\\j\neq i}}^{N} B_j(D_j(p))\right] S_i(u_i(p), v_i(p)) \quad (4)$$

where:
(a) p is a variable denoting points in a common parameter space for the surfaces $S_i$;
(b) $D_j(p)$ is a distance-like measurement to the pre-image of the $i^{th}$ edge $e_i$ in the common parameter space;
(c) $B_j$ is a blending function which is zero when $D_j$ is zero and monotonically increases as $D_j$ increases; and
(d) $u_i$ and $v_i$ are parameterization functions that transform p from the common parameter space to the (any) intermediate parameter space for $S_i$.

Note that by dividing by the sum of the products of the blending functions, $B_j$, $$\left(\text{e.g., } \sum_{i=1}^{N}\left[\prod_{\substack{j=1\\j\neq i}}^{N} B_j\right]\right)$$

the formula (4) can be normalized with respect to the blending functions. Further note that Formula (4) resembles Formula (1) when N=2, and is in fact an extension thereof. That is, for N=2, $B_1$ of Formula (4) has the functional behavior of $B_2$ in Formula (1), and $B_2$ of Formula (4) has the functional behavior of $B_1$ in Formula (1). That is, there is a subscripting notational change between the two formulas.

Figure 14:
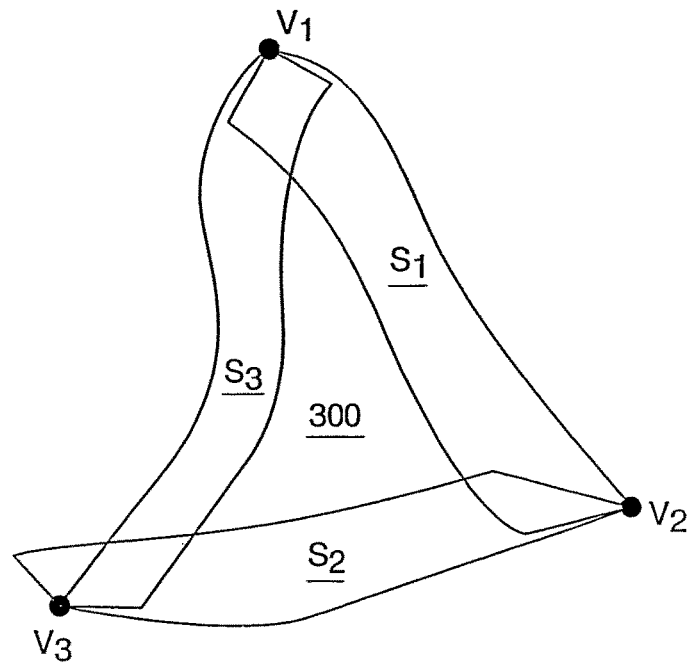
FIG. 14 illustrates a region that has sides and ribbons defined by three surfaces $S_1$, $S_2$ and $S_3$, wherein the present disclosure shows a surface patch for the region 300 using Formula (5) provided hereinbelow.

As an example of Formula (4), consider the three-sided region 300 shown (in object space) in FIG. 14. Applying Formula (4) to thereby generate a surface, S, for region 300, the following equation is obtained:

$$S(p) = B_2(v)B_3(w)S_1(u) + B_1(u)B_3(W)S_2(V) + B_1(u)B_2(v)S_3(w) \quad (5)$$

where u, v and w as parameterization functions are the barycentric coordinates of p as one skilled in the art will understand.

Figure 34:
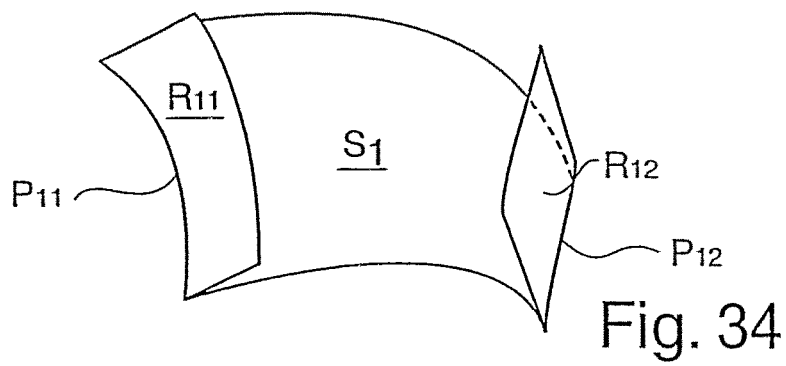
FIGS. 34 and 35 illustrate the intermediary surfaces generated during the performance of one method for creating a 4-sided patch (FIG. 36) from two 2-sided blends using the four profile curves of FIG. 33. That is, a blended surface $S_1$ (FIG. 34) is generated using the isocline ribbons $R_{11}$ and $R_{12}$ (for the profiles $P_{11}$ and $P_{12}$, respectively), and a blended surface $S_2$ (FIG. 35) is generated using the isocline ribbons $R_{21}$ and $R_{22}$ (for the profiles $P_{21}$ and $P_{22}$, respectively).
Figure 35:
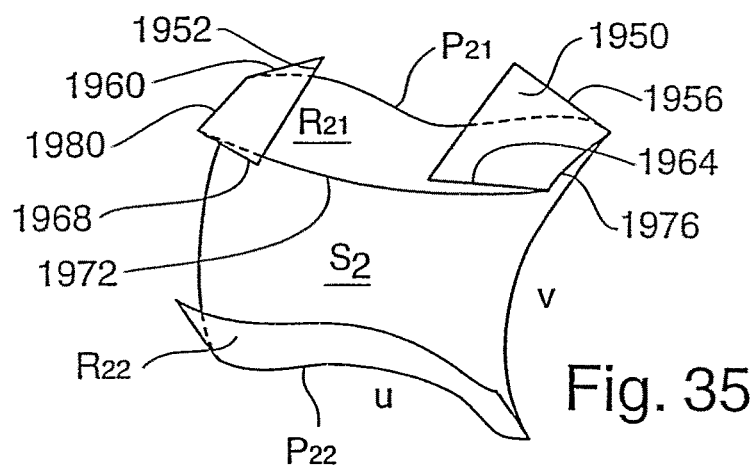

An alternative method to define a blended surface over N-sided (N≥4) regions is provided by first applying the two-sided approach based on Formula (1) using $R_{11}$ and $R_{12}$ of FIG. 34 as $S_1$ and $S_2$, respectively in Formula (1) to thereby generate $S_1$ of FIG. 34. Additionally, Formula (1) is applied to the surfaces of FIG. 35, wherein $S_1$ and $S_2$ of Formula (1) are replaced by $R_{21}$ and $R_{22}$ respectively, to thereby generate $S_2$ of FIG. 35. The two resulting surfaces $S_1$ and $S_2$ of FIGS. 34 and 35 respectively are, in turn, blended using Formula (2) wherein blending functions $B_1$ and $B_2$ are as described hereinabove, and the corresponding $D_i$ are described hereinbelow For example, given that each of the ribbons $R_{11}$, $R_{12}$, $R_{21}$, and $R_{22}$ have a common pre-image, the $D_i$ used in Formula (2) to compute distance-like measurements to the pre-images of the pair of edges $P_{11}$, $P_{12}$, $P_{21}$, and $P_{22}$ (FIGS. 34 and 35) may be:

(a) For a point $P_1$ of the (common) pre-image for $S_1$ of FIG. 34, $D_1(P_1)$=min $(D(P_1,P_{11}), D(P_1,P_{12}))$ wherein D is the Euclidean distance between $P_1$ and the corresponding profile $P_{1i}$, and (b) For a point $P_2$ of the (common) pre-image for $S_2$ of FIG. 35, $D_2(P_2)$=min $(D(P_2,P_{21}), D(P_2,P_{22}))$.

Figure 36:
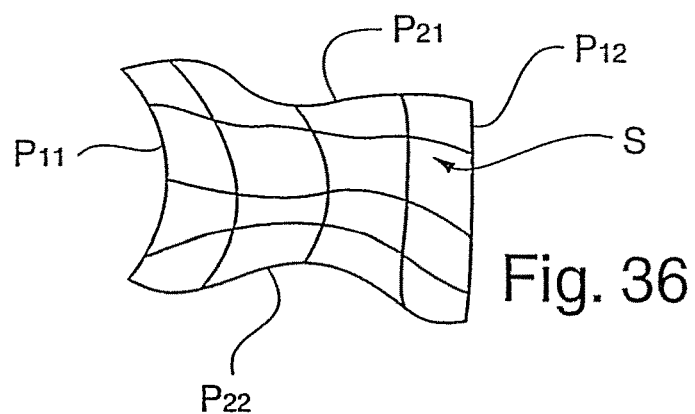
FIG. 36 shows a resulting blended surface S derived from $S_1$ (shown in FIG. 34), and $S_2$ (shown in FIG. 35), wherein S is generated according to Formula (11) provided in Section 5 of the detailed description hereinbelow.

Accordingly, the two surfaces $S_1$ and $S_2$ can be blended together using Formula (2) to obtain surface S of FIG. 36.

In another embodiment that is particularly useful for generating a four-sided blended patch, assume the following restricted but versatile scheme for defining profiles and ribbons:

(a) All handles are piecewise linear segments; and
(b) All blending is done with the functions $B_1(x)$ and $B_2(x)$ of Formulas (3).

Figure 37:
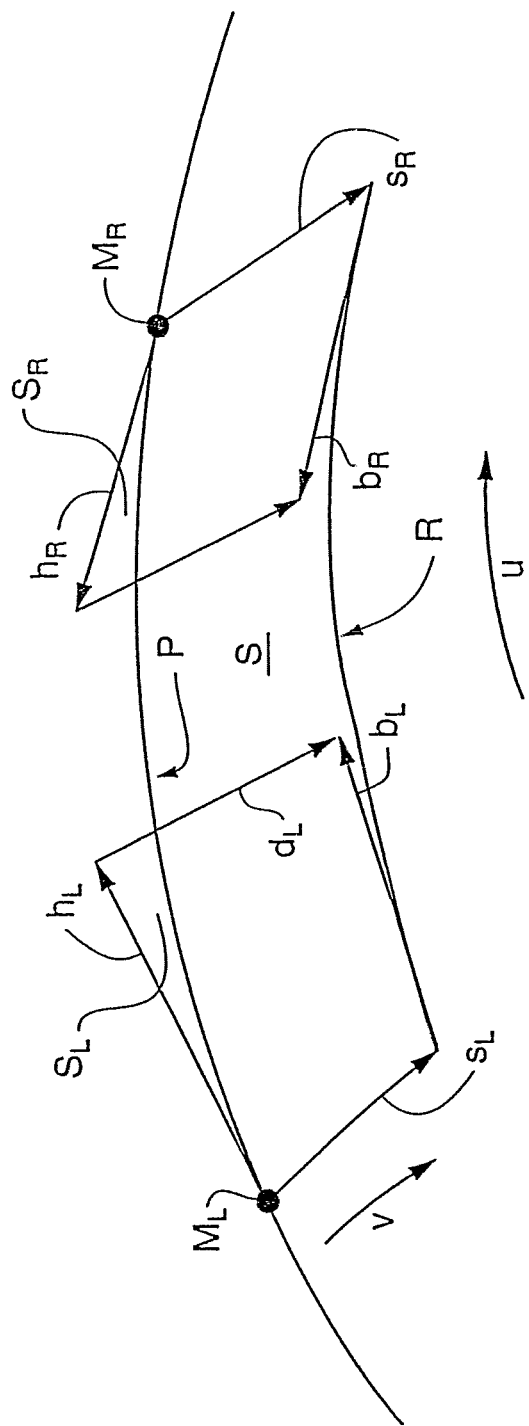
FIG. 37 shows the geometric objects used in an embodiment of the present disclosure for generating a surface S from two surfaces $S_L$ and $S_R$. In particular, this figure introduces the notational conventions subsequently used in FIGS. 38 through 41.

Moreover, referring first to FIG. 37 in describing the present patch generation technique, the following labeling scheme is used. For the profile, P:

$m_L$, $m_R$: the left and right hand markers, respectively, of the profile, P;

$h_L$, $h_R$: the left and right hand profile handles, respectively, of the profile, P;

$s_L$, $s_R$: the left and right hand isocline handles, respectively, of the profile, P;

$b_L$, $b_R$: the left and right hand ribbon tangents at the respective left and right end points of isocline boundary R (these ribbon tangents also being denoted as "boundary handles").

Using the notation of FIG. 37, surfaces $S_L$ and $S_R$ may be defined, wherein $S_L$ is bounded by the line segments corresponding to: $s_L$, $h_L$, $b_L$, and $d_L=(s_L+b_L)-h_L$, and $S_R$ is bounded by the line segments corresponding to: $s_R$, $h_R$, $b_R$, and $d_R=(s_R+b_R)-h_R$. In particular, $S_L$ and $S_R$ are known in the art as "twisted flats," and accordingly, $S_L$ is denoted as the left twisted flat, and $S_R$ is denoted as the right twisted flat. Moreover, these surfaces may be evaluated using the following formulas (5.01a) and (5.01b):

$$S_L(u,v) = (1-v, v)\begin{pmatrix} m_L & h_L \\ s_L & b_L \end{pmatrix}\begin{pmatrix} 1-u \\ u \end{pmatrix} \quad (5.01a)$$

wherein the parameters u and v increase in transverse directions as illustrated by the u-direction arrow and the v-direction arrow (FIG. 37).

$$S_R(u,v) = (1-v, v)\begin{pmatrix} h_R & m_R \\ b_R & s_R \end{pmatrix}\begin{pmatrix} 1-u \\ u \end{pmatrix} \quad (5.01b)$$

wherein the parameters u and v also increase in transverse direction, with the u-direction being the reverse direction of the u-direction arrow of FIG. 37.

Accordingly, the isocline ribbon surface S (FIG. 37) can now be defined as follows:

$$S(u,v)=B_2(u)S_L(u,v)+B_1(u)S_R(u,v) \quad (5.02)$$

where conveniently, the u parameter is also the distance measure needed for $B_1$ and $B_2$ of Formulas (3). Thus, when v=0, S(u,0) is the profile; i.e., a blend between the control handles $(h_L-m_L)$ and $(h_R-m_R)$. Additionally, note that when v=1, S(u,1) is the ribbon boundary R derived as a blend of vectors $(b_L-s_L)$ and $(b_R-s_R)$. Also note that if $b_L$ and $b_R$ are translates of $h_L$ and $h_R$, respectively, along $s_L-m_L$ and $s_R-m_R$, respectively, then R is a translation of P, and such similarities may simplify the data storage requirements of a computational system according to the present disclosure.

For a plurality of isocline ribbons $S_1, S_2, \ldots, S_N$, wherein each $S_i$ is generated by Formula (5.02), such ribbons may now be used in the more general N-sided surface form below, which is a variation of Formula (4).

$$S(s,t) = \frac{\sum_{i=1}^{N}\left(\prod_{\substack{j \neq i \\ j=1}}^{N} B_j(D_j(s,t))\right) S_i(u_i(s,t), v_i(s,t))}{\sum_{i=1}^{N}\left(\prod_{\substack{j \neq i \\ j=1}}^{N} B_j(D_j(s,t))\right)} \quad (5.03)$$

Note that $D_j(s,t)$, $u_i(s,t)$ and $v_i(s,t)$ must be defined for this formula, i.e., the distance measure and the mappings from the general N-side patch parameter space (in s and t) to the parameter space of the ribbons $S_i$ (in u and v).

For specific cases where N=2, 3, 4 and N≥5 using the blended ribbons $S_i$, notice first that Formula (5.02) for the ribbon is a special case of Formula (5.03). For example, in Formula (5.02) the denominator is 1, the distance measure is just the u-parameter, and u and v correspond exactly to s and t. The formula for a two-sided surface is similar, except that the base surfaces are ribbons derived according to Formula (5.02) (denoted herein also a "twisted ribbons"); thus, $$S(u,v)=B_2(v)S_1(u,v)+B_1(v)S_2(u,v) \quad (5.04)$$

which is similar to Formula (5.02), wherein the parameter u measures distance. It varies along the direction of the profile curve. However, in Formula (5.04), the parameter v measures distance.

Figure 38:
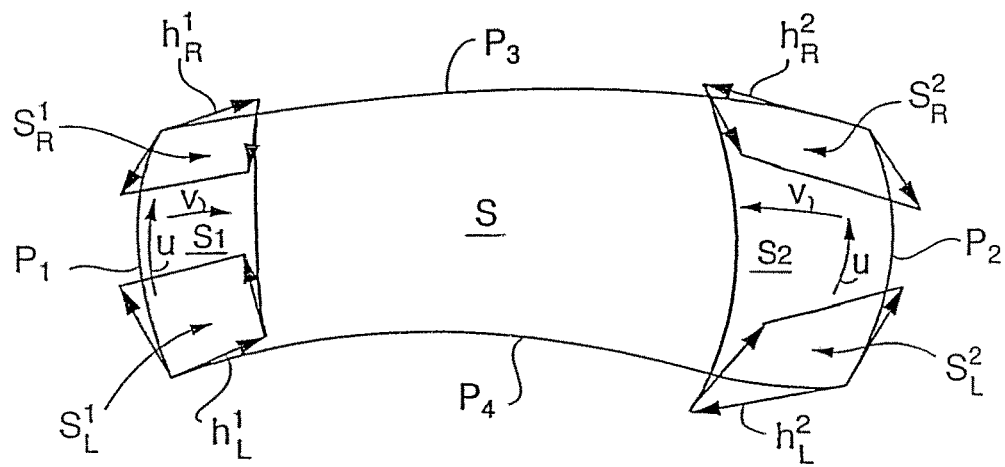
FIG. 38 illustrates one embodiment of the present disclosure for generating a four-sided patch.

Referring to FIG. 38, wherein the isocline ribbons $S_1$ and $S_2$ are parameterized as indicated by the u and v direction arrows on each of these ribbons, these ribbons may be used to generate a four-sided patch. The two profiles $P_1$ and $P_2$ that vary in u are blended using the twisted ribbons $S_1$ and $S_2$. The other two sides $P_3$ and $P_4$ are blended profiles derived from the isocline handles; that is, $P_3$ is a blend (e.g., using Formula (1)) of $h_R^1$ and $h_L^1$, wherein $h_R^1$ is $S_1$ and $h_L^1$ is $S_2$ in Formula (1), and similarly, $P_4$ is a blend of $h_R^2$ and $h_L^2$.

Note that the blended surface, S, of FIG. 38 has tensor product form. This can be shown by decomposing Formula (5.04) into a tensor form, wherein each of the ribbons $S_1$ and $S_2$ is derived from the Formula (5.01a) and (5.01b). That is, $S_1$ is a blend of $S_L^1$ and $S_R^1$ (FIG. 38) and $S_2$ is a blend of $S_R^1$ and $S_R^2$.

Accordingly, the decomposition is as follows:

$$\begin{aligned}
S(u,v) &= (B_2(v)B_1(v))\begin{pmatrix} S_1(u,v) \\ S_2(u,v) \end{pmatrix} \quad (5.05) \\
&= (B_2(v)B_1(v))\begin{pmatrix} S_L^1(u,v) & S_R^1(u,v) \\ S_L^2(u,v) & S_R^2(u,v) \end{pmatrix}\begin{pmatrix} B_2u \\ B_1(u) \end{pmatrix} \\
&= \left(B_2(v)S_L^1 + B_1(v)S_L^2 B_2(v)S_R^1 + B_1(v)S_R^2\right)\begin{pmatrix} B_2u \\ B_1(u) \end{pmatrix}
\end{aligned}$$

Figure 39:
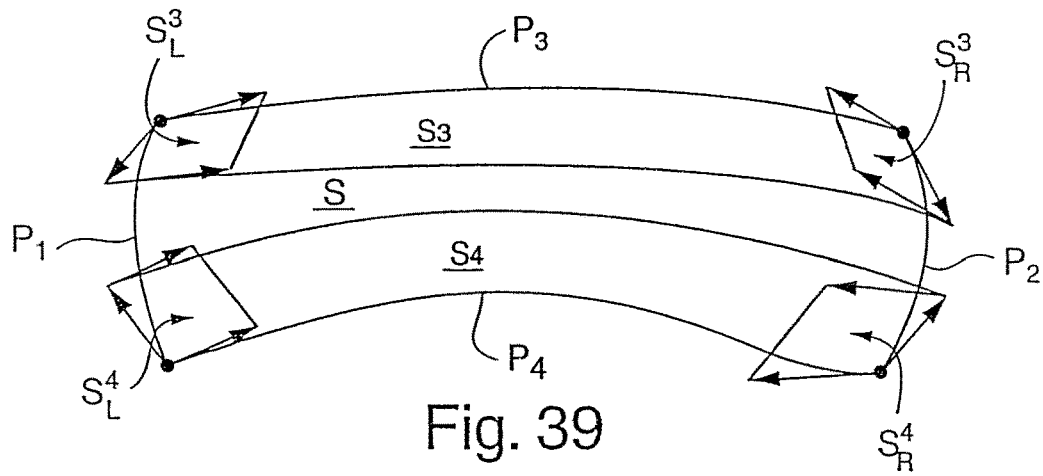
FIG. 39 illustrates an alternative embodiment of the present disclosure for generating the four-sided patch also generated in FIG. 38.
Figure 40:
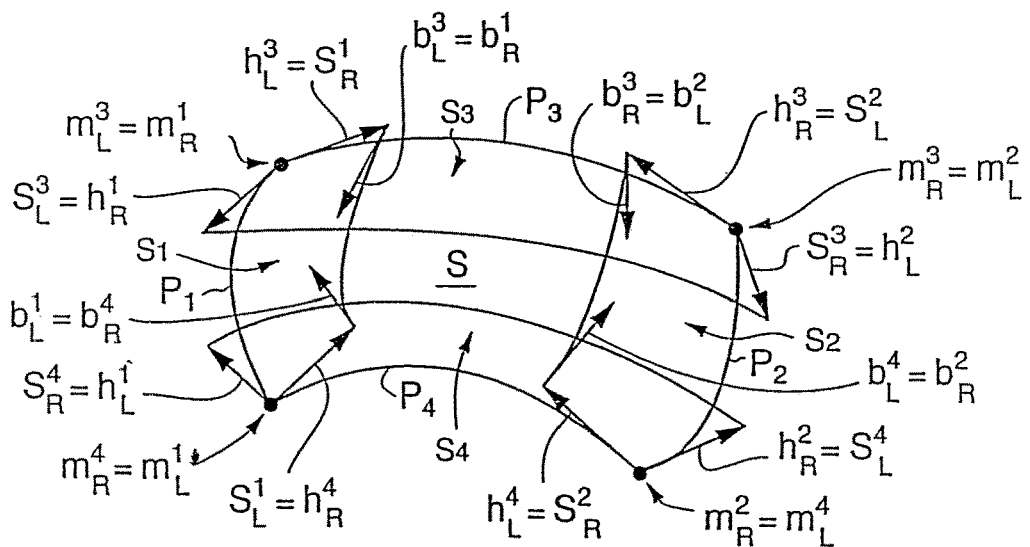
FIG. 40 shows the notational correspondences between the geometric objects of FIG. 38 and those of FIG. 39.

Thus, the last expression above shows that the same surface S can be generated by first creating the twisted ribbons in the v parameterization, and then second, blending in u. However, since the roles of u and v are symmetric, the twisted ribbons may be generated along the u parameterization and subsequently, the blending may be performed in v. That is, using the surfaces $S_L^3$ and $S_R^3$, $S_L^4$ and $S_R^4$ of FIG. 39 gives the same surface S as in FIG. 38. Thus, in either technique for deriving S, the inputs are the same; that is, $m_L^i$, $m_R^i$, $h_L^i$, $h_R^i$, $s_L^i$, $s_R^i$, $b_L^i$, and $b_R^i$, where "i" denotes the profile $P_i$ (i=1, 2, 3, 4) to which the inputs apply. Note that the correspondences between the various inputs is shown in FIG. 40.

So, overall, the two-sided patch of Formula (5.04) provides a very versatile four-sided patch. Moreover, its evaluation is also efficient. Thus, by expanding the $S_L^i$ and $S_R^i$ of Formula (5.05) using Formulas (5.01a) and (5.01b), the following expression may be obtained:

$$(B_2(v), B_1(v))\left[(1-v, v)\left(\begin{pmatrix}1\\L\\2\\L\end{pmatrix}\begin{pmatrix}1\\R\\2\\R\end{pmatrix}\right)\right]\begin{pmatrix}1-u\\u\end{pmatrix}\begin{pmatrix}B_2(u)\\B_1(u)\end{pmatrix} \quad (5.06)$$

where $$\begin{pmatrix}i\\L\end{pmatrix} \text{ and } \begin{pmatrix}i\\R\end{pmatrix}$$

are the appropriate matrices from Formulas (5.01a) and (5.01b). Note that when evaluating an instantiation of this expression, the $B_i$ should probably be table driven.

Figure 41:
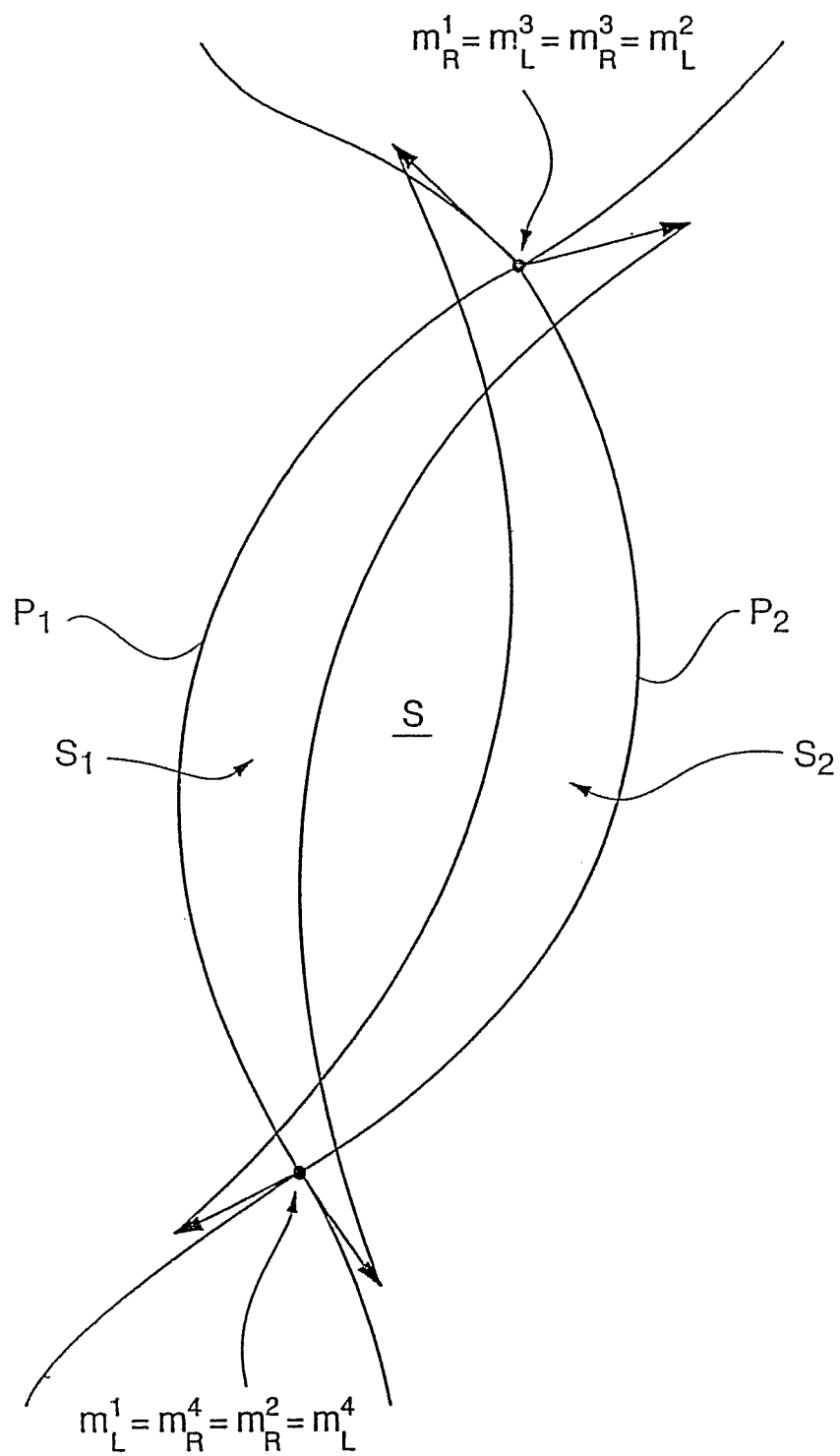
FIG. 41 shows a possible geometric configuration of FIG. 38, wherein the profiles $P_3$ and $P_4$ of FIG. 38 are degenerate.

The above formulation is mathematically sound, but to use it in a geometrically intuitive fashion still requires judgment on the user's part. Thus, in certain degenerate cases, some mathematical aids are also in order. A common instance is where two of the profiles (e.g., $P_1$ and $P_2$) intersect each other, as in FIG. 41. This is a degenerate case since profiles $P_3$ and $P_4$ (of FIG. 38) are zero length, and share end markers (i.e., $m_L^3 = m_L^4$ and $m_R^4 = m_L^4$).

Note, however, that Formula (5.04) still defines a surface S, but it is easy to see that the surface may loop at the profile intersections. To eliminate this looping and still maintain handle-like control at the markers, the twisted ribbon of Formula (5.04) may be sealed by a function of u. One function that is 1 at u=½ and 0 at u=0, is:

$$\alpha(u) = 1 - 4(u - \tfrac{1}{2})^2 \quad (5.07),$$

Thus, Formula (5.01) is adjusted to be:

$$S(u,v) = B_2(v)\alpha(u)S_1(u,v) + B_1(v)\alpha(u)S_2(u,v) \quad (5.08)$$

Such a function (5.08) will likely remove most loops.

The ability to diminish the ribbon at the ends suggests other applications. A scaling function such as $$\alpha_1(u) = 1 - u^2 \quad (5.09)$$

diminishes the ribbon at the u=1 end, while $$\alpha_1(u) = 1 - (u-1)^2 \quad (5.091)$$

diminishes it at the u=0 end. This is an effective way to make a triangular (three-sided) surface, as one skilled in the art will understand.

2.2.1 Bosses and Dimples from 2-Edges

Figure 24:
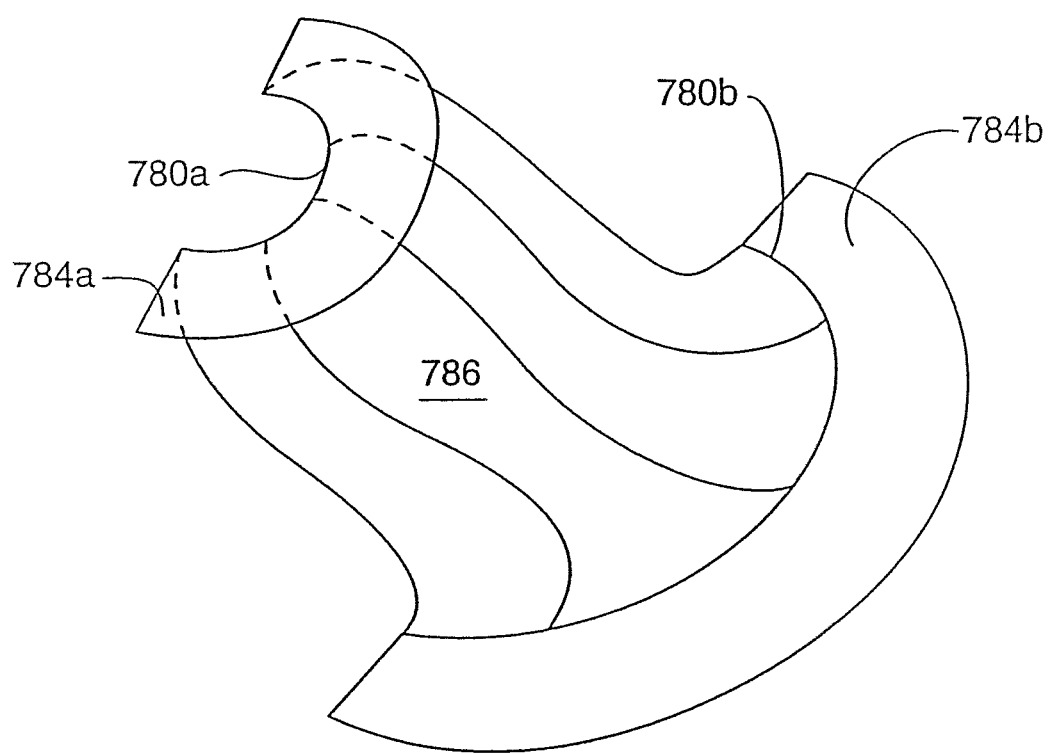
FIG. 24 illustrates the results of a blending technique of the present disclosure for blending a surface between semicircular ribbons 784a and 784b, wherein the resulting surface 786 is blended between these two ribbons.

The so-called "boss" feature may be obtained from a blending between two profile edges. The profiles may be provided as, for example, semicircles 780a and 780b of FIG. 24 having isocline ribbons 784a and 784b, respectively. The ribbons 784a and 784b are in distinct parallel planes. When these ribbons are blended together, a surface 786 (FIG. 24) is obtained which may be considered a boss or a dimple. Note that many variations, i.e., domes, rocket tips, mesas, apple tops, etc. may be generated similarly. Moreover, if the top semicircular ribbon is rotated, the boss can be made to twist. This scheme can be used to transition between tubes, like a joint, as one skilled in the art will understand.

Note that in another embodiment, blending may be performed by using a neighborhood about each boundary curve (in object space) as a default isocline ribbon from which to blend using Formula (1) or Formula (4). Thus, by defining a value $\in$ >0, and taking a strip and width of each surface along the boundary to which the surface is to be blended, these strips may be used as isocline ribbons. Accordingly, the surface boundaries become profile curves and pre-images thereof may be used in the Formula (1) or Formula (4).

2.3. Profile Curves

Figure 7:
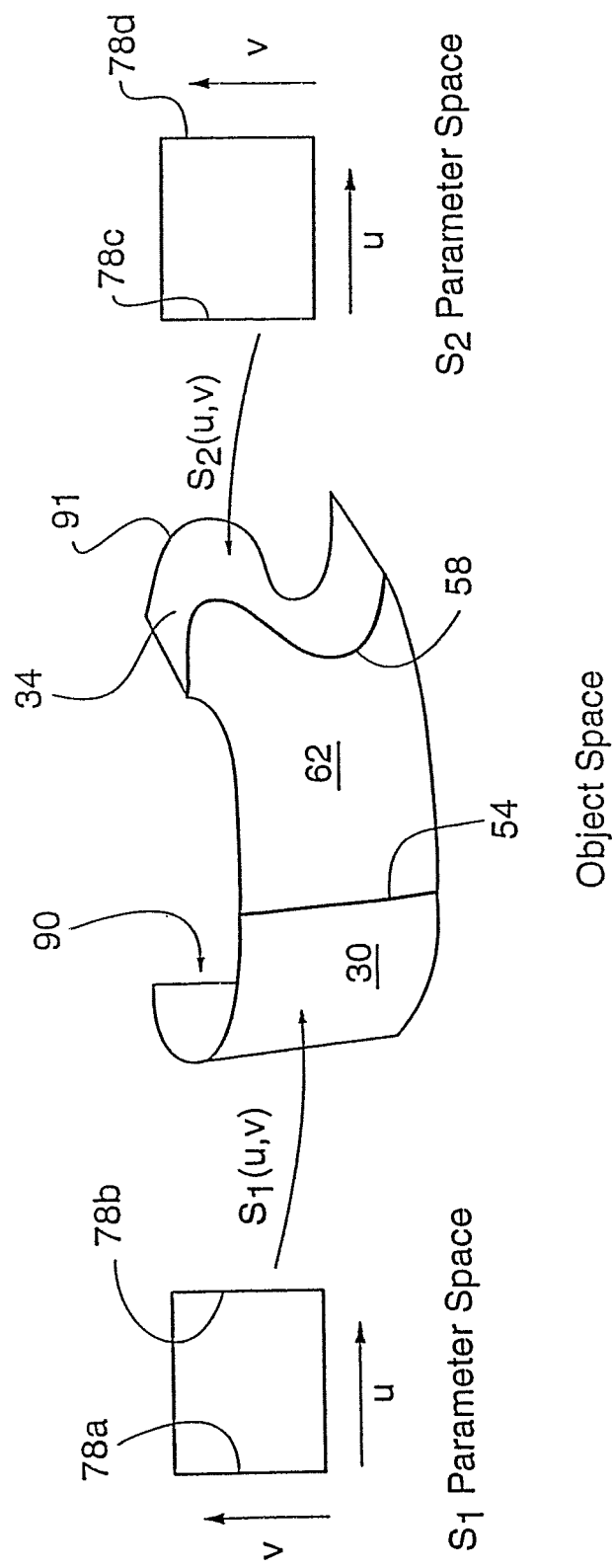
FIG. 7 provides a further illustration of the correspondences between geometric entities in parameter space and object space.

Since a computational system according to the present disclosure can take a few well-positioned (object space) profile curves of various types and generate a corresponding surface therethrough, as a blended surface according to Formula (1) above, there are two parameter space pre-image curves for each of the surfaces $S_1$ and $S_2$ wherein these curves are boundaries for the blending functions $B_1$ and $B_2$; that is, a curve at $D_i=0$ and at $D_i=1$ for each blending function $B_i$. In fact, there may be eight curves, as illustrated in FIG. 7, that may be used to define a blended surface. That is, there may be two curves 78a and 78b in the parameter space of S, and two additional curves 78c and 78d in the parameter space for $S_2$ (of course, in many cases these two parameter spaces are identified). Additionally, there are the mappings of the curves 78 to the two surfaces 30 and 34, thereby providing the corresponding image curves 90, 54, 58 and 91, these having respective pre-images 78a, 78b, 78c and 78d.

Note that in the case where $S_1$ and $S_2$ have identical parameter spaces, profile 78b is the pre-image of the profile 54. Moreover, if $S_2$ of 78d (=78b) is profile 58, then 78b is included in the pre-image of each of $S_1$, $S_2$ and blended surface 62.

When the present disclosure is used for surface design, a user or designer may think of designing a blended surface by continuously pulling or deforming one profile curve of an initial surface to thereby create a new surface between this initial surface and a profile curve of another initial surface.

Note that different types of profile or boundary curves may be used with a computational system according to the present disclosure. In some embodiments of a computational system according to the present disclosure, such a profile curve, C, may typically have a parametric pre-image in a parameter space, i.e. $C^{-1}(s) = (u(s), v(s))$ where s is a parameterization of the pre-image (e.g., $0 \leq s \leq 1$). Note that parametric curves such as C include curves having the following forms: (a) conics including lines, parabolas, circles and ellipses; Bezier, Hermite and non-uniform rational b-splines (NURBS); (b) trigonometric and exponential forms; and (c) degenerate forms like points. Additionally, note that these curve forms may be categorized orthogonally by other characteristics such as open, closed, degenerate and composite, as one skilled in the art will understand.

Profile curves include curves from the following curve-type categories (2.3.1) through (2.3.5).

2.3.1. Open Curves

An "open curve" is one in which the end points of the curve are not constrained to be coincident; e.g., the end points may be freely positioned. Open curves are probably the most common type used by a computational system according to the present disclosure when defining an arbitrary collection of curves (profiles) for generating a surface (in object space), wherein the surface is constrained to pass through the collection of curves.

2.3.2. Closed Curves

Figure 8:
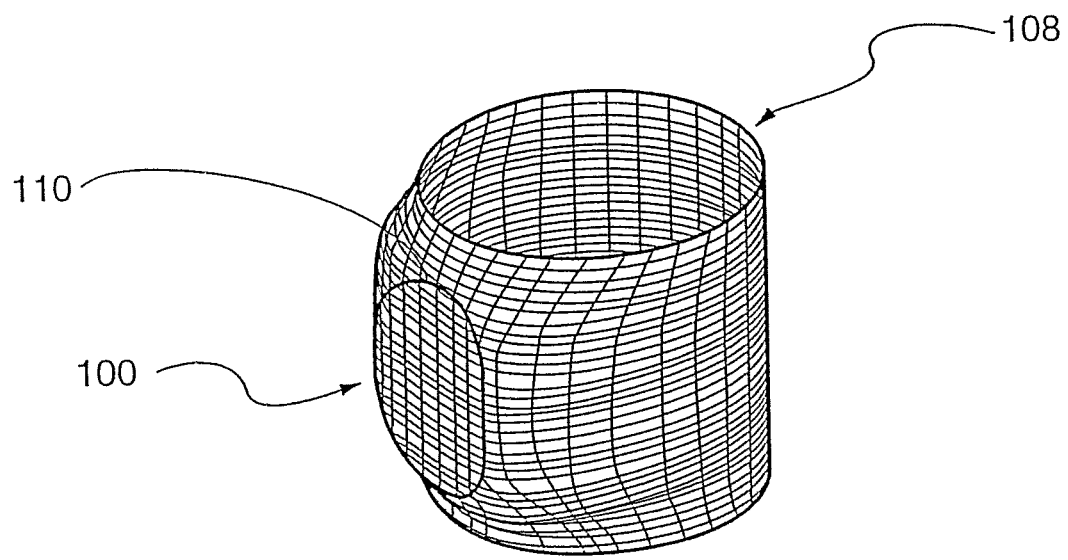
FIG. 8 shows an elliptic region 100 that is blended into a cylinder 108 according to the present disclosure, wherein the closed curve 110 delimits the elliptic region from the deformed portion of the cylinder 108 that blends to the closed curve.

When a curve's end points match, the curve is denoted as "closed." This means that the beginning point of the curve is the same as the ending point of the curve. Closed curves delimit regions of, e.g., a surface, and are especially useful for setting special design areas apart. One example of this is the label surface for containers (described in the Definitions Section hereinabove); e.g., surface 66 of FIG. 2. That is, a label surface is a region that must be of a particular surface type, denoted a developable surface, so that a label applied thereto will not crease or tear. Each such label surface is highly constrained and is usually separated from the rest of the design by a closed curve (such a curve can also serve aesthetic purposes in the design of the container). FIG. 8 shows an elliptic region 100 blended into a cylinder 108, wherein the closed curve 110 delimits the elliptic region. A closed curve may often match tangencies at end points.

2.3.3. Degenerates

Figure 9:
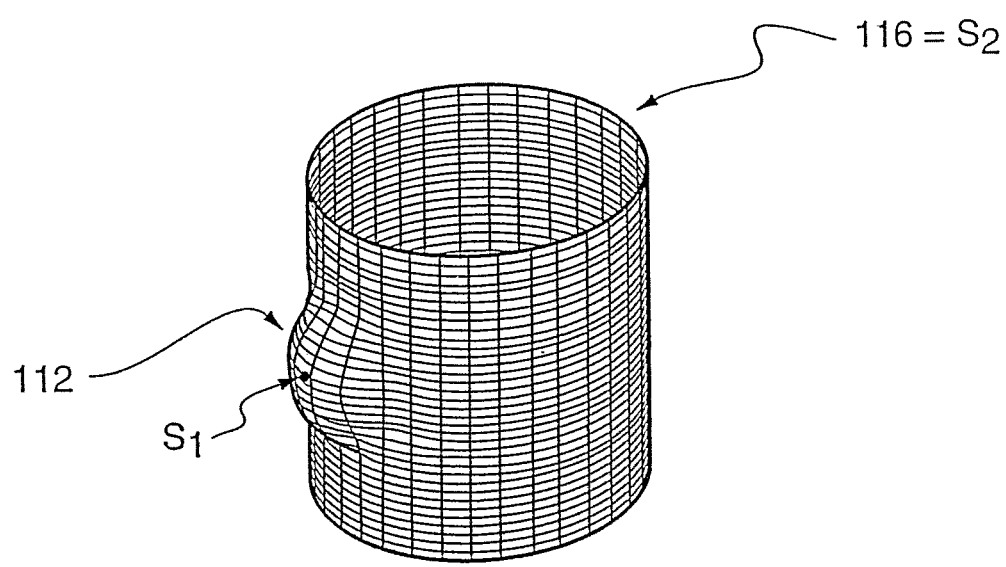
FIG. 9 shows a simple boss 112 created on a cylinder 116 according to the method of the present disclosure.
Figure 22:
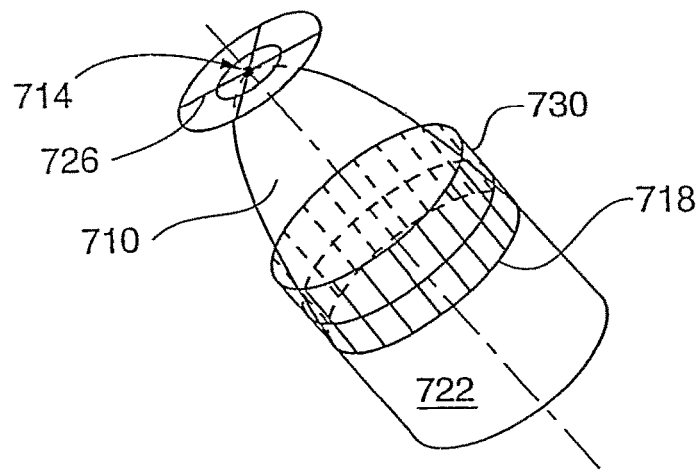
FIG. 22 shows a blended surface 710 according to the present disclosure, wherein the blended surface extends between a degenerate profile (point) 714 and the circular end 718 of a cylinder 722.
Figure 23:
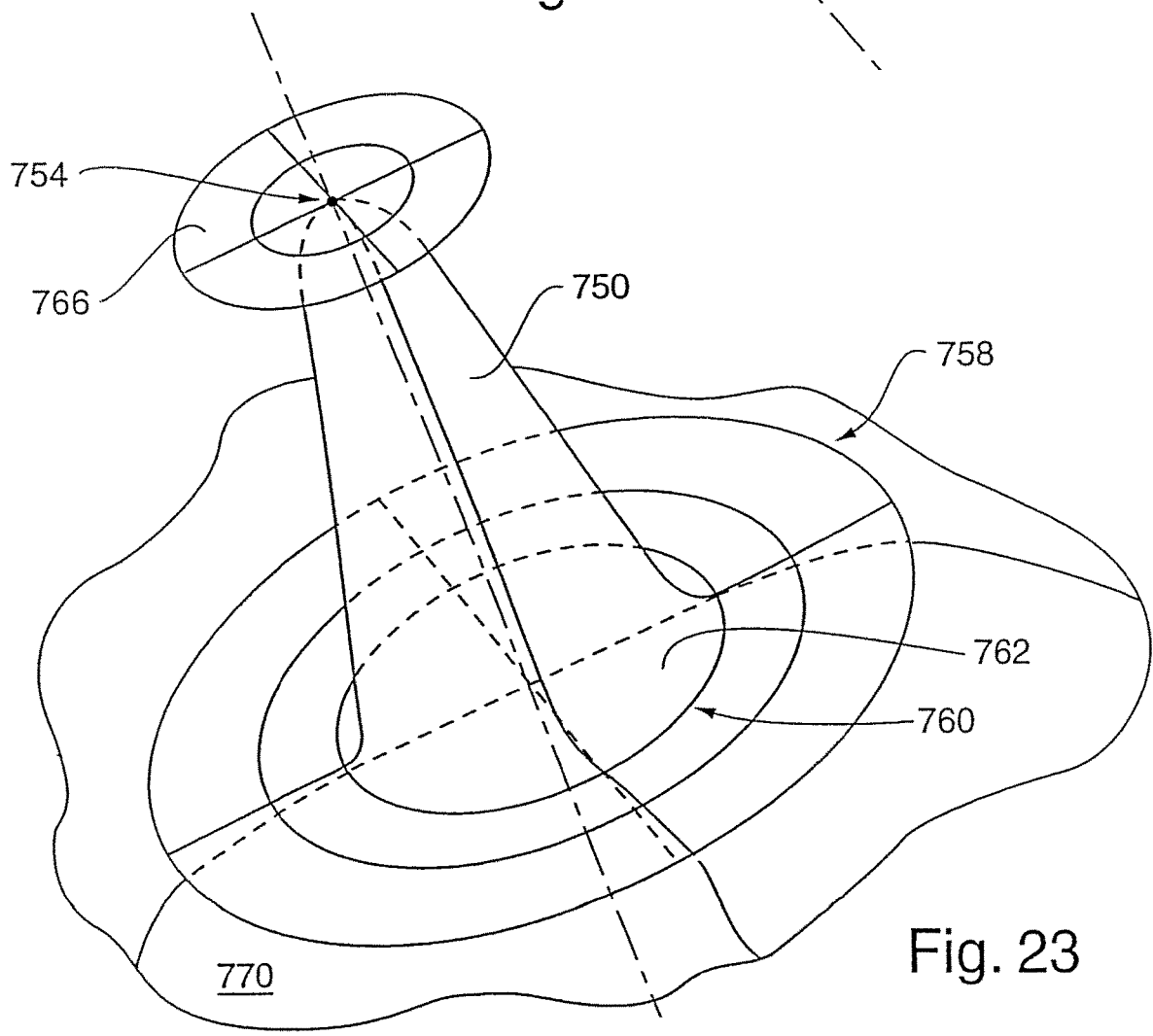
FIG. 23 shows a blended surface 750 according to the present disclosure that extends between the degenerate profile (point) 754 and the planar disk 758 having a circular curve 760 therein.

Several ways exist to generate a degenerate profile. In one technique, an open curve may be of zero length, or a closed curve may enclose a region of no area. In such cases, the result is a point that may blend with an adjacent surface. FIG. 9 shows a point blend created from blending between a degenerate circular disk (i.e., the point labeled $S_1$) and the cylinder 116 (also denoted as $S_2$). Accordingly a simple boss 112 is created on the cylinder 116. In particular, for appropriate blending functions $B_i$, i=1, 2, a blended surface between $S_1$ and $S_2$ can be obtained using Formula (1). Moreover, since Formula (4) can be used instead of Formula (1), a surface can be generated that blends between a plurality of points (i.e., degenerate profiles) and an adjacent surface. FIGS. 22 and 23 show additional blends to degenerate profiles.

FIG. 22 shows a blended surface 710 that extends between the degenerate profile (point) 714, and the circular end 718 of the cylinder 722. In particular, the blended surface 710 is a blending of the isocline ribbons 726 and 730, wherein the isocline ribbon 726 is a planar disk having the degenerate profile 714 as its center point, and the isocline ribbon 730 has the circular end 718 as its profile. Thus, letting $S_1$ be the isocline ribbon 726, and $S_2$ be the isocline ribbon 730 in Formula (1), the distance-like measurements (in their corresponding parameter spaces) can be equated to:
(a) the radial distance from the degenerate profile 714 on the isocline ribbon 726;
(b) the distance away from the profile 718 on the isocline ribbon 730.

FIG. 23 shows another blended surface 750 that extends between the degenerate profile (point) 754, and the planar annulus 758 having a circular curve 760 therein (and having, optionally, a central hole 762 therethrough with curve 760 as its boundary). In particular, the blended surface 750 is a blending of the isocline ribbon 766 (for the degenerate profile 754), and the annulus 758 (which, e.g., can optionally be an isocline ribbon to the surface 770 wherein curve 760 is a profile). Thus, letting $S_1$ be the isocline ribbon 766 and $S_2$ be the annulus 758, the distance-like measurements (in their corresponding parameter spaces) can be equated to:
(a) the radial distance from the degenerate profile 754 on the isocline ribbon 766;
(b) the distance away from the curve 760 on the annulus 758.

2.3.4. Composite Curves

Figure 10:
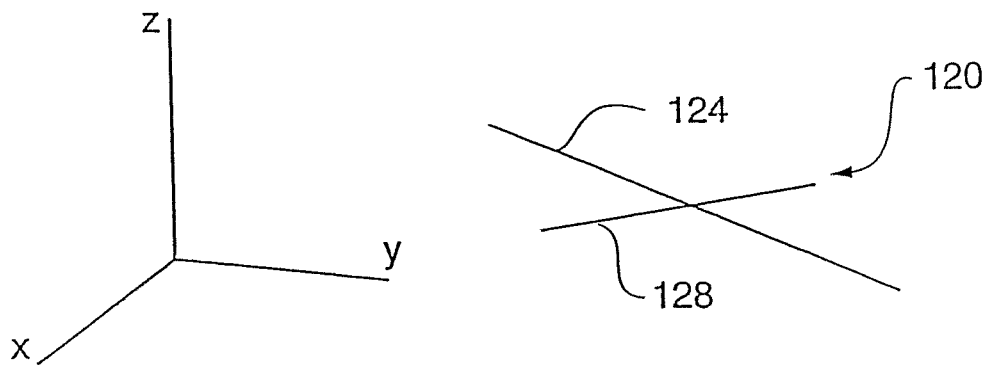
FIG. 10 shows a composite curve 120 (as defined hereinbelow) that includes two crossing subcurves 124 and 128.

The novel geometric design techniques of the present disclosure can also be utilized with composite curves. Composite curves are general curve forms that include other curves as sub-curves, wherein the sub-curves may cross or may kink, e.g., at endpoints. In utilizing composite curves as, e.g., profiles, the definition of a distance-like measurement for a composite curve is important. FIG. 10 shows a composite curve 120 that includes two crossing sub-curves 124 and 128. However, such composite curves can also have their sub-curves strung end-to-end.

Assuming the sub-curves $C_j$, j=1, 2 ..., N of a composite curve C are parameterized and have a common parameter space, a distance formula (in parameter space) for determining a distance-like measurement D to the pre-images of the sub-curves $C_j$ is:

$$D(p) = D_N(P), \text{ and} \qquad (5.5)$$
$$D_k(P) = d_k(P) + D_{k-1}(P) - [d_k^2(P) + D_{k-1}^2(P)]^{\frac{1}{2}}$$

where k=2, ..., N and $D_1(p) = d_1(P)$ = a distance measurement between P and $C_1$, and D(P) = a distance measurement between P and $C_K$. Thus, D(p) can be used as the input to a blending function, B(D), for blending one or more surfaces to the composite curve, C.

2.3.5. Trimming Curve

Figure 11:
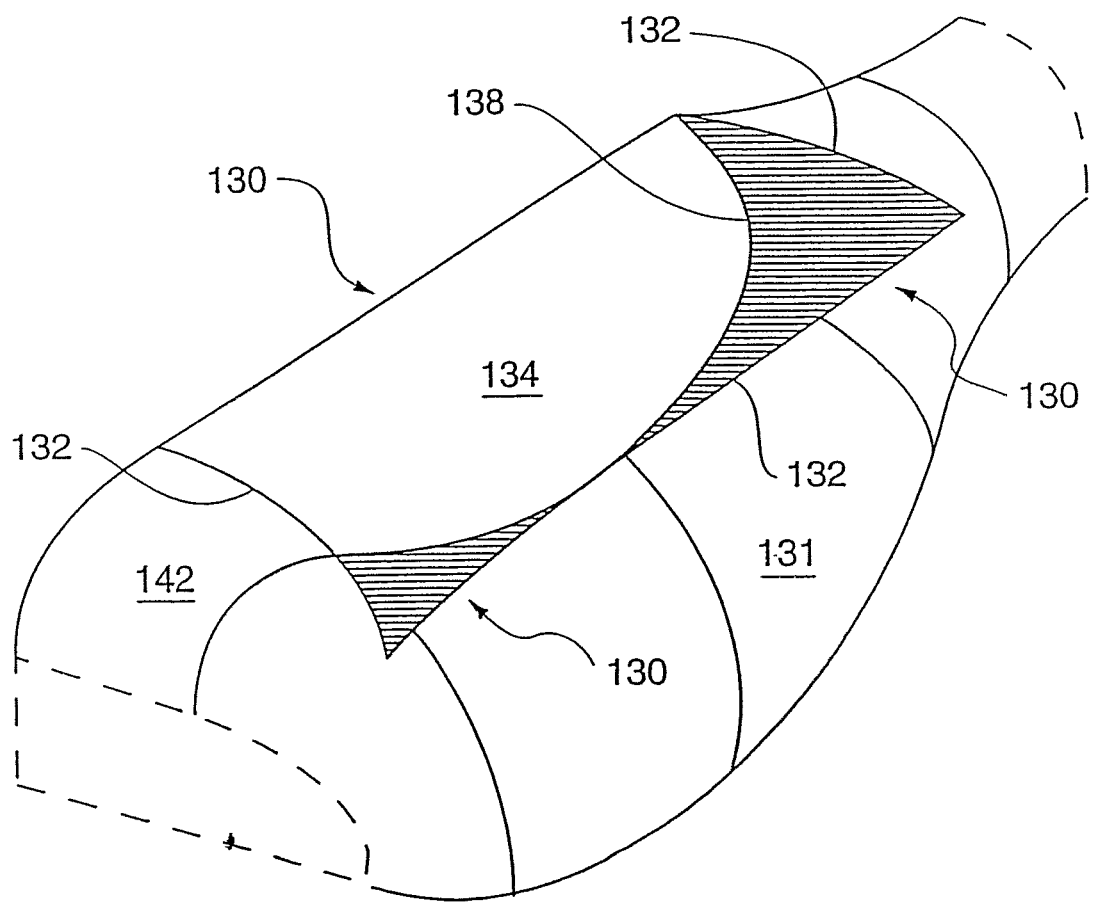
FIG. 11 shows a surface 130 from which a label surface 134 is trimmed.

A computational system according to the present disclosure allows a surface to be "trimmed," wherein trimming refers to a process for constraining or delimiting a surface to one side of a particular boundary curve (also denoted a trim curve). In particular, for parameterized surfaces, the pre-image of a trim curve, e.g., in the (u,v) parameter space of the surface, identifies the extent of the pre-image of the surface to remain after a trimming operation. A trim curve may be a profile curve, and the desired trimmed surface is that part of the original untrimmed surface that typically lies on only one side of the trim curve. An example is shown in FIG. 11, wherein the original untrimmed surface is the generally rectangular portion 130. The rounded surface 134 is a "label" surface that is trimmed to the curve 138 from the original surface 130. Note the trim profile 138 may have an associated isocline ribbon (not shown) for one or more adjacent surfaces (e.g., surface 142) that heel to an isocline ribbon at the trimming profile 138. The use of isoclines for modifying the shape of such adjacent surfaces is an important technique in creating a smooth transition from the adjacent surfaces to a trimmed surface.

Note that a computational system according to the present disclosure may include a trimming technique to create a hole in a geometric object. By extruding a depression in a front surface of the geometric object through a back surface of the object, and then trimming the front surface to exclude the corresponding portion on the back surface, a hole can be constructed that can be used, e.g., as a handle of a container.

2.4. Distance Metrics

Some techniques for computing distance-like measurements have already been provided hereinabove. In this section, additional such techniques are described. The efficiency in computing how close a point in parameter space is to one or more particular geometric object pre-images (curves) in parameter space can substantially impact the performance of a geometric design and modeling embodiment of a computational system according to the present disclosure. In general, for computing such distance-like measurements (these being, in general, a monotonic function of the conventional Euclidean distance metric) in parameter space between points and curves, there is a trade-off between the complexity of the curve and how efficiently such measurements can be evaluated. In general, the simpler the curve, the faster such distances can be determined. As an aside, it should be noted that for a parameter space curve and its image curve (in object space), these curves need not be of the same computational type (e.g., polynomial, transcendental, open, closed, etc.). Indeed, a parameter space curve may be quite simple and still be the pre-image of a complicated surface curve in object space. For example, the parameter space curve corresponding to the Bezier curve 58 in FIG. 1 may be a straight line. By keeping the parameter space curve as simple as possible, fast distance computations are possible.

2.4.1. Parametric Distance Calculations for Blending

This section describes a variety of methods for calculating a distance-like measurement (more generally, a monotonic function of the conventional Euclidean distance metric) to a number of candidate parameter space curves, wherein the methods are listed in a roughly increasing order of computational complexity.

Assume a blended surface is to be generated between two profile curves $P_1$ and $P_2$, each having isocline ribbons, wherein each ribbon is parametric and has, e.g., the planar unit square $[0,1] \times [0,1]$ as the common parameter space for the ribbons. One distance-like function capable of being used for blending is a function that is dependent on only one or the other coordinate of points represented by the coordinate pairs (u,v) in the common parameter space. That is, assuming the profile curves $P_1$ and $P_2$ of the isocline ribbons are such that their pre-images are the vertical lines $u=k_1$ and $u=k_2$ for $0 \le k_1 \le k_2 \le 1$, then the corresponding distance-like functions can be $D_1(u,v)=(u-k_2)/(k_1-k_2)$ and $D_2(u,v)=(u-k_1)/(k_2-k_1)$. Moreover, if the pre-images are the parameter space bounding vertical lines u=0 and u=1 (i.e., $k_1$=0 and $k_2$=1), then the corresponding distance-like function can be $D_1(u,v)=1-u$ and $D_2(u,v)=u$, and accordingly such simple distance-like functions can be computed very efficiently.

In order to maintain the desired simplicity in parametric distance computations when there are pre-images to more than two profiles for blending therebetween, three methods can be employed for computing parametric distance-like measurements. Each of the three methods is now described.

A triangular domain in parameter space bounded by, e.g., three profile curve pre-images (that are also curves) can be parameterized with respect to the vertices $v_1$, $v_2$ and $v_3$ of the triangular domain using three (real valued) parameters r, s and t with the additional constraint that r+s+t=1. In other words, a point p in the triangular domain having the vertices $v_1$, $v_2$ and $v_3$ can be represented as $p=r*v_1+s*v_2+t*v_3$. The r, s, t parameters are called "barycentric coordinates" and are used for three-sided surfaces such as the surface 300 of FIG. 14 in parameter space.

Domains in parameter space that are bounded by the pre-images of four profiles (denoted the four-sided case) can be a simple extension of the domain having bounds on two opposing sides (denoted the two-sided case). In the two-sided case, if parameterized properly, only one parameter, u, need be used in the distance-like function computation. In the four-sided case, both parameters u and v may be employed, as well as their complements (assuming an appropriate representation such as the unit square in parameter space). Thus the distance to the four profile pre-image boundaries in parameter space can be u, v, 1−u, and 1−v (i.e., assuming the pre-images of the profiles are u=0, v=0, v=1, u=1).

Figure 12:
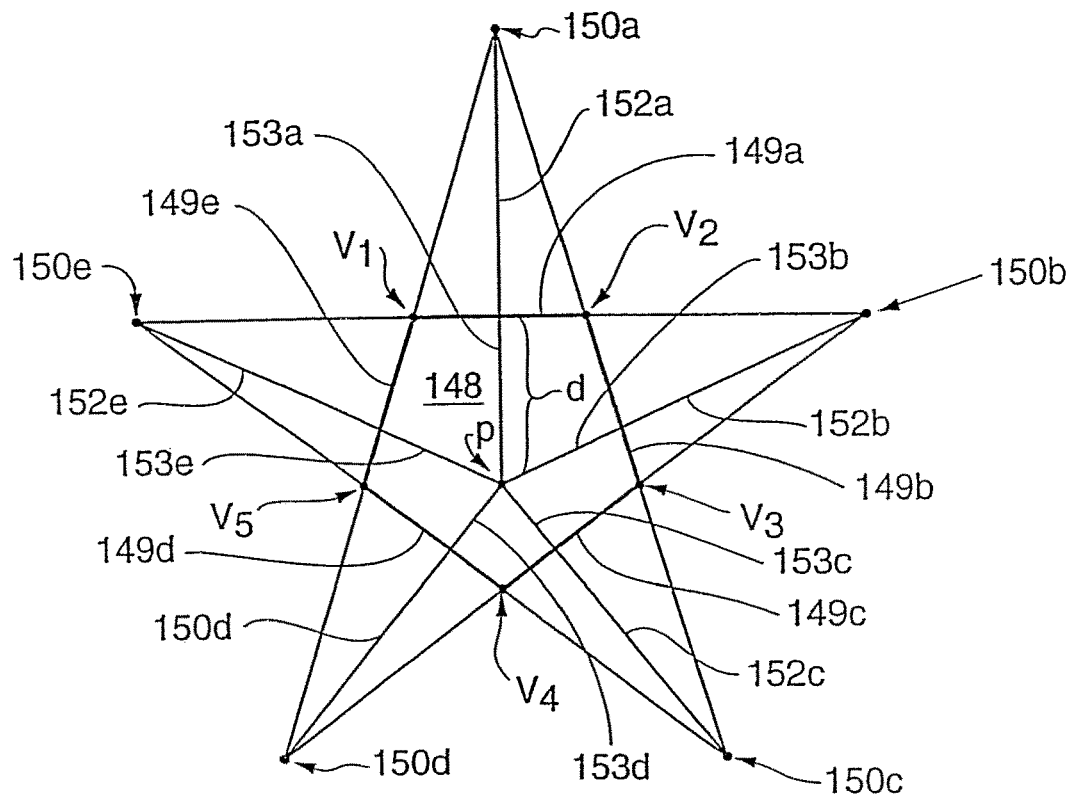
FIG. 12 illustrates one computational technique for determining a distance-like measurement from a point p that is interior to the polygon having vertices $v_1$, $v_2$, $v_3$, $v_4$, and $v_5$, wherein the distance-like measurement to each side of this polygon is determined using a corresponding apex 150 provided by a stellating process.

To determine barycentric coordinates for parametric space domains, assuming the pre-images of the profiles are line segments that form a polygon, the approach illustrated in FIG. 12 (illustrated for a five-sided polygon 148 having vertices $v_1$, $v_2$, $v_3$, $v_4$ and $v_5$) may be utilized, wherein the profile pre-images are the heavy lines labeled 149a through 149e. To determine a distance-like function, first, stellate, i.e., make a star from, the pre-image polygon 148 by extending each of the sides 149a through 149e of the polygon until they intersect with another extended side having a side 149 therebetween. Thus, the intersection points 150a through 150e are determined in the five-sided case of FIG. 12. Subsequently, the line segments 152a through 152e from the corresponding points 150a through 150e to a point p in the polygon may be constructed. The resulting distance-like measurements are the lengths of the line segments 153a through 153e from p to the sides 149a through 149e of the polygon 148. Accordingly, the distance from p to the $i^{th}$ side 149 (i=a, b, c, d, e) of the polygon 148 is the distance along the $i^{th}$ line segment 153 from p to the boundary edge of the polygon 148. Note that by dividing each resulting distance-like measurement by the sum of all the distance-like measurements to the point p, the distance-like measurements can be normalized.

2.4.2. Straight Line

A straight line is represented by the equation, au+bv=c, wherein a, b, c are constants. A convenient (unsigned) distance to a line is obtained by $$D(u,v)=|(a,b) \cdot ((u,v)-c|. \quad (6)$$

For a more intuitive version that corresponds to Euclidean distance, Formula (6) can be normalized to obtain $$D(u,v)=|(a,b) \cdot ((u,v)-c|/(a^2+b^2), \quad (7)$$

by dividing by the length of the gradient.

2.4.3. Conics

Conics include parabolas, hyperbolas and ellipses. The general form of a conic is $$Au^2+Buv+Cu^2+Du+Ev+F=0.$$

Its unsigned distance can be computed by $$D(u,v) = \left| (u,v) \cdot \begin{bmatrix} A & \frac{B}{2} \\ \frac{B}{2} & C \end{bmatrix} \cdot \begin{pmatrix} u \\ v \end{pmatrix} + \begin{pmatrix} D \\ E \end{pmatrix} \cdot (u,v) + F \right| \quad (8)$$

This can also be normalized by dividing through by the length of the gradient of the function to make a more suitable distance-like function, which is Euclidean in the case of the circle. Note that Farin in *Introduction to Curves and Surfaces*, Academic Press, 4th ed., 1996, (incorporated herein by reference) gives the conversion between the implicit form above and a rational parametric form. Thus, Formula (8) can be used regardless of whether the conic is represented implicitly or parametrically.

2.4.4. Polynomial Curves, both Parametric and Implicit

Assume that a parametric curve has been converted to a Bezier form as, for example, is described in the Farin reference cited hereinabove. Vaishnav in *Blending Parametric Objects by Implicit Techniques, Proc. ACM Solid Modeling Conf.*, May 1993 (incorporated herein by reference) gives a method to change a curve from a parametric curve to an implicit curve numerically, wherein distance is implicitly measured in object space by offsetting the curve in a given direction that is based on some heuristics about how the offset is to be computed. The value of the offset distance that forces the offset to go through the point is the distance measurement for that point. In particular, for a Bezier curve, this distance-like measurement may be worthwhile in that it is robust (i.e., not ill-conditioned) and reasonably fast to evaluate, requiring only two or three Newton-Raphson iterations on average, as one skilled in the art will understand. While this may be an order of magnitude slower than computing a distance measurement of a conic representation, it is much faster than the traditional method of computing a perpendicular distance, which is also unstable.

2.4.5. Piecewise Parametric Curves

The present disclosure also includes a novel technique for computing a distance-like measurement on complex curves in parameter space.

Figure 13:
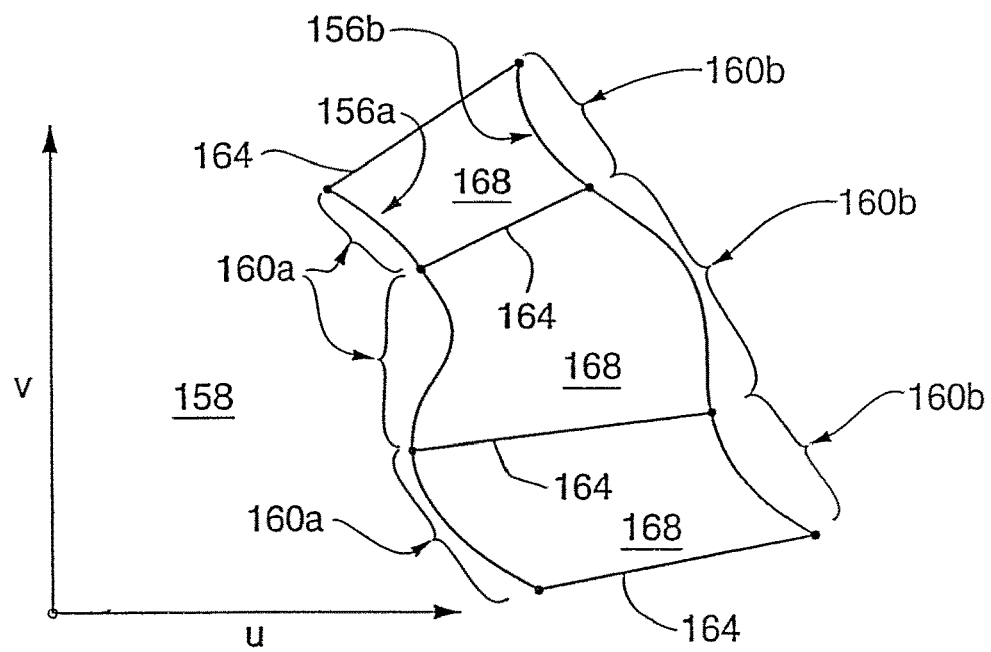
FIG. 13 shows two boundary curves 156a and 156b in parameter space (i.e., the unit square), wherein area patches 168 therebetween are capable of being themselves parameterized by coordinates (s,t) where s varies linearly with the distance between two corresponding points on a pair of opposing subcurves 160a and 160b, and t determines a corresponding point on each of the subcurves of the pair 160a and 160b.

Referring to FIG. 13, assume that both boundary curves 156a and 156b are in the unit square parametric space 158 and are piecewise parametric polynomial curves that have corresponding sub-curves 160a, 160b of the same degree n. By connecting end points of the corresponding sub-curves with line segments 164 (i.e., degree one curves), degree n by 1 Bezier patches 168 can be constructed in the unit square representation of parameter space 158. Note that each patch 168 can be considered as a second parameter space unto itself having coordinates (s,t) wherein:

(a) for two Bezier sub-curves 160a and 160b (denoted herein $b_1(t)$ and $b_2(t)$, $0 \le t \le 1$), each value, $t_0$, of t corresponds to a line segment, $L_{t_0}$, between $b_1(t_0)$ and $b_2(t_0)$, and (b) the L line segment is parameterized by s so that $L_{t_0}(s) \in b(t_0)$ when s=0 and $L_{t_0}(s) \in b_2(t_0)$ when s=1, wherein s varies proportionally with the distance between $b_1(t_0)$ and $b_2(t_0)$ when 0<s<1. Accordingly, if the distance-like measurement between the curves $b_1(t)$ and $b_2(t)$ (and/or patch bounding line segments 164) is computed in the second parameter space, then for any (u,v) point interior to the patch, it is necessary to find the corresponding (s,t) point relative to the boundary curves of such a patch that can then be evaluated for determining the distance-like measurement. Since s is the linear parameter (corresponding to the distance of a point between the two corresponding sub-curves 160a and 160b that are joined at their endpoints by the same two segments 164), simple functions $f_1(s)$ and $f_2(s)$, such as $f_1(s)=s$ and $f_2(s)=1-s$, can serve as distance functions to $b_1(t)$ and $b_2(t)$, respectively. Note that the parameters u and v can both be represented as Bezier functions of s and t. In particular, to convert from (s,t) coordinates to (u,v) parameter space coordinates, a Newton type algorithm may be used, as one skilled in the art will understand.

Figure 25:
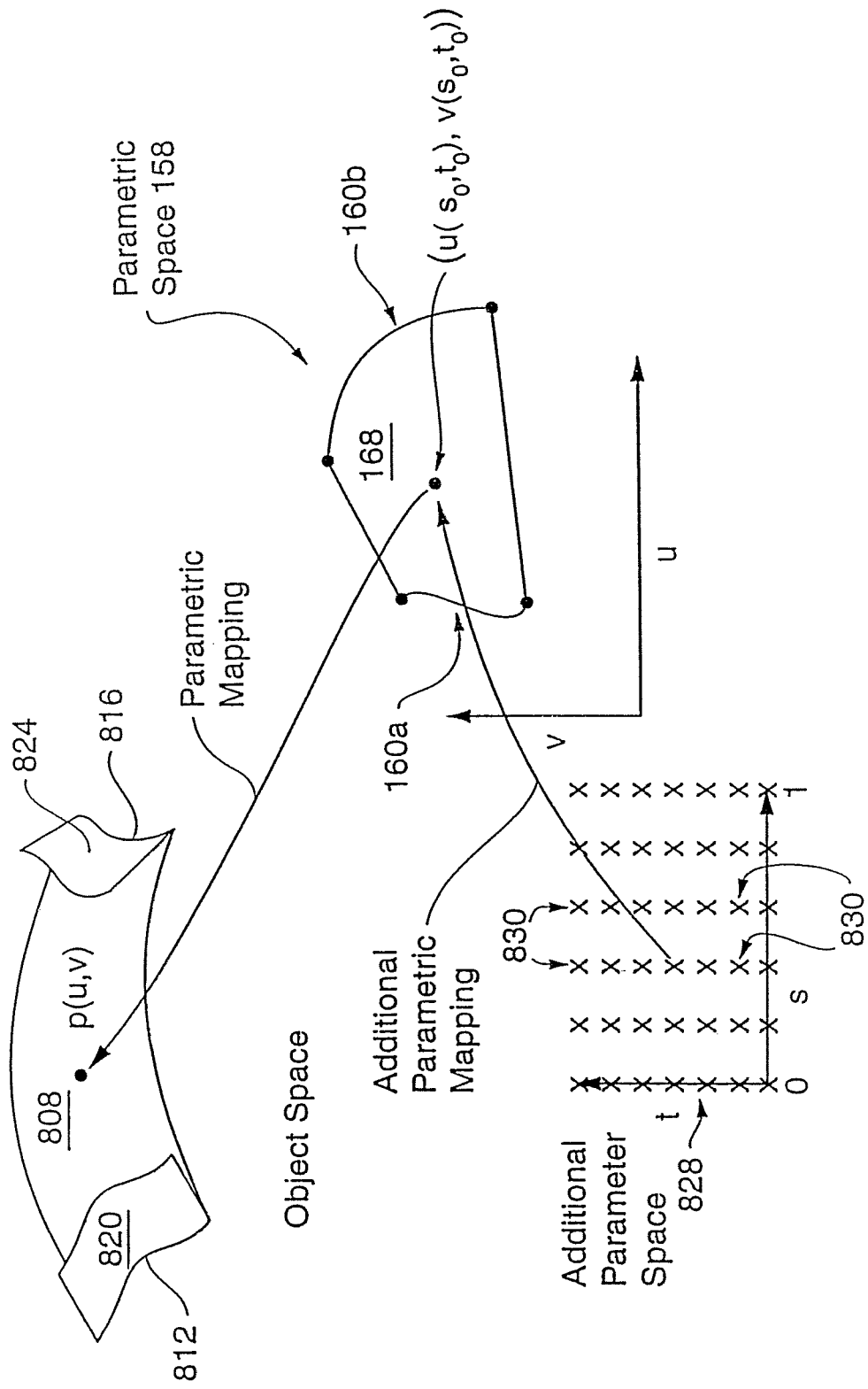
FIG. 25 shows a blended surface 808 according to the present disclosure whose points p(u,v) are determined using a "forward algorithm", wherein points in parameter space 158 are themselves parameterized according to points in an additional parameter space 828, and wherein the points 830 of the additional parameter space are used to efficiently determine the distance-like measurements to the pre-images (in parameter space 158) of the profiles 812 and 816 (in object space).

Another approach for determining the distance-like measurement, in some circumstances, is to evaluate such patches 168 with a "forward algorithm." That is, referring to FIG. 25, an object space blended surface 808 that blends between, e.g., profiles 812 and 816 (having isocline ribbons 820 and 824, respectively, to which the surface 808 heels) is shown. The profile 812 has as its pre-image curve 160a (in parameter space 158), and the profile 816 has as its pre-image curve 160b (in parameter space 158), wherein the portion of parameter space 158 for surface 808 is the patch 168. An additional parameter space 828 in s and t can be considered as a pre-image parameter space for the parameter space 158 wherein the pre-image of curve 160a is the vertical line segment at s=0, and the pre-image of curve 160b is the vertical line segment at s=1. If a sufficiently dense set of points 830 denoted by "x"s in the additional parameter space 828 is used to evaluate points (u,v) in patch 168 (e.g., by determining a closest point 830), then the corresponding points p(u,v) on a blended surface 808 can be efficiently computed since the distance-like functions to pre-image curves 160a and 160b can be $D_1(u(s,t),v(s,t))=s$ and $D_2(u(s,t),v(s,t))=1-s$, respectively. This approach will generate the blended surface easily and quickly. Note, if the surface 808 does not require a subsequent trimming operation, this method is particularly attractive.

3. Blending Programs

Figure 17:
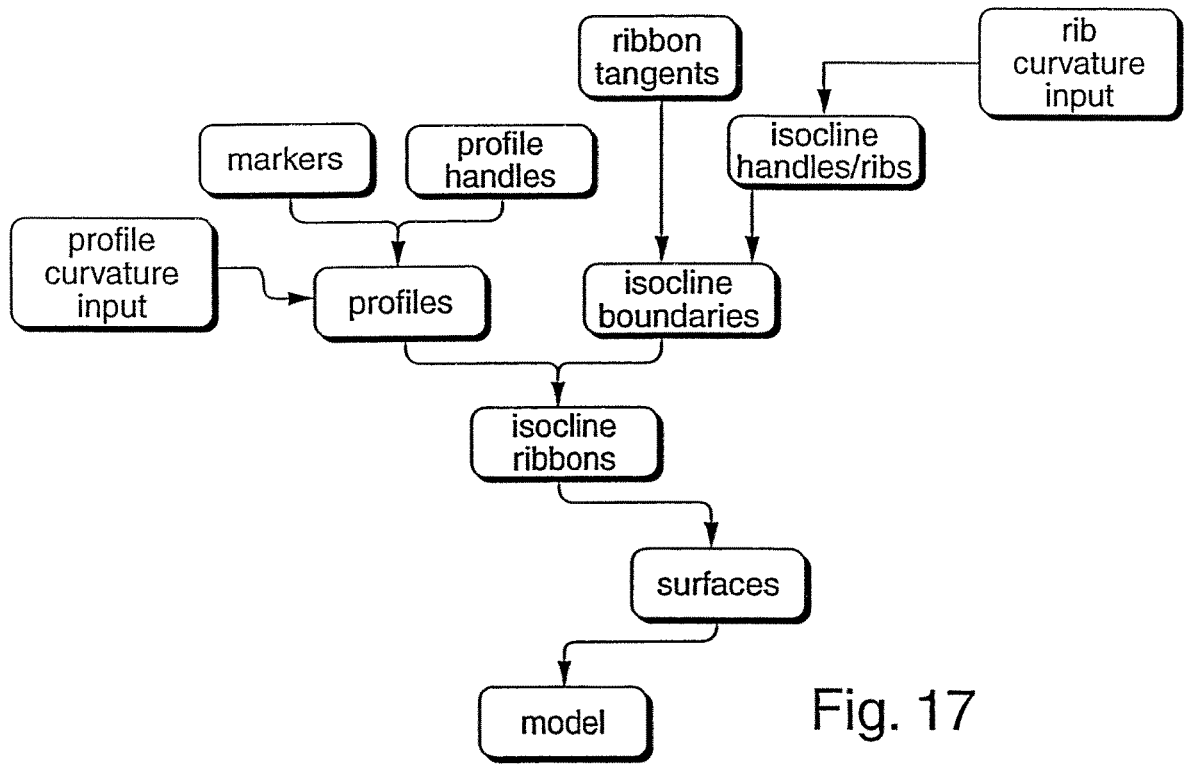
FIG. 17 shows a block diagram of the typical flow of design construction operations performed by a user of a computational system according to the present disclosure in designing a geometric object.
Figure 15:
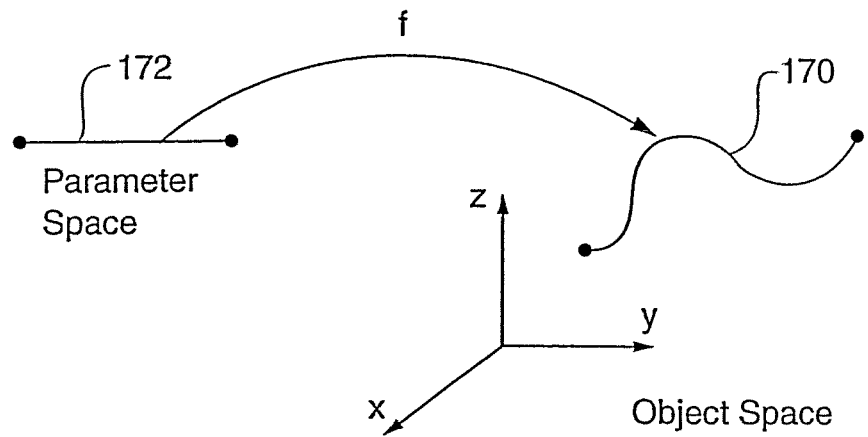
FIGS. 15 and 16 illustrate both general computational geometry concepts, as well as novel concepts that are fundamental to the present disclosure. Note that these figures are used to illustrate the terms defined in the Definitions Section hereinabove.
Figure 16:
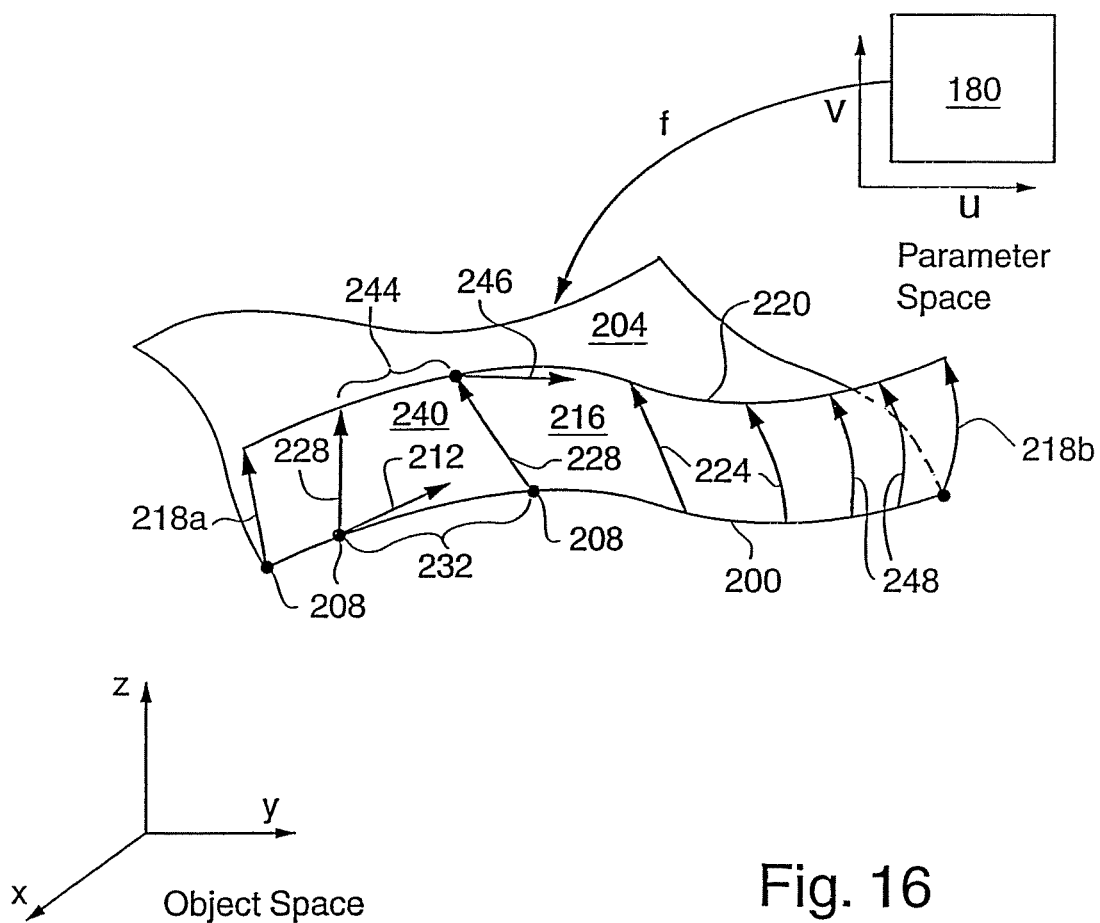

FIG. 17 shows a block diagram of the typical flow of design construction operations performed by a user of a computational system according to the present disclosure. Thus, profile handles may be needed to construct an associated profile, and the profile is required to construct the associated isocline ribbon, and the isocline ribbon may be required to obtain the desired shape of the associated object (e.g., a surface), which, in turn, is required to construct the desired geometric model.

FIGS. 26 through 30 provide a high level description of the processing performed by an embodiment of the present disclosure that enables the novel real-time manipulation of the shape of geometric object representations so that a user can more efficiently and directly express his/her design intent. Moreover, it should be noted that a fundamental tenet of the present disclosure presents a paradigm shift away from typical CAD systems. That is, in a typical CAD system the user must supply input for changing or modifying a geometric object and subsequently request processing of the input to commence. Thus, the user receives feedback about his/her design at discrete user requested times. Instead, with a computational system according to the present disclosure, updates may be processed in real-time immediately upon input without the user explicitly indicating that update processing is to be performed. Accordingly, a user of a computational system according to the present disclosure can efficiently perform iterative approximations to a geometric object being designed without requiring the user to precisely calculate geometric characteristics for substantially all portions of the object. In particular, this can have substantial efficiency benefits in that for many geometrically designed objects (including machined parts), substantial portions of such objects may be satisfactorily designed using a wide range of geometrically shaped objects. Accordingly, a computational system according to the present disclosure allows many of these geometric objects to be designed without the user having to needlessly specify precision in those portions of the object where the precision is unnecessary.

In FIG. 26, the steps are shown for computing an interpolating curve according to a computational system according to the present disclosure using a one-dimensional variation of Formula (1) discussed in Section 2 hereinabove. Accordingly, in step 1004, the end points and tangents at the end points for the interpolating curve, C(u), to be generated are obtained. In particular, the end points of this curve are assigned to the variables PT1 and PT2. Additionally, direction vectors for the interpolating curve C(u) at the points PT1 and PT2 are assigned to the variables TAN1 and TAN2, respectively. Note that PT1, PT2, TAN1 and TAN2 can be supplied in a variety of ways. For example, one or more of these variables can have values assigned by a user and/or one or more may be derived from other geometric object representations available to the user (e.g., another curve, surface or solid representation). In particular, the direction tangent vectors denoted by TAN1 and TAN2 may be determined automatically according to a parameterization of a geometric object (e.g., a surface) upon which the points PT1 and PT2 reside.

In steps 1008 and 1012, the blending functions $B_1$ and $B_2$ are selected as discussed in Section (2.1) hereinabove. Note, however, that the blending functions provided may be defaulted to a particular pair of blending functions so that a user may not need to explicitly specify them. However, it is also within the scope of the present disclosure that such blending functions may be specifically selected by the user. In this regard, note that since the present disclosure presents a computational system that is intended to express the user's geometric design intent, there may be a wide variety of blending functions that are acceptable since typically a user's intent is often adequately expressed without the user purposefully determining highly precise input. That is, it is believed that a wide variety of blending functions may be acceptable for iterative approximation of a final geometric design since progressively finer detail can be provided by generating and/or modifying progressively smaller portions of the geometric object being designed using substantially the same blending functions. Said another way, since the present disclosure supports both the entering of precise (geometric or otherwise) constraints as well as the iterative expression of the user's intent at progressively higher magnifications, the high precision and/or small scale design features may be incorporated into a user design only where necessary.

Figure 32:
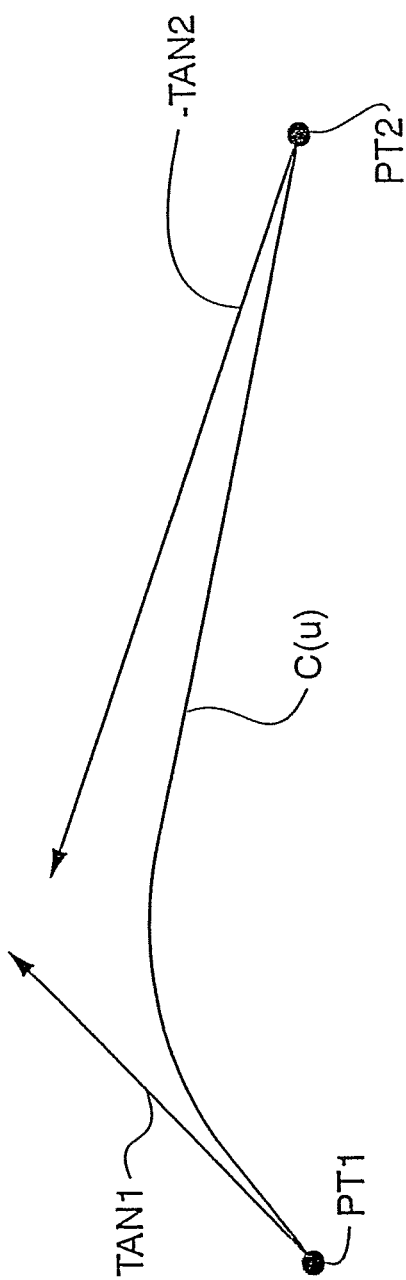
FIG. 32 pictorially illustrates examples of values for parameters used in the flowchart of FIG. 26 for computing an interpolating curve C(u).

In step 1016, the interpolating curve, C(u), is computed using a variation of Formula (2) applied to a one-dimensional parameter space. An example of an interpolating curve, C(u), with points PT1, PT2, and vectors TAN1 and TAN2 identified, is illustrated in FIG. 32.

Figure 27:
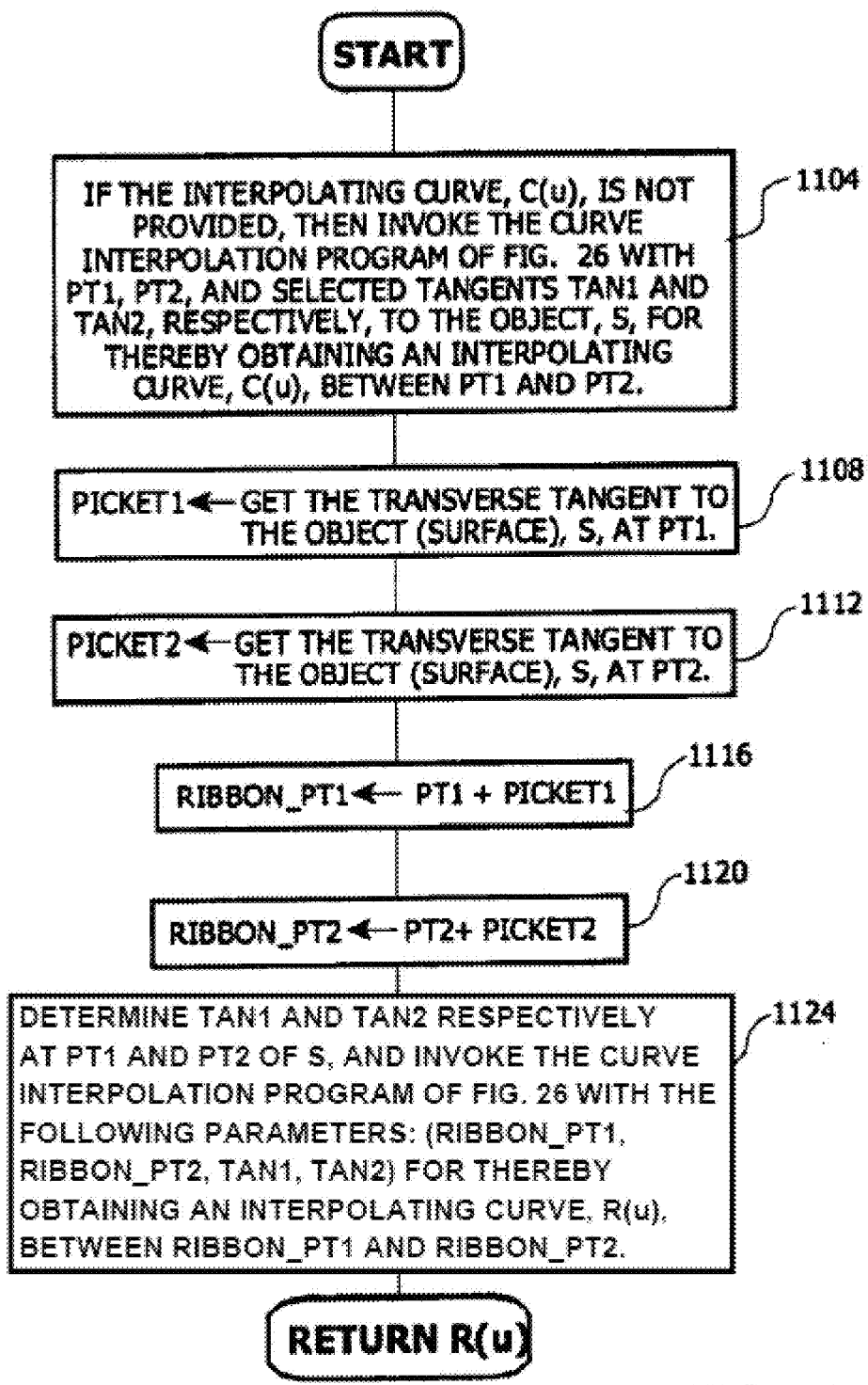
FIG. 27 shows a flowchart of the steps performed when constructing an approximation to an isocline boundary of an isocline ribbon, wherein the boundary is opposite the profile for the isocline ribbon.

In FIG. 27, a flowchart is provided showing the steps performed when constructing an approximation to an isocline boundary R(u) for an object (e.g., a surface) S, wherein the points PT1 and PT2 delimit a profile curve corresponding to the isocline ribbon boundary approximation to be generated. In particular, the approximate isocline ribbon boundary generated by this flowchart is intended to approximately satisfy the isocline ribbon boundary definition in the Definitions Section hereinabove. More precisely, the isocline ribbon boundary approximation determined by the present flowchart will tend to match the isocline ribbon boundary definition for a portion of the object S between PT1 and PT2 depending on, e.g., how smooth the object is along the profile curve generated between PT1 and PT2. That is, the smoother (reduced curvature fluctuations), the more likely the match. Accordingly, in step 1104 of FIG. 27, the curve interpolation program represented in FIG. 26 is invoked with PT1, PT2 and their respective tangents TAN1 and TAN2 for the object (surface) S. Thus, an interpolating curve, C(u), is returned that is an approximation to the contour of S adjacent to this curve.

In steps 1108 and 1112, a (traverse) tangent (i.e., a picket) along the parameterization of the object S at each of the points PT1 and PT2 is determined, and assigned to the variables PICKET1 and PICKET2, respectively. Note that typically the pickets, PICKET1 and PICKET2, will be transverse to the vectors TAN1 and TAN2, although this need not be so. Subsequently, in steps 1116 and 1120, the isocline ribbon points corresponding to PT1 and PT2 are determined and assigned to the variables, RIBBON_PT1 and RIBBON_PT2, respectively. Then, in step 1124, the curve interpolation program of FIG. 26 is again invoked with the values RIBBON_PT1, RIBBON_PT2, TAN1 and TAN2 to thereby generate the isocline ribbon boundary approximation, R(u). It is worthwhile to note that in some cases, the isocline ribbon approximation bounded by the interpolating (profile) curve C(u), the corresponding pickets (PICKET1 and PICKET2), and the newly generated isocline boundary R(u) does not necessarily form a surface. In fact, the curves, C(u) and R(u) may be substantially coincident (e.g., if PICKET1 is identical to TAN1, and PICKET2 is identical to TAN2).

Figure 28A:
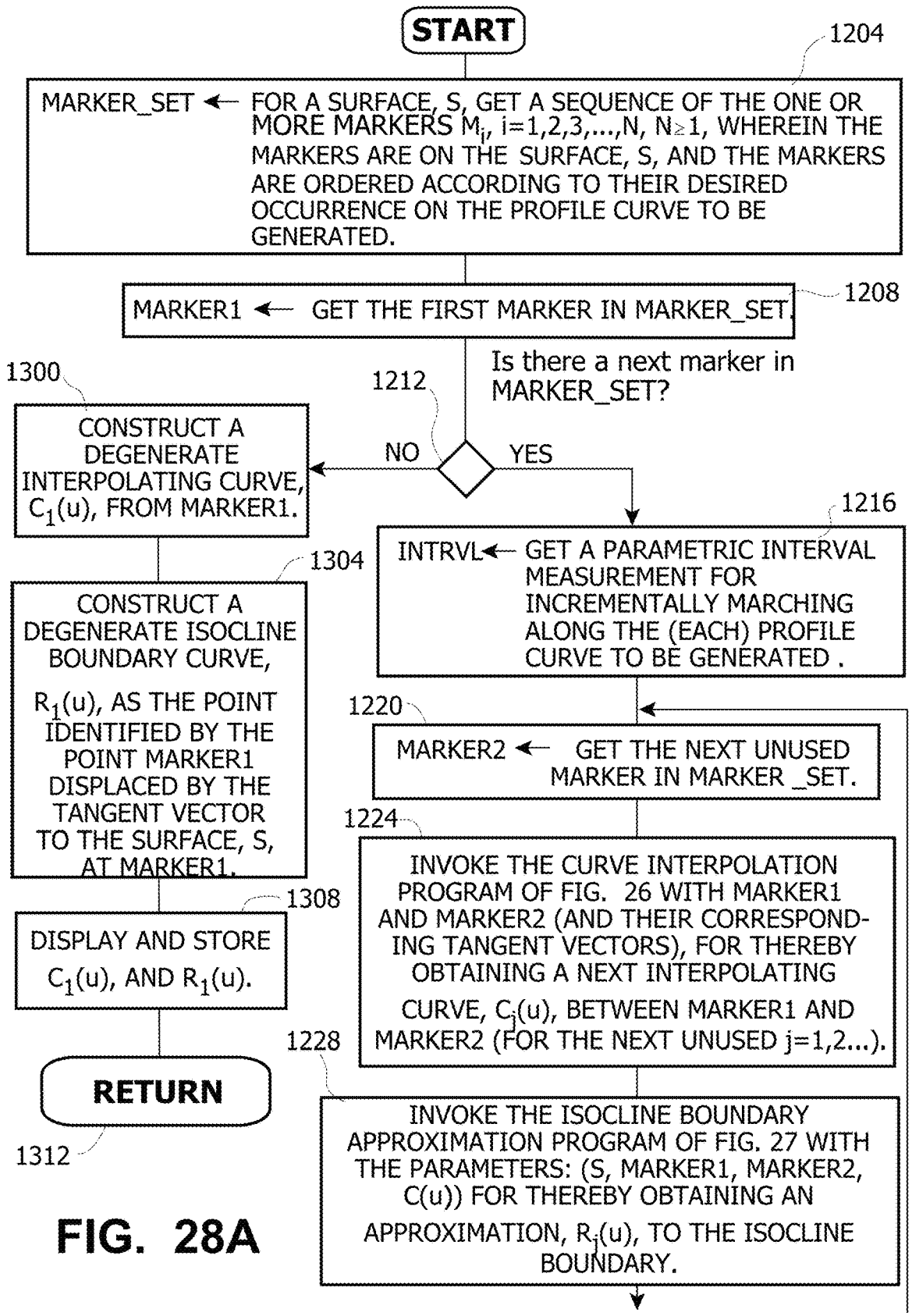
FIGS. 28A and 28B show a flowchart for a program that constructs a more precise isocline ribbon boundary than the approximation resulting from FIG. 27.
Figure 28B:
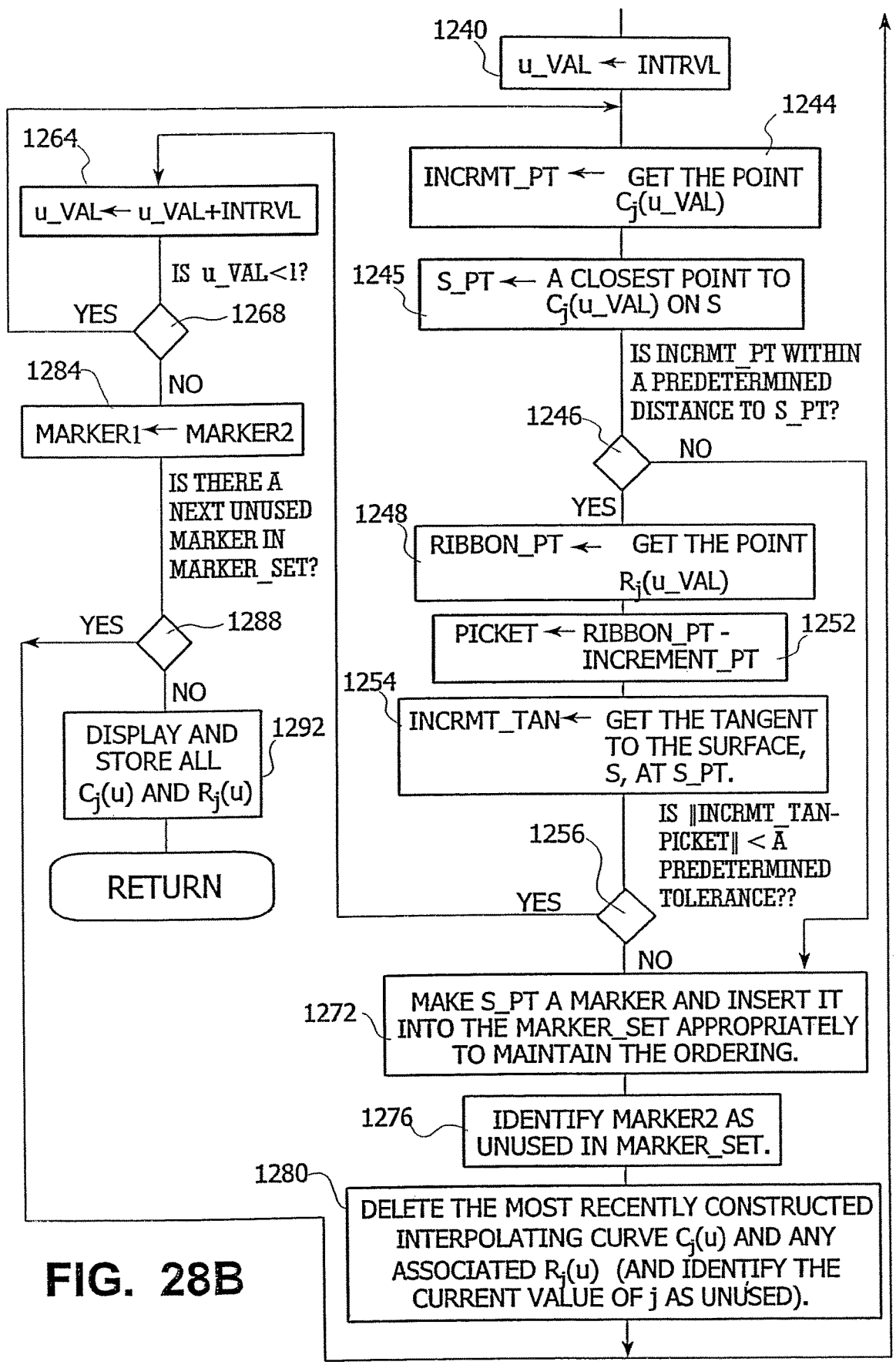

In FIGS. 28A and 28B, a flowchart for a program is provided for constructing a more precise isocline ribbon boundary than the approximation resulting from FIG. 27. In particular, in the flowchart of FIGS. 28A and 28B, the program of FIG. 27 is repeatedly and adaptively invoked according to the variation in the object (e.g., surface) S along the path of the profile curve provided thereon.

Accordingly, in step 1204 of FIG. 28A, a sequence of one or more markers $M_i$, i=1, 2, . . . N, N≥1, is assigned to the variable MARKER_SET, wherein these markers are on the surface, S, and the markers are ordered according to their desired occurrences along a profile curve to be generated. Note that in one typical embodiment, the markers are generally provided (e.g. constructed and/or selected) by a user. Moreover, for the present discussion, it is assumed that the tangents to the surface S corresponding to the markers $M_i$ are tangents to S entered by the user. However, it is within the scope of the present disclosure that such tangent vectors may be provided automatically by, for example, determining a tangent of the direction of a parameterization of the surface S.

In step 1208 of FIG. 28A, the first marker in the set, MARKER_SET, is assigned to the variable, MARKER1. Subsequently, in step 1212, a determination is made as to whether there is an additional marker in MARKER_SET. If so, then in step 1216, the variable, INTRVL, is assigned a parametric increment value for incrementally selecting points on the profile curve(s) to be subsequently generated hereinbelow. In one embodiment, INTRVL may be assigned a value in the range greater than or equal to approximately $10^{-3}$ to $10^{-6}$.

In step 1220, the variable, MARKER2, is assigned the value of the next marker in MARKER_SET. Subsequently, in step 1224, the curve interpolation program of FIG. 26 is invoked with MARKER1 and MARKER2 (and their corresponding user-identified tangent vectors) for thereby obtaining an interpolating curve, $C_j(u)$ between the two markers (where j=1, 2, . . . , depending on the number of times this step is performed). Then in step 1228, an isocline boundary approximation is determined according to FIG. 27 using the values of MARKER1, MARKER2 and the interpolating curve, $C_j(u)$, for obtaining the isocline boundary approximation curve, $R_j(u)$.

Subsequently, in step 1240, the variable, u_VAL, is assigned the initial default value INTRVL for selecting points on the curves, $C_j(u)$ and $R_j(u)$. Following this, in step 1244, the variable INCRMT_PT is assigned the point corresponding to $C_j(u\_VAL)$. Subsequently, in step 1245, the variable, S_PT, is assigned a point on S that is "closest" to the point $C_j(u\_VAL)$ More precisely, assuming S does not fold back upon itself closer than ε>0, for some e, a point on S is selected that is in a neighborhood less than a of $C_j$. Note that since $C_j(u\_VAL)$ may not be on S, by setting the value of INTRVL so that this variable's value corresponds to a maximum length along the interpolating curve $C_j$ of no more than one-half of any surface S undulation traversed by this curve, then it is believed that the interpolating curve $C_j$ will effectively follow or be coincident with the surface S. Subsequently, in step 1246, a determination is made as to whether the point INCRMT_PT is within a predetermined distance of S_PT (e.g., the predetermined distance may be in the range of $10^{-3}$ to $10^{-6}$). In particular, the predetermined distance may be user set and/or defaulted to a system value that is changeable depending upon the application to which the present disclosure is applied. Accordingly, assuming that INCRMT_PT and S_PT are within the predetermined distance, then step 1248 is encountered wherein the point $R_j(u\_VAL)$ on the isocline boundary approximation is determined and assigned to the variable, RIBBON_PT. Subsequently, in step 1252, an approximation to an isocline picket at $C_j(u\_VAL)$ is determined and assigned to the variable, PICKET.

In step 1254, the tangent to the surface (more generally, object) S at the point $C_j(u\_VAL)$ is determined and assigned to the variable, INCRMT_TAN, this tangent being in the direction of the parameterization of S.

In step 1256, a determination is made as to whether the vectors, INCRMT_TAN and PICKET are sufficiently close to one another (e.g., within one screen pixel). If so, then a subsequent new point on the interpolating curve C is determined by incrementing the value of u_VAL in step 1264. Following this, in step 1268, a determination is made as to whether the end of the interpolating curve, $C_j(u)$, has been reached or passed. Note that the assumption here is that $0 \leq u \leq 1$. Accordingly, if u_VAL is less than 1, then step 1244 is again encountered, and some or all of the steps through 1256 are performed in determining whether the isocline ribbon point approximation, $R_j(u\_VAL)$, is close enough to the actual ribbon point as theoretically defined in the Definitions Section hereinabove.

Referring again to step 1246, note that if INCRMT_PT is not close enough to S, then an interpolating curve more finely identified with the actual points of S is determined. That is, the point, S_PT, is made into a marker and inserted into MARKER_SET, thereby causing new interpolating ribbon curves, $C_j(u)$ and $R_j(u)$ to be generated (in steps 1224 and 1228) that will deviate less from S (assuming S is continuously differentiable). That is, step 1272 is performed wherein a marker is generated for the point, S_PT, and this new marker is inserted into MARKER_SET between the current marker values for MARKER1 and MARKER2. Subsequently, the marker currently denoted by MARKER2 is flagged as unused (step 1276), and in step 1280, the most recently constructed interpolating curve $C_j(u)$ and any associated ribbon boundary curve $R_j(u)$ are deleted. Then, step 1220 and subsequent steps are again performed for determining new interpolating and ribbon boundary curves, $C_j(u)$ and $R_j(u)$.

Note that steps 1272 through 1280 and step 1220 are also performed if in step 1256, INCRMT_TAN and PICKET are not determined to be sufficiently close to one another in the object space of S.

Referring again to step 1268, if the end of the interpolating curve, $C_j(u)$, has been reached or passed, then it is assumed that $C_j(u)$ is a sufficiently close approximation to points on S (between MARKER1 and MARKER2), and $R_j(u)$ is sufficiently close to an isocline ribbon for these points on S. Thus, if there are additional markers wherein an interpolating curve $C_j(u)$ and corresponding ribbon approximation $R_j(u)$ has not been determined, then the next pair of consecutive markers (of the marker ordering) in MARKER_SET is determined and various of the steps 1220 and beyond are performed. That is, in step 1284, MARKER1 is assigned the value of MARKER2, and in 1288, a determination is made as to whether there is a next unused marker in MARKER_SET. If so, then variations of the steps 1220 and beyond are performed as described above. Alternatively, if all markers have been designated as used, then in step 1292 the resulting curves $C(u)$, $R_j(u)$, for each used $j=1$, 2, . . . , are graphically displayed and stored for subsequent retrieval. Note that the profile curves $C_j(u)$ may be optionally reparameterized so that these curves may be parameterized collectively as a single curve, $\tilde{C}(u)$, with $$\tilde{C}(0)=C_1(0) \text{ and } \tilde{C}(1)=C_N(1).$$

Figure 29A:
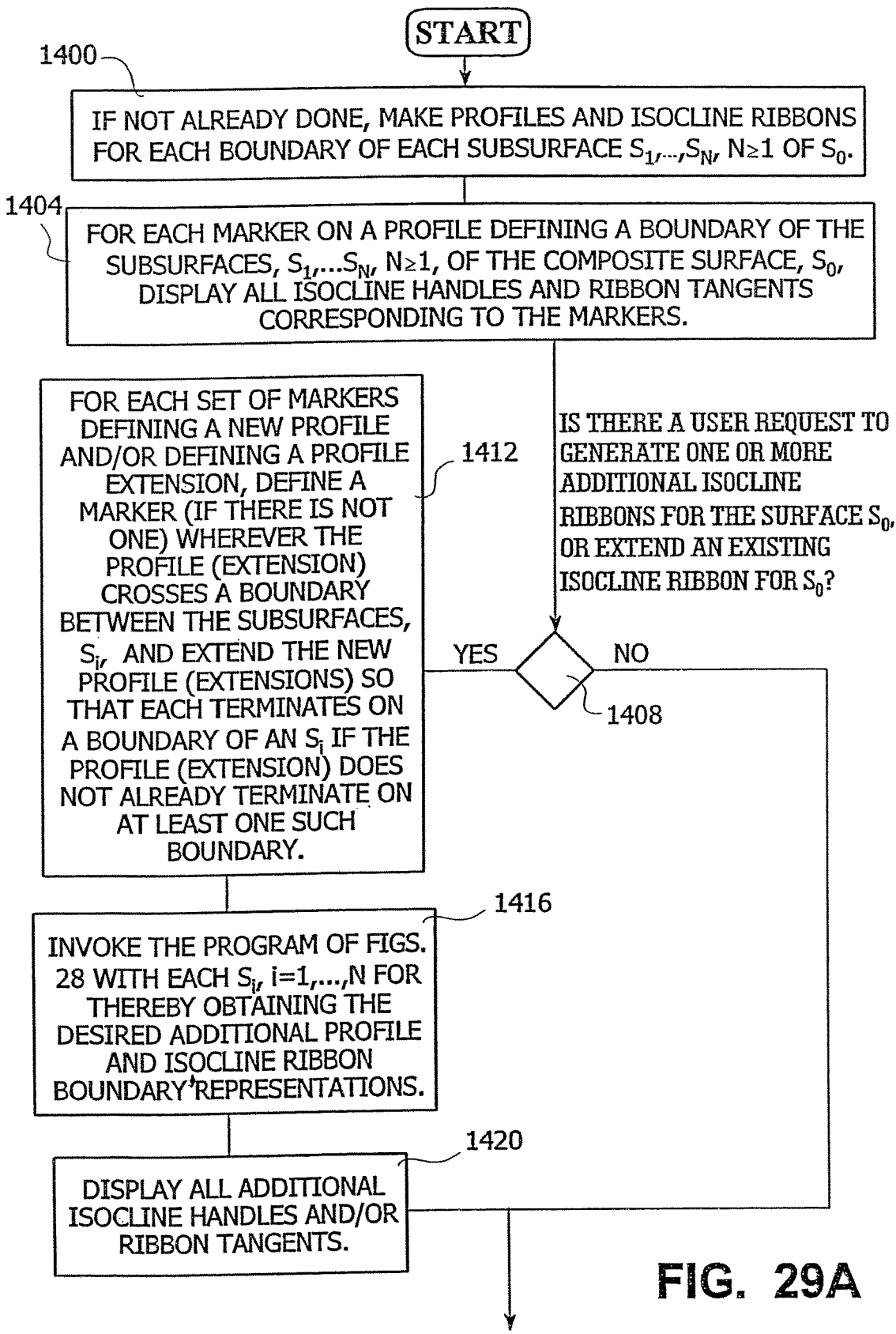
FIGS. 29A-29C illustrate a flowchart for modifying one or more subsurfaces $S_i$ of a composite surface $S_0$ by changing a geometric characteristic of an isocline handle and/or a ribbon tangent for a marker on one or more profile curves defining the boundaries for the subsurfaces $S_i$.
Figure 29B:
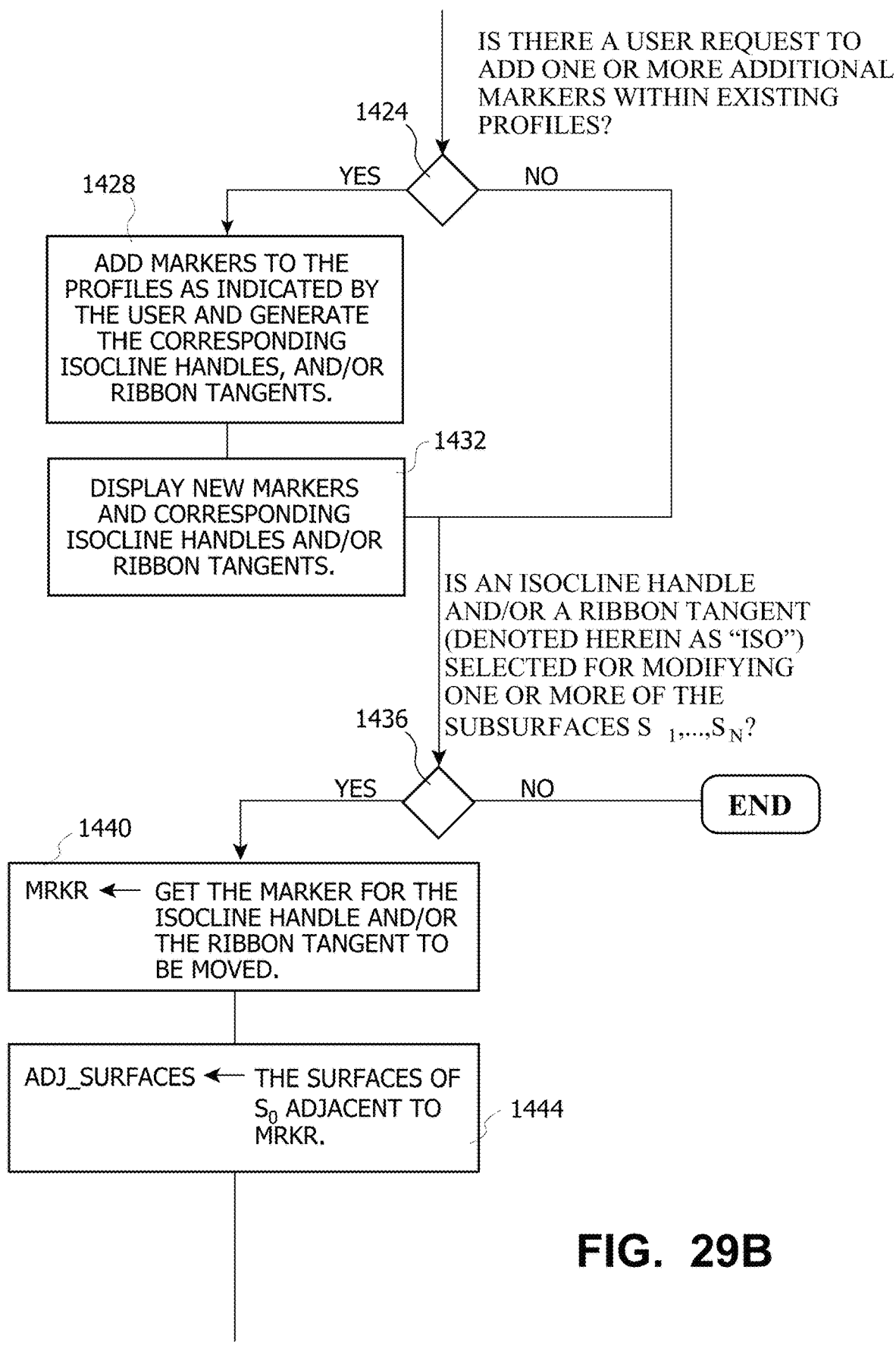
Figure 29C:
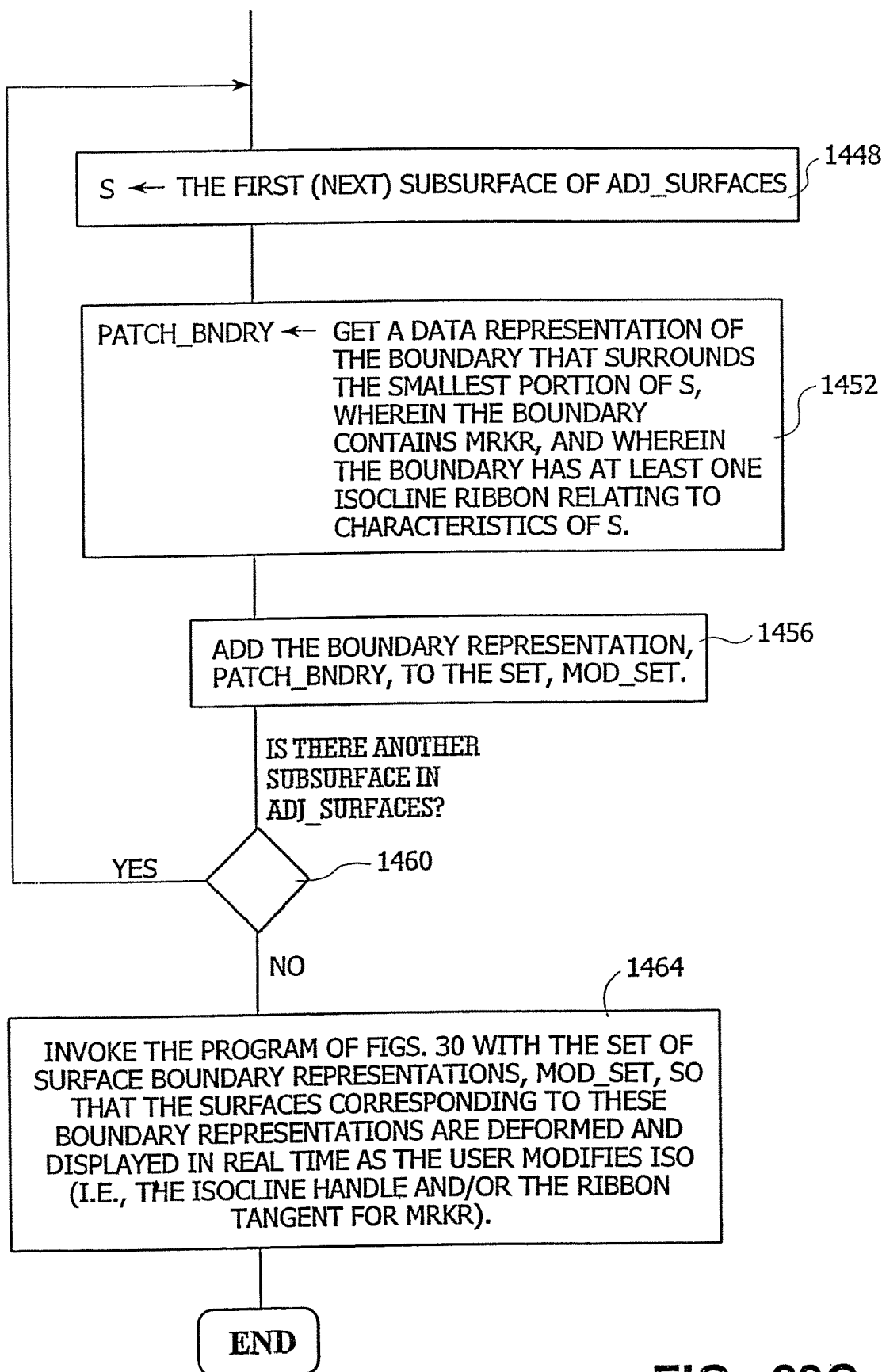
Figure 30A:
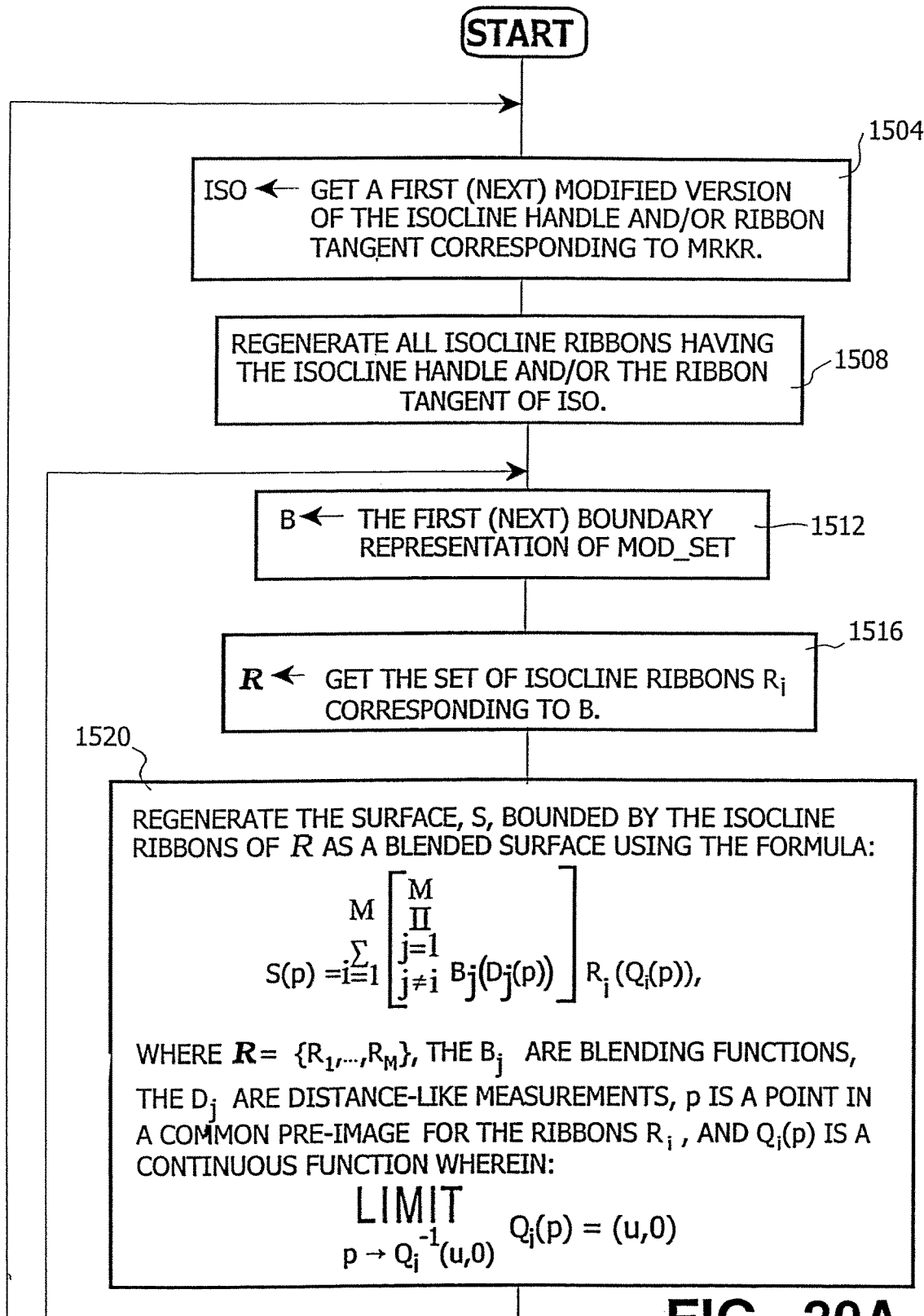
FIGS. 30A and 30B provide a flowchart of a program invoked by the flowchart of FIG. 29 for deforming subsurfaces $S_i$ in real time as a user modifies an isocline handle and/or ribbon tangent.
Figure 30B:
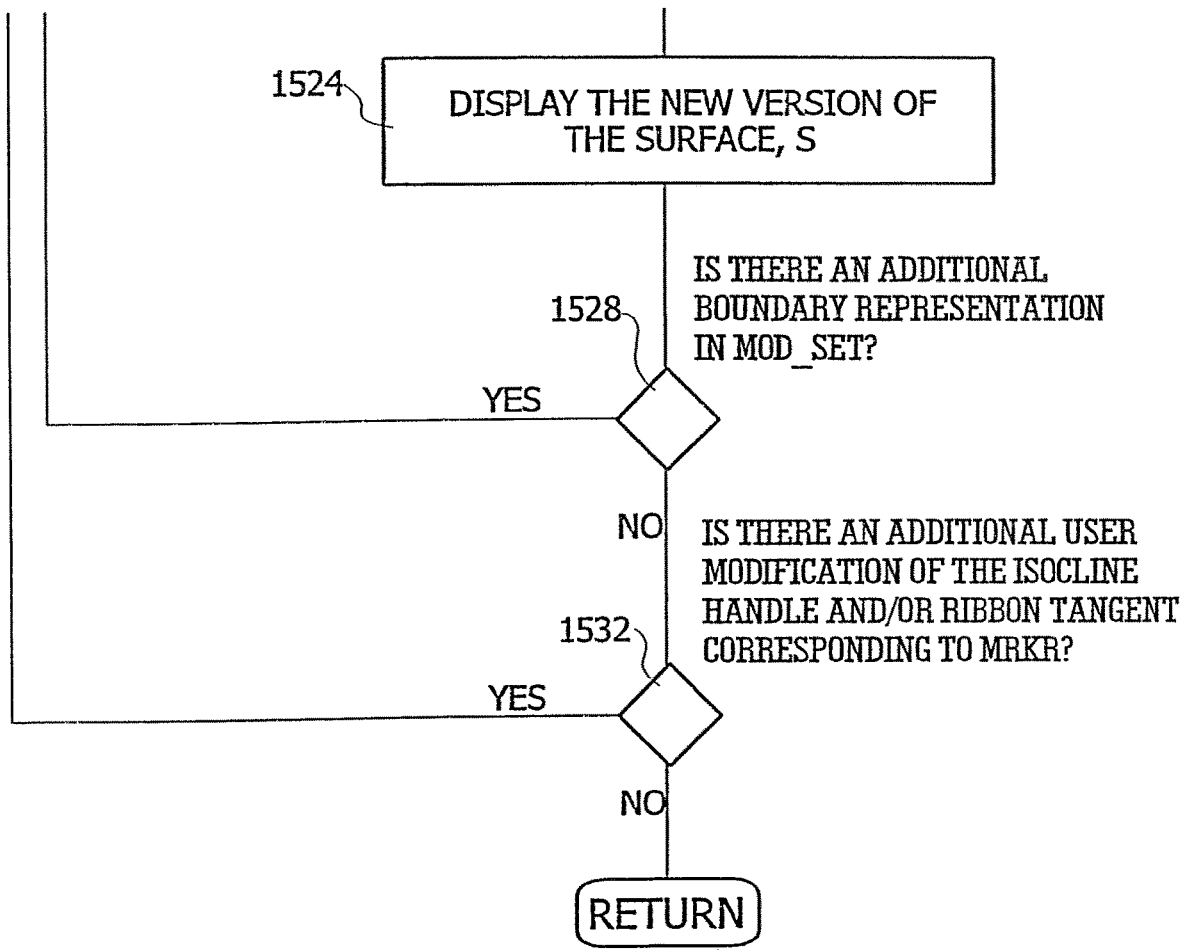

FIGS. 29 and 30 provide high-level descriptions of flowcharts for modifying one or more surfaces (more generally geometric objects) by modifying isocline handles, ribbon tangents, and their associated isocline ribbons. In particular, for simplicity, the flowcharts of these figures assume that there is a composite surface, $S_0$, that is provided (at least in part) by one or more subsurfaces, $S_i$, i=1, 2, . . . N, N≥1, where these subsurfaces $S_i$ are connected to one another (e.g., patched together) along common boundaries so that $S_0$ does not have disconnected portions. Accordingly, given such a composite surface, $S_0$, the flowcharts of FIGS. 29 and 30 can be described at a high level as follows. In FIG. 29, an isocline handle and/or a ribbon tangent having at least one geometric characteristic (e.g. length, direction, curvature, etc.) to be changed is determined along with the subsurfaces $S_i$ that are to be modified to reflect the isocline handle and/or ribbon tangent changes. Subsequently, in the flowchart of FIG. 30, the modifications to the subsurfaces are computed and displayed in real-time as the user enters the modifications to the selected isocline handle and/or ribbon tangent. Note that the computing of surface (more generally geometric object) modifications in real-time has not heretofore been feasible for surfaces in higher dimensional geometric objects in that the computational overhead has been too great. Accordingly, a computational system according to the present disclosure has reduced this overhead by providing a novel technique of computing blended surfaces which is very efficient and which generates surfaces that are fair.

The following is a more detailed description of FIGS. 29A and 29B. In step 1400, if there are not profiles and isocline ribbons corresponding to the entire boundary of each subsurface $S_i$, then make profiles and isocline ribbons that approximate the entire boundary of each subsurface $S_i$. Note that this may be performed using the program of the flowchart of FIG. 28. In step 1404, the isocline handles and ribbon tangents corresponding to markers on the surface $S_0$ are graphically displayed to the user. In step 1408, a determination is made as to whether the user has requested to add one or more additional isocline ribbons to the surface $S_0$, or extend an existing isocline ribbon having its profile curve on $S_0$. If the user has made such a request, then step 1412 is performed to assure that in addition to any other markers added by the user, markers are added: (a) whenever a profile contacts a boundary of a subsurface $S_i$, and (b) so that profile curves will be extended in a manner that terminates each one on a boundary of a subsurface $S_i$. Moreover, additional markers may be also added at intersections of curve profiles. Thus, for these latter markers, there may be two distinct ribbon tangents associated therewith (i.e., one for each subsurface).

Subsequently, in step 1416, the program of FIG. 28 is invoked with each $S_i$, i=1, 2, . . . N for thereby obtaining the desired additional profiles and isocline boundaries. As an aside, note that FIG. 28 need only be invoked with the subsurfaces $S_i$ to which new markers are added.

In step 1420 following step 1416, all newly added isocline handles and ribbon tangents are displayed. Note that in some embodiments, only the isocline handles are displayed initially, and the user is able to selectively display the ribbon tangents as desired.

Subsequently, in step 1424, a determination is made as to whether the user has requested to add one or more additional markers within existing profiles. If so, then the additional new markers are added and at least the corresponding new isocline handles are determined for these new markers. As an aside, note that in one embodiment of the present disclosure, when a new marker is added to an existing profile, the profile will change somewhat since it is now exactly identical to the surface $S_0$ at another point and the interpolating curve generated (via FIG. 26) between consecutive markers of a profile is now generated using the newly added marker. Accordingly, a profile with one or more additional markers should, in general, conform more closely to the shape of the adjacent portions of the surface $S_0$.

Subsequently, in step 1432, the additional new markers and optionally, their corresponding isocline handles and ribbon tangents, are graphically displayed to the user.

Note that it is not necessary for steps 1408 through 1420, and steps 1424 through 1432 to be performed sequentially. One skilled in the art of computer user interface design will understand that with event driven user interfaces, the processing of each new marker can be performed individually and displayed prior to obtaining a next new marker location from the user. Thus, consecutive executions of the steps 1408 through 1420 may be interleaved with one or more executions of the steps 1424 through 1432.

In step 1436, a determination is made as to whether an isocline handle and/or a ribbon tangent is selected by the user for modification. Note that the identifier, ISO, will be used to denote the isocline handle and/or the ribbon tangent to be modified.

In step 1440, the marker corresponding to ISO is determined and access thereto is provided via the variable, MRKR. Subsequently, in step 1444, the collection of one or more subsurfaces $S_1, \ldots, S_N$ adjacent to MRKR are determined and access to these adjacent subsurfaces is provided by the variable, ADJ_SURFACES.

In steps 1448 through 1460, boundary representations of portions of the subsurfaces, $S_i$, adjacent MRKR are determined (step 1452) and inserted into a collection of surface boundary representations denoted MOD_SET (step 1456). In particular, for each of the subsurfaces in ADJ_SURFACES, a data representation of the boundary of the smallest portion of the subsurface that is adjacent to MRKR, and that is bounded by isocline ribbons is entered into the set, MOD_SET.

Finally, in step 1464, the program of FIG. 30 is invoked for modifying, in real-time as the user modifies ISO, the portion of $S_0$ within the boundary representations contained in MOD_SET. In particular, the program of FIG. 30 is invoked with the values, MRKR and MOD_SET.

In the flowchart of FIG. 30, the high-level steps are shown for modifying in real-time the surface portions identified by the surface boundary representations in MOD_SET, wherein these surface portions are adjacent to the marker, MRKR. Accordingly, in step 1504, the first (next) modified version of the isocline handle and/or ribbon tangent corresponding to the marker, MRKR, is obtained and assigned to, ISO. Subsequently, in step 1508, all isocline ribbons containing the modified isocline handle and/or ribbon tangent of ISO are regenerated to reflect the most recent modification requested by the user. Note that this is performed using the one-dimensional version of Formula (1), and modifying each such isocline ribbon along its extent between MRKR and the adjacent markers on each isocline ribbon containing MRKR.

Subsequently, in step 1512, the first (next) boundary representation in MOD_SET is assigned to the variable, B. Then in step 1516, the set of isocline ribbons for the (profile) boundary segments contained in B are assigned to the variable, R. Note that R includes at least one isocline ribbon containing the marker, MRKR.

In step 1520, a blended surface is generated that is delimited by the profiles of the isocline ribbons of R. The formula used in this step is similar to Formula (4). However, there are additional functions, $Q_i(p)$, provided in the present formula. Note that, in general, the portion of a parameter space used in generating the surface, S (of which S(p) is a point), of this step may have two, three, four, five or more sides (profile pre-images) that also have isocline ribbon pre-images. Thus, a translation function, $Q_i(p)$, is provided for each isocline ribbon $R_i$ of R (wherein for the points p in the parameter space that are in the interior, I, to the pre-images of the profiles, $P_i$, for the isoclines $R_i$ of R) it is desirable that these points p be translated into points in the parameter space for $R_i$ so that a corresponding point in the object space of the isocline ribbon $R_i$ can be determined and used in the blending function of the present step. Note that the translation functions, $Q_i(p)$, preferably satisfy at least the following constraints:

(a) $Q_i(p)$ is a continuous function for continuous surfaces;

$$\underset{p \to Q_i^{-1}(u,0)}{\text{LIMIT}} (Q_i(p)) = (u, 0) \qquad \text{(b)}$$

That is, when a sequence of points in I converges to the pre-image of the profile point $P_i(u)$ (i.e., $Q_j^{-1}(u,0)$), then $Q_i(p)$ converges to the isocline ribbon parameter space point $(u,0)$.

Subsequently, in step 1524, the surface S is displayed, and in step 1528 a determination is made as to whether there is an additional boundary representation in MOD_SET for generating an additional blended surface S. If so, then step 1512 is again performed. Alternatively, if there are no further boundary representations, then in step 1532, a determination is made as to whether there is an additional user modification of the isocline handle and/or ribbon tangent corresponding with MRKR. If there is, then at least the steps 1504 through 1528 are again performed. Note that the steps of FIG. 30 can be sufficiently efficiently performed so that incremental real-time changes in the isocline handle and/or ribbon tangent for MRKR designated by the user can be displayed as the user continuously modifies this isocline handle and/or ribbon tangent.

4. A Geometric Design User Interface

The general principles described above form a basis for a novel user interface for computer aided geometric design.

In one user interface embodiment for the present disclosure, a user interface may be provided for defining isoclines. Using such an interface, a designer may, for example, require that an isocline be perpendicular to a given light direction along an entire profile curve so as to create a reflection line, as one skilled in the art will understand. More generally, the novel user interface may allow for various constraints to be input for generating isocline ribbons, isocline handles and/or ribbon tangents that satisfy such constraints. In particular, the user interface allows for global constraints such as light direction, curvature, tangency, level contours, dihedral angle functions with a plane, etc., as one skilled in the art will appreciate.

In one embodiment of the user interface, the user will start with a given geometric object, for example a cylinder. The user may then inscribe a profile curve on the cylinder by placing markers at various points on the cylinder. The profile tangents and/or isocline handles may be defaulted by adopting the slope information from the cylinder. For example, at each marker, the profile tangents are in the plane tangent to the cylinder at the marker.

Figure 31:
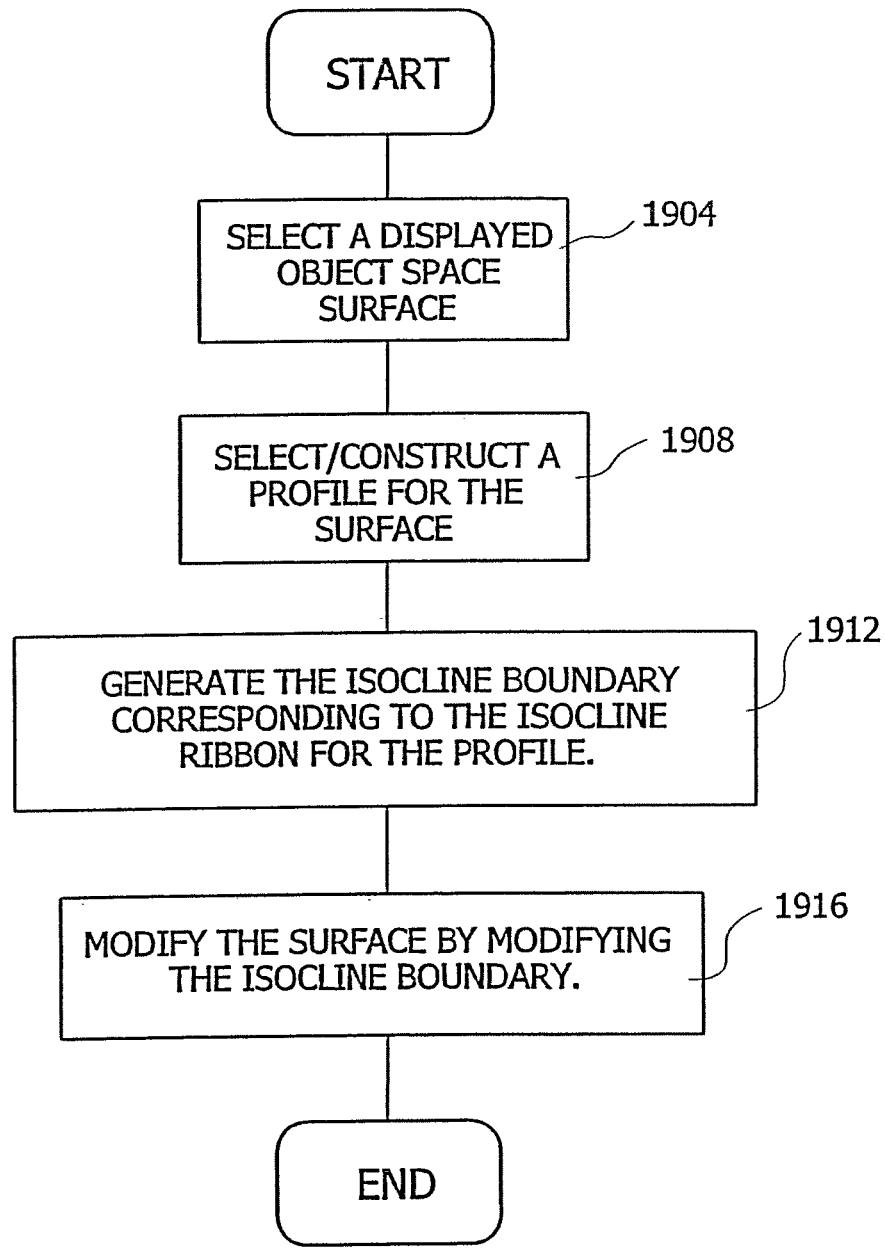
FIG. 31 is a flowchart of the high level steps performed by a user interacting with an embodiment of the present disclosure for changing the shape of a surface.

The user may then select and modify the markers, add additional markers, and/or modify the position and the direction of the isocline handles and/or ribbon tangents. As the isocline ribbon is accordingly modified, the cylinder (more generally, geometric object) will reflect the changes in the modification of the isocline ribbon. Additional profiles and markers may be added in this manner until the desired shape of the geometric object (derived from the cylinder) is obtained. An example of these steps is illustrated in the flowchart of FIG. 31. That is, the user selects a graphically displayed surface (more generally, geometric object) in step 1904. Subsequently, in step 1908, the user constructs a profile curve on the selected surface (object).

Subsequently, in step 1912, an isocline ribbon (or at least the isocline boundary) is generated for the profile. Note that this ribbon/boundary can, if desired, be generated substantially without additional user input. That is, an isocline ribbon/boundary may be generated from the tangency characteristics of the surface upon which the profile resides. In particular, for a parametric surface (more generally geometric object), the parametric tangents on the surface at points on the profile can be utilized to generate an isocline ribbon/boundary for the profile. Thus, surface neighborhoods on one side of the profile curve may be used to determine a first isocline ribbon/boundary for a first surface having the profile, and if the profile is on the seam between the first surface and a second surface, then surface neighborhoods on the other side of the profile may be used to determine a second isocline ribbon/boundary.

Additionally, note that other surface characteristics may be preserved in an isocline ribbon/boundary. For example, in addition to, preserving the parametric tangents at profile curve points, the isocline ribbon/boundary may also optionally preserve the surface characteristics such as curvature, high order (>=2) derivative continuity with the surface. Note, however, it is within the scope of the present disclosure that further surface characteristics can be preserved in the isocline ribbon/boundary.

In step 1916, the generated isocline ribbon/boundary may be used to modify the surface(s) having the profile curve as discussed hereinabove with reference to the programs of the flowcharts of FIGS. 29 and 30.

In some embodiments of the user interface, an operation is provided to the designer wherein a common boundary between two object space surfaces can be selected and the operation automatically forces the surfaces to join at a higher order continuity criteria (e.g., curvature continuity) than that of tangent plane continuity. For example, a higher order continuity constraint imposed on an isocline ribbon deriving from one of the surfaces at the common boundary, can be used to similarly constrain an isocline ribbon for the other surface having the common boundary. Accordingly, this operation helps alleviate the so-called "Mach band" effect in which the human eye detects discontinuities in curvature in some instances.

Other user interface operations provided by the present disclosure are:

(a) Rounderizing, which is a tweaking operation that modifies an existing surface to round off pointed edges, or to create darts (i.e., surfaces that are smooth except at a single point, where the surface kinks) that dissipate sharp edges. Such operations can be performed using a computational system according to the present disclosure by positioning profile curves on the surface on opposite sides of a sharp edge and blending smoothly between the profiles (e.g., using Formula (1) as described in Section 2.3.5; and subsequently eliminating the surface in between the profile including the sharp edge.

(b) Embedding, which is an iterative user interface procedure that can take one finished model, scale it, and perhaps rotate or otherwise deform it to fit into part of another model.

4.1. Defining the Isocline via Markers, Profiles and the User Interface

Explicit profiles are the profile curves that express a designer's intent. Explicit profiles may be unconstrained (freeform) or partially constrained (trim). Implicit profiles may be visible boundaries between surface patches caused, for example, by a surface discontinuity (i.e., a kink or curve defined between an end surface of a cylinder and the cylindrical side thereof).

Implicit profiles are created automatically when the user introduces, e.g., a surface discontinuity. All profiles in a model are either explicit or implicit.

4.1.1 Creating Markers

Profile markers and handles are created in the following ways:

A. Markers are automatically created at the ends of new implicit and explicit profiles.

B. Inserted by a designer (e.g., by double clicking at a point) on an explicit profile. To the designer, he/she is inserting a point on the profile. The newly placed marker only minimally or not at all changes the shape of the profile in the profile segment containing the new marker. Subsequently, profile and isocline handles are determined according to the shape of the profile and surface(s) attached at the new marker.

A marker may be identified with a plurality of coincident points on the same profile (e.g. a profile that loops back and attaches to itself). Such an identification of the marker with the plurality of profile points cannot be broken, except by deletion of the marker. In the case of two or more profiles meeting at a common point having a profile marker, such profiles each have a marker at the common point and the markers are constrained to maintain coincidence so that moving one marker will move both.

Profile markers inserted by the designer may be inserted for providing profile handle points, or for setting specific isocline values. Note that a profile handle point may have a set of constraints on its isocline handles; i.e., isocline handle may inherit value(s) by an interpolation of the nearest two adjacent isocline handles.

4.1.2. Viewing Markers and Profiles

Profile and isocline handles may have various constraints placed upon them, wherein these handles may be displayed differently according to the constraints placed upon them. In particular, the following constraints may be placed upon these handles:

(a) constrain a handle to a particular range of directions;
(b) constrain a handle to a particular range of magnitudes;
(c) constrain a handle to lie in a plane with other handles;
(d) constrain a handle to a particular range of curvatures;

(e) constrain a handle with a transform of another handle, e.g., identical rotations and/or translations.

The designer can choose to display the constraints through a display request for the properties of geometric objects. In one embodiment, different colors may be displayed for the different types of constrained profile markers. For example, handles having no variability (also denoted herein as "fully constrained") may be displayed in blue.

In some embodiments of the user interface, vectors are "grayed out" that are constrained to thereby demonstrate to the designer that such vectors cannot be changed. For example, in one embodiment, fully constrained handles are typically grayed out.

4.1.3 Connecting Profiles Together

In one embodiment of the user interface, it supports the linking together of two or more profiles that intersect at the same X,Y,Z location. Such intersection points are denoted "tie points," when the parameterization of the point on each profile is invariant under profile modifications. Note that such tie points may or may not have markers associated therewith. When such a tie point is modified, all corresponding profile curve points associated therewith at the tie point are modified as a group. Such a tie point may be an endpoint of a profile or an internal (i.e. "knot") point.

Figure 42A:
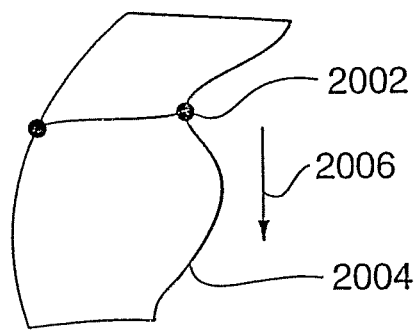
FIGS. 42A and 42B illustrate the movement of a marker 2002 that is constrained to reside on the profiles curves 2003 and 2004.
Figure 42B:
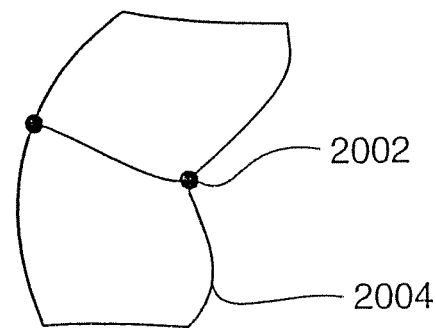

Alternatively, a profile marker of a first profile may be constrained to lie within the object space range of a second profile (either implicitly or explicitly). For example, referring to FIGS. 42A and 42B, the user interface may provide the user with the capability to slide a profile marker 2002 (contained on a first profile 2003 and a second profile 2004) along the second profile 2004 for thereby changing the profile 2004 of FIG. 42A into the profile 2004 of FIG. 42B when the marker 2002 is slid along the profile in the direction of direction arrow 2006. Such a slidable marker 2002 is denoted as a "slide point."

Profile intersections are either "slide" or "tie" points. Moreover, these different types of points may be distinguished graphically from one another by different colors and/or shapes. Note, if a profile slides along another profile, and the isocline ribbon for the sliding profile is used to compute a blended surface, S, then S will be recomputed.

4.1.4 Creating Markers and Profiles

The user interface may support the creation of a profile curve in a number of ways:

A. Sketch the profile on the surface similarly to the data driven technique of FIGS. 28, wherein additional markers may be provided for tying the profile to the surface within a predetermined tolerance. Alternatively, in a second embodiment, a profile can be sketched across one or more surfaces by having the user select all markers for the profile. Note that in either case, a profile may be sketched across one or more surfaces. Moreover, in the second embodiment, the user interface supports the following steps to successfully create a profile.

(A1) Marker points are specified which lie on the surface (s). A fitted curve is generated through the points in parameter space and then this fitted curve is evaluated to obtain a corresponding image curve in object space.

(A2) For each surface that the new profile crosses, the user may specify the profile type (freeform or trim) for the portion of the profile crossing the surface. A profile sketched on a surface either trims one side of that surface or splits that surface into two new surfaces. Accordingly, note that any (non-degenerate) profile that enters the interior of a surface must cross the surface's boundary at an entering point and an exiting point. That is, the two surfaces along a common profile boundary are always linked to the profile, wherein, with respect to this profile, these surfaces may be characterized as follows: (a) one surface is a trim surface and one is a non-trimmed surface (also denoted a "freeform surface"), or (b) two freeform surfaces.

B. Copy a Profile: A designer selects a profile to copy. The profile is copied to a buffer (denoted a clipboard). The user then selects the mode of copy (examples: keep profile handles, or adapt profile handles to the geometry where the profile is to be copied). The user selects where to position the new profile (which may be additionally scaled, rotated, and/or mirrored, etc). The user selects a location for the new profile. Note that the new profile can be constrained by constraints on the original profile. For example, the new profile may be mirrored about a plane from an existing profile, such that any change to the original profile will result in a change to the copy.

When a new profile is created, profile markers are automatically generated at both ends of the new profile. Profile handles and isocline (ribbon tangent) handles are derived from the geometric characteristics of the surfaces that the new profile splits.

4.1.5 Modifying Markers and Profiles

Modification of markers and/or (profile, isocline) handles is dependent on the constraints placed upon the markers and/or handles. They may be constrained in one of the following ways:

A. Interactive modification by selecting a handle (profile or isocline) at a particular marker, m, and moving the handle endpoint so that it is constrained to lie in a normal plane, i.e., either a plane normal to a surface having a profile containing m, or a plane defined by the isocline and profile handles of the profile at m. A pop-up property sheet is also available for the user to key-in specific numerical values for magnitude and angle for modifying a selected profile and/or isocline handle.

B. For markers that are constrained so that their pre-images lie within the pre-image of a profile, the marker may slide along such a parent profile via, e.g., interactive modification by dragging such marker points. Note that for positional unconstrained markers, the marker points may be moved freely (i.e., under a user's direction and without other restrictions) along the parent profile(s) upon which such markers reside. Additionally, note that the user can select multiple profile marker points by clicking on each, or by selecting all markers within a designated region (e.g., bounding rectangle). Accordingly, the user is able to move a display pointing device (e.g., a mouse) which will then cause all of the selected markers to uniformly move in a corresponding direction to the movement of the display pointing device. However, movement of the markers depends on the constraints set on these markers. For example, a constrained marker will only move within the limits placed upon it. Thus, if a first selected marker moves only within a first profile and a second selected marker only moves within a different second profile oriented orthogonally to the first profile, then depending on the direction of movement desired, one of the following occurs:

(i) the first marker is able to move, but the second marker can not;

(ii) the second marker is able to move, but the first marker can not;

(iii) both the first and second markers are able to move;

(iv) neither marker may be able to move.

C. Marker and handle constraints may be set by default rather than explicitly by the user. A pop-up property display form allows the user to set or remove specific constraints.

D. Additional constraints on profile and/or isocline handles may be set that are dependent on the characteristics of other geometry. For example, profile and isocline handles can be constrained to be normal or parallel to a selected reference plane. Note that the position of a profile marker also can be constrained to be dependent on characteristics of other geometry. For example, a marker can be constrained to lie on a parting plane. That is, a plane of front/back symmetry for designing a bottle. Another example of these constraints is in generating symmetric designs, i.e., a profile marker copy that is reflected about a parting plane will be constrained to be symmetric to the parent profile marker.

E. Surfaces adjacent to a profile may have to satisfy either C0, C1, or C2 continuity, wherein C0 is positional, C1 is tangency, and C2 forces smooth surface blends. One constraint that can be set on a marker is to force C1 continuity between surfaces surrounding the marker by maintaining equal length tangent vectors interior markers.

Freezing (eliminating the ability to modify) the profile and isocline handles at a marker will cause the profile segment containing the marker to rebuild based on the profile handles of the next two closest markers, effectively changing this marker's handles to reflect the curve built by the two markers on either side.

For the most part, modifying profiles is a function of user interface techniques for modifying the profile marker positions and handles that control the shape of the profile. The following are examples of such user interface techniques.

A. Direct method: Profiles are modified directly on an object space (3D) model. This is done by modifying the profile markers and handles that make up the profile.

If the designer modifies a trim profile, the profile always lies within the parameter space of the surface it is trimming. That is, the trim profile needs to be modified in the context of its original, overbuilt surface within which it is embedded. Selecting a trim profile (or one of its components) to modify causes the overbuilt, construction geometry to be highlighted. It remains highlighted while the user is modifying the trim profile.

A designer may have the option to turn on profiles and modify them using the direct method. For example, modifying a profile that defines an overbuilt surface will cause the overbuilt surface to be updated. Since the profile that trims this overbuilt surface is constrained to lie within the parameter space of the surface, the trim profile is also recomputed.

B. Design Ribbon method: This method is used to modify a specified region of a profile. It allows, for example, the user to simplify the designer's interactions by modifying a profile in one view that is complex in another view.

The designer identifies two markers that lie on the same profile. The profile segment(s) between the two markers is extruded in at least one graphical view of the profile, thereby creating a design ribbon (not to be confused with an isocline ribbon). The design ribbon is a simple extruded surface (i.e., a curve which is swept along given directions to generate a surface; for example, for markers at the ends of a profile, offset the corresponding profile handles by their corresponding isocline handles to obtain boundary handles and interpolate an isocline boundary, e.g., by a lower dimensional version of Formula (2); the surface having a perimeter consisting of the profile, the isocline handles, and the isocline boundary defines the new extruded surface). The three-dimensional profile segments identified between the markers always lie within the pre-image of this design ribbon. The user modifies the profile in one of two ways:

(B1) Modify the two-dimensional driving curve from which the design ribbon was extruded, and which is instanced at the end of the ribbon, wherein, by default, this curve is a two-dimensional representation of the three-dimensional profile segments defining the design ribbon. The user may "simplify" the driving curve by selecting a subset of the two-dimensional points. Each time the user modifies a driving curve point, the ribbon is updated and the three-dimensional profile is modified to lie within the parameter space of the modified ribbon. Operations on the driving curve include any of those listed in the Profile Marker section (point/slope modification, insert, delete, etc.).

(B2) Modify the two-dimensional profile points within the design ribbon. The user directly modifies the two-dimensional profile in a view that is perpendicular to the primary view. The two-dimensional points always lie in the parameter space of the ribbon. Operations include any of those listed in the Profile Marker section (point/slope modification, insert, delete, etc.).

Only one design ribbon may exist per surface per profile segment. Design ribbons may be created, modified, and deleted. Once they are created, they are persistent, i.e. they remain unmodified until a designer modifies the same segment at a later point in time. A design ribbon is displayed only when a designer is modifying it. A single profile may have multiple ribbons corresponding to multiple surfaces containing the profile.

Note that modifying a profile using the direct method deletes any design ribbons spanning the points being modified. This invalidates the ribbon and requires a designer to re-specify the ribbon.

C. Move Profile(s): The designer selects and moves two or more profiles in unison. That is, this user interface command selects all of the profile markers on a profile (or segment thereof) and moves them together as a unit.

D. Merge Profiles: The designer may sketch a new profile and attach it to an existing profile so that an endpoint of each profile is coincident. Additionally, the designer may specify which segment or segments of the existing profile to delete. Subsequently, the new profile and the remaining connected portion of the existing profile having the coincident end point with the new profile are merged. Note that merging profiles causes the set of the respective profile handles, isocline handles and ribbon tangents for each of the two coincident endpoints to be combined into a single such set.

E. Split profile: Split one profile into two at a single point, p. An endpoint of each of the two new profiles is constrained to be coincident at p.

4.1.6 Deleting Markers and Profiles

Deleting a profile marker is always possible, except at the endpoints of a profile. However, some embodiments of the present disclosure may need to replace a marker with a marker having constraints if it is needed for maintaining smooth patches. Note that a new constrained replacement marker may or may not be in the same location as the previous marker.

If an entire profile is deleted, then the user interface both highlights any dependent geometric object(s) and requests user confirmation before deleting the profile and the dependent geometric object(s). Accordingly, note that a computational system according to the present disclosure retains sufficient dependency information regarding dependencies between geometric objects in a model so that for modifications of an object that is used for deriving other objects, appropriate additional modifications can be performed on these other objects automatically.

4.1.7 Profile Markers and Handles

Note that there are typically two profile handles, two isocline handles and two ribbon tangents for a profile marker, i.e., a profile handle, an isocline handle and ribbon tangent per surface on each surface having the profile as a boundary curve. However, there may be more handles associated with a profile where several profiles converge or fewer if the profile is the edge of a surface.

4.2 Isoclines and the User Interface

The slope of an isocline handle controls surface tangency at a marker and at a surrounding portion of the profile containing the marker. The magnitude of an isocline handle controls the fullness of the dependent surface. That is, how much the surface bellies out. An isocline handle may be constrained to be offset from another isocline handle (i.e. −10 degrees from other side). An isocline handle can be calculated at any point along a profile (by inserting a marker on the profile).

4.2.1 Creating an Isocline Handle

The user interface supports the constraining of isocline handles relative to one another. Such handles can be forced to always be tangent, of equal magnitude, or offset by some amount. In one embodiment of the present disclosure, a user interface provides a pop-up menu to display and change isocline handle constraint values, such as length and direction.

4.2.2 Modifying an Isocline Handle

If the user slides a profile marker along a profile, the user may fix the isocline handle for the marker, thereby causing the surfaces adjacent to (and dependent upon) the profile to change or have the isocline handles interpolated between the nearest two isocline handles on the profile (which case implies that the dependent surfaces are not affected).

4.2.3 Deleting an Isocline Handle

The user interface supports the deletion of isocline handles.

4.3 Special Geometric Objects and the User Interface

The present disclosure provides for the creation and manipulation of a number of specialized geometric object types that can substantially facilitate the design of objects such as containers.

4.3.1 Label Surfaces

A label surface is a special case of a trimmed surface. The special case aspects of a label surface are:
(i) there is a "watershed" profile that runs from the bottom to the top of the label;
(ii) there are label curves between which the corresponding label surface is ruled (e.g., label curves 132 of FIG. 11);
(iii) there is a boundary (trim) profile (e.g., trim profile 138 of FIG. 11).

The key difference that makes a label surface different from other trimmed surfaces is that the original surface (from which the label surface is trimmed) is a ruled surface. In particular, the label surface defining curves are constrained such that a ruled surface is maintained within the boundary of these defining curves.

Note that other surfaces may be blended to a trim profile for a label, but the trim profile can only be modified in a manner that insures that it bounds a ruled surface.

In one embodiment of the present disclosure, a two dimensional "rolled out" representation of the label surface can be generated. That is, the surface can be associated in a one-to-one fashion with the plane by rolling it flat. Such a representation simulates a label surface in which a designer can thereon create a piece of artwork that can subsequently be wrapped on a container.

4.3.1.1 Creation of a Label Surface

To create a label surface, an overbuilt surface to be trimmed must be a ruled, approximately developable surface, i.e., a ruled surface in which all surface normals on any ruling are parallel. Subsequently, the user then follows the normal trim surface steps; i.e., sketching a profile on the ruled surface, generating the (sub)surfaces on both sides of the profile (i.e., the label surface and the portion of the surface to be trimmed away), trimming the label surface and blending other surfaces to the trim profile.

Note that the trimmed away surface portion is hidden from normal viewing (i.e., it is no longer a part of the visible model).

The following procedure may be provided for generating a label surface. At a high level, the steps for this procedure are:
(i) Make sure the surface is ruled. That is, the user interface supports automatic modification of user selected profiles so that these profiles satisfy 4.3.1 (i) and (ii). In particular, to perform this step, the following substeps are performed:
(ii) The user sketches a boundary profile on the surface defining the bounds of the label;
(iii) Construct a graphical representation of a label (i.e., a ruled surface having text, artwork, and/or designs thereon);
(iv) Allow the user to graphically apply the label representation to the label surface (or a representation thereof). In particular, the user interface for applying the label representation may automatically attach the label representation to the label via a grouping type of operation so that the label representation maintains its position on the label surface during, e.g., label surface rotations, translations, scaling operations, etc.; and
(v) Allow the user to undo the design when the label surface and/or the label is not satisfactory.

4.3.1.2. Modification of a Label Surface

Modification of the label surface components is somewhat different than those of a trimmed surface.

The portion of the watershed profile that is a straight line segment is constrained to remain straight.

The boundary opposite of the watershed (the "other side", of the parent ruled surface) cannot be modified. It is simply a straight line segment between the top and bottom boundaries. The top and bottom boundary profiles can be modified. They are constrained so no additional free profile markers can be inserted on them. Also, the profile marker at the end away from the watershed is constrained to move only to maintain a ruled surface. It can be extended (extrapolated along the same curvature) and the angles at its endpoints can be adjusted—again, as long as it maintains a ruled surface.

4.3.1.3. Deleting of a Label Surface

Deleting a label surface removes the constraints on all of the profiles used in creating the label surface. Additionally, all of the construction geometry for the label surface that is invisible to the user will also be deleted. The constraints for maintaining a ruled surface will also be removed. Thus, the remaining geometric objects are then freed from the label surface constraints, and can be modified in ways not previously available.

4.4. Hole Tool User Interface

The present disclosure also provides a user with a novel computational method that helps the user add a hole to a geometric model (such as for adding a handle to grasp to a non-handled bottle). The information required to add a hole to a model using this procedure includes: a loop of profile segments on a front surface, a loop of profile segments on an opposite back surface, the type of each profile in a loop of profiles (freeform or trim), and optional profile(s) to shape the interior of the hole.

4.4.1. Creation of a Hole

Figure 21A:
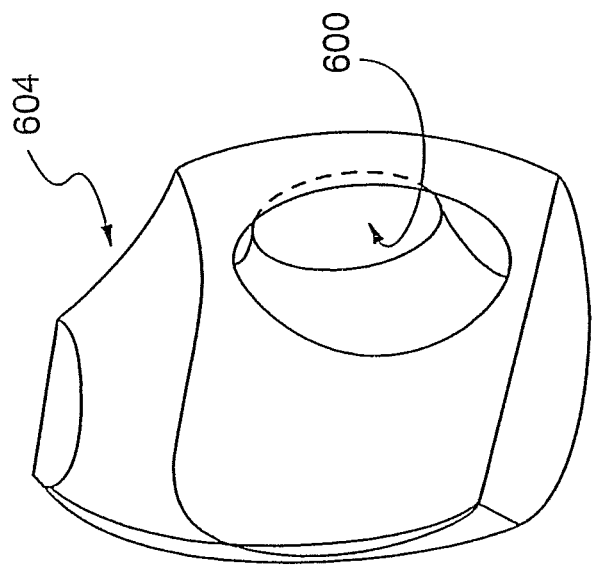
FIGS. 21A-21C illustrate a procedure for creating a hole 600 according to the present disclosure.
Figure 21B:
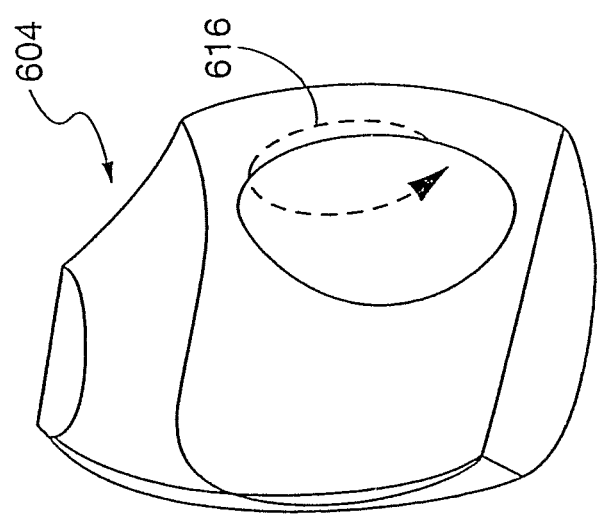
Figure 21C:
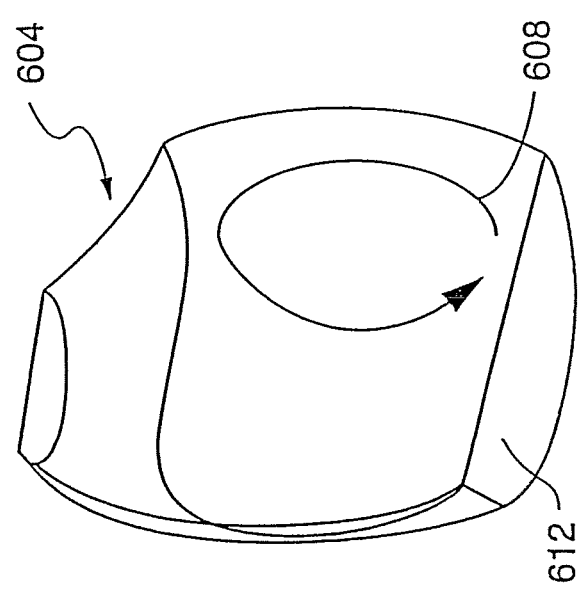

The hole creation tool guides the user through a series of steps to add a hole. FIGS. 21A-21C illustrate the procedure for creating a hole 600 (FIG. 21C) on a geometric object 604 using a computational system according to the present disclosure. The corresponding steps performed for creating the hole 600 are as follows:

(a) Sketch a profile loop 608 on the front surface 612;
(b) Sketch a profile loop 616 on the back surface (optionally project the profile 608 to the back surface).

Note that isocline handles are automatically placed on both profiles 608 and 616.

(c) If one or more of the profiles for one of the profile loops 608 and 616 are freeform profiles, then the user may add new profiles (to complete such a profile loop), and/or profiles merge corresponding to such a loop whereby these profiles are constrained so that they are utilized as if they were a single profile. Accordingly, once the profile loops are constructed, then surfaces may be skinned between the loops to thereby replace the original surface occupying the hole.

If a trim profile loop is specified, the surface region inside the profile loop is trimmed.

If specified, the hole creation procedure uses additional profiles to place and shape surfaces on interior boundaries for the hole. Otherwise, surfaces are skinned automatically between the front and back profile loops.

4.4.2. Modification of a Hole

Modifying a hole is a function of modifying profile markers and handles that make up the geometry of the hole.

4.4.3. Deleting of a Hole

Deleting a hole is also a function of deleting the components that make up the geometry of the hole; i.e., profiles and other geometry for the hole.

4.5. Smoothness Considerations via the User Interface

We consider the order of transition between adjacent surfaces (which meet at the profiles). This section does, however, contain some broader implications for the general theory in Section 2.

4.5.1. Continuous Profiles via the User Interface

Given two profile curves that intersect, derivative continuity across an intersection point may be assured if several conditions are met:

(a) an end point of one profile is coincident with an end point of the other profile (positional continuity);
(b) the blending functions $B_i$ used in generating the profiles (as per FIGS. 26 and 27) are equal at the intersection marker; and
(c) the profile handles at the intersection marker are collinear and equal length.

Tangent directional continuity is a weaker condition that can be satisfied if condition (c) above is changed to:

(c*) the profile handles at the intersection marker are only colinear. The magnitudes of the profile handles may differ in this case.

The designer may intentionally produce a kink at a marker by breaking the collinearity of the two profile handles at the intersection marker. This means that the two profile handles do not have a common direction.

4.5.2. Continuous Surfaces

The notion of tangent plane continuity between surfaces may be defined as follows: for each point p of a boundary between two surfaces $S_1$ and $S_2$, the tangent plane, $T_1(p)$, of $S_1$ at p is identical to the tangent plane, $T_2(p)$, of $S_2$ at p. To achieve tangent continuity between surfaces across a profile boundary therebetween, it is necessary that the isocline handles (for each of the surfaces) at each marker on the profile boundary lie in a common plane with each other and the profile handle at that marker. If this is not done then a kink in the surface along the profile will be created.

Note that when there are two or more surface patches to be generated wherein these patches must be constrained to meet at a common marker point, p, a computational system according to the present disclosure may automatically generate isocline handles, denoted "common direction handles." That is, for each profile, P (having p) used in defining one or more of the surfaces, there may be a corresponding automatically generated common direction handle which is a vector, V, oriented from p, wherein V is perpendicular to the profile handle of the profile P, this profile handle lying in the common plane formed by the profile handles for the other profiles also having the point p. Further note, the user interface supports allowing the user to either display or not display the common direction handles.

Figure 18:
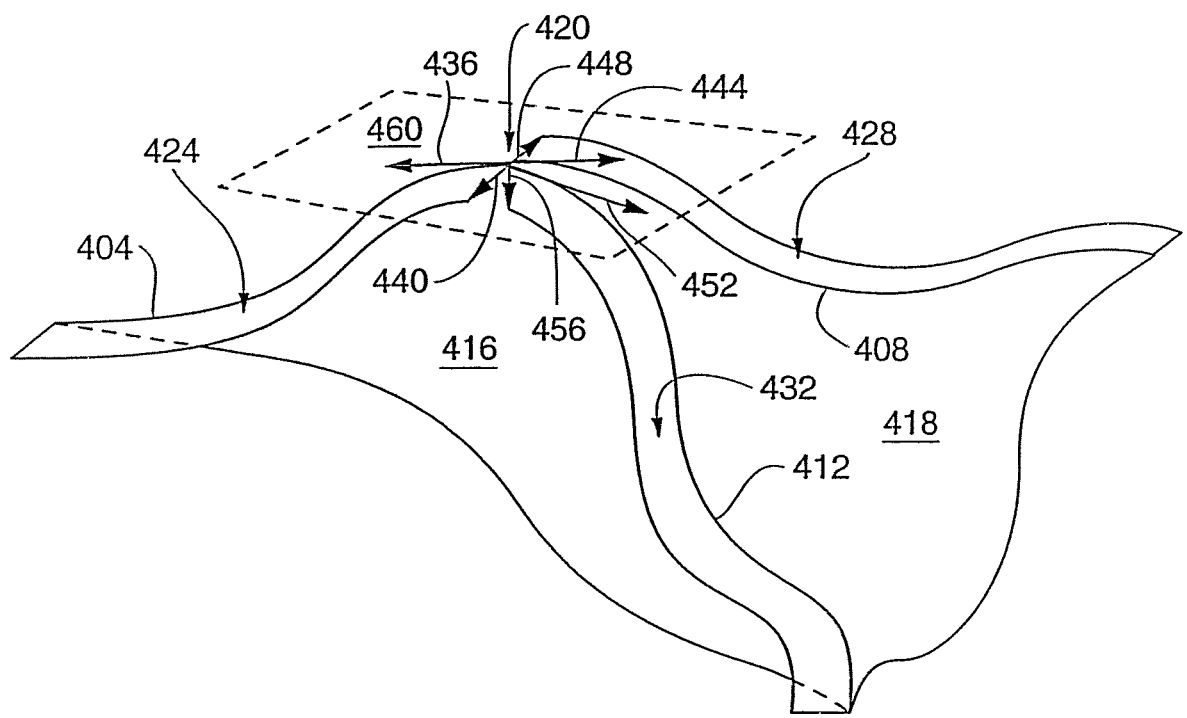
FIG. 18 shows three profile curves 404, 408 and 412 meeting at a profile marker 420, wherein the surfaces 416 and 418 join smoothly at the marker 420 due to the isocline handles (for the marker 420) being in a common plane 460.

Note that it is not necessary to have profile handles and isocline handles that match for profiles that adjoin at a common marker in order to achieve smooth surfaces there, only that they all lie in a common plane. In FIG. 18, there are three profile curves 404, 408 and 412 for the surfaces 416 and 418. Each of the three profile curves meets at the profile marker 420, and each of the profiles has a corresponding isocline ribbon 424 (for profile 404), 428 (for profile 408), and 432 (for profile 412). Additionally, the profile and isocline handles associated with the profiles 404, 408 and 412 and the marker 420 are:

(i) profile handle 436 and isocline handle 440 for profile 404;
(ii) profile handle 444 and isocline handle 448 for profile 408;
(iii) profile handle 452 and isocline handle 456 for profile 412.

Thus, if the profile and isocline handles 436, 440, 444, 448, 452 and 456 all lie within the plane 460 (indicated by the dashed rectangular portion), then the surfaces 416 and 418 smoothly join at the marker 420.

At any marker, two isocline ribbons are likely to meet in the way that two profiles may meet, that is, two isocline ribbons may have a common isocline handle as an edge for each of the ribbons.

Figure 43:
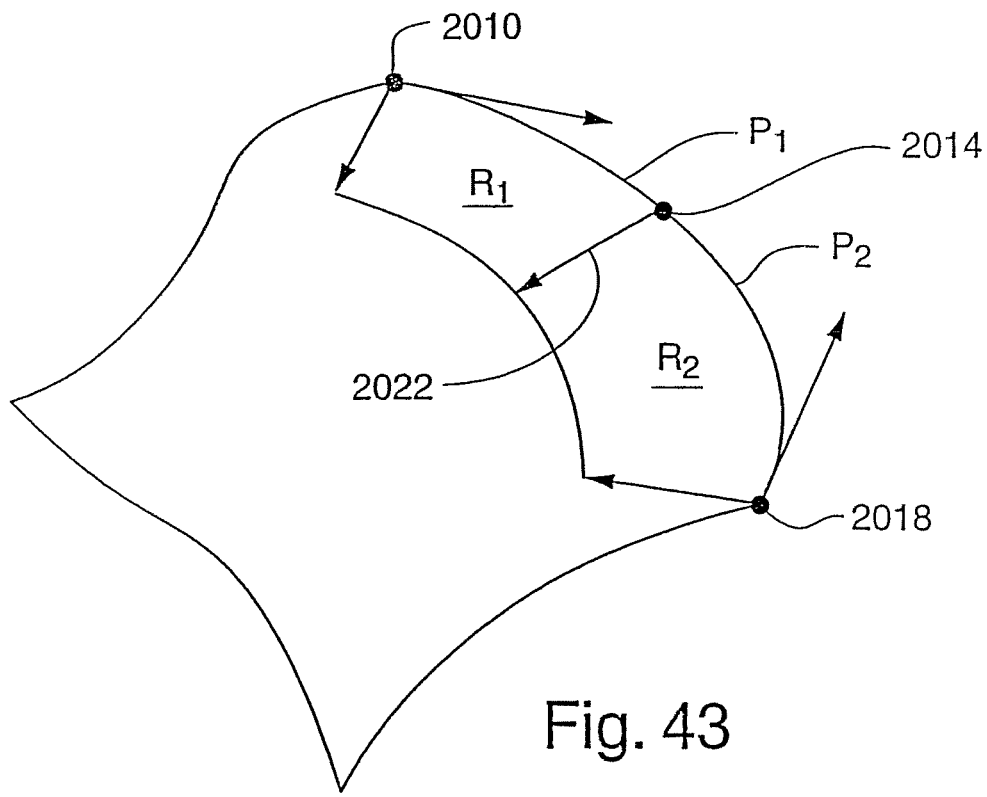
FIG. 43 illustrates constraints on composed profile curves and their corresponding isocline ribbons for providing tangent plane continuity between two blended surfaces $S_1$ and $S_2$.

To achieve tangent plane continuity between different (blended) surface regions $S_1$ and $S_2$ (FIG. 43) joined by a composite profile (having the profiles $P_1$ and $P_2$ therein), not only is tangent continuity across profiles $P_1$ and $P_2$ needed, but tangent continuity between adjacent ribbons $R_1$ and $R_2$ is also needed. That is, for the profiles $P_1$ (between markers 2010 and 2014) and $P_2$ (between markers 2014 and 2018), the respective ribbons $R_1$ and $R_2$, when thought of as surfaces, must be tangent plane continuous, and share a common isocline handle 2022. Note that in most cases, tangent continuity between ribbons is equivalent to tangent continuity between profiles and tangent continuity between ribbon boundaries that is required for smooth transitions across surface patch boundaries. Moreover, the user interface of a computational system according to the present disclosure provides techniques for assuring tangent plane continuity between ribbon boundaries wherein these techniques are substantially identical to those used for assuring tangent plane continuity between profiles. Thus, the present invention can provide tangent plane continuity between adjacent surfaces generated from isocline ribbons according to the present disclosure. In some circumstances, it is possible to break the continuity of composite ribbons intentionally, thereby causing a crease across the surface generated from the ribbons wherein the crease does not correspond with a coincident profile along the crease. However, in some embodiments of the present disclosure, an "implicit profile" can be created that is coincident with the crease.

4.5.3. Curvature Continuity

The visual quality of a surface depends not only on tangent plane continuity, but also on higher order derivatives. A user can be acutely sensitive to discontinuous changes in surface curvature, especially if the surface is rendered with specular highlights or reflected texture mappings, which is common in simulating realistic scenes. The user may perceive a distracting visual artifact known as a "Mach band." Accordingly, raising the order of continuity between transitions to that of curvature continuity ameliorates this.

Analysis has shown that the curvature of the surface defined by Formula (1) or Formula (4) depends on the second derivatives of the $B_i$ and the $S_i$. The dependencies of the $B_i$ are non-trivial and it is advantageous to choose the blending functions so that their second derivatives are zero and let the surface functions $S_i$ determine the curvature. The cosine squared function of Section 2.1 fulfills this condition. There also exist certain quintic polynomials that are satisfactory. For example, the polynomial $B_1(x)$ of Formulas (3).

If the curvature of a blended surface generated from Formula (1) or Formula (4) depends only on the $S_i$ (e.g., $B_i''=0$), it is then possible to raise the curvature order between the bounding surface patches $S_i$ analogous to the methods in the previous section for achieving tangent continuity. To do this, simply define the corresponding profiles and isocline handles so they match in their second derivative at each marker along the profile boundary. Note, however, that each profile handle may be considered as a linear function of one parameter and therefore has a zero second derivative. Thus curvature continuity is achieved; albeit by making the curvature across the profile "flat," i.e., zero. This is useful at points where there is an inflection point on the profile, but can be undesirable elsewhere. To rectify this situation, the linear handles may be replaced with curved ribs, such as parabolic arcs. Accordingly, the handles now become arcs, and at the markers, the curvature is made to match that of the given arc. By extending the concept of providing a nonzero curvature to all handles, e.g., profile, isocline and boundary handles, along with the zero second derivatives of the blending functions and the effects of the Mach banding can be mollified.

4.5.4. G1 Continuity Using Roll, Yaw and Magnitude

The present disclosure also provides a user interface method to specify handle vectors (e.g., isocline handles) relative to a corresponding profile curve, wherein G1 continuity (as defined in the Definitions herein above) between surfaces joined together by the profile is assured. This method, which is denoted herein as the roll-yaw method, specifies a vector V in terms of three scalar terms called roll, yaw and mag (magnitude), wherein roll and yaw are determined at a point P on a curve using the tangent vector T at the point P, and a vector N normal to the curve at the point P. The yaw component of the vector V represents the angular deviation from T at P. For instance, if the vector V is in a direction perpendicular to T, the yaw value (in at least one framework) is 0°, and if the vector V at P is in the same direction as T, then the yaw value is 90°. Regarding the roll component of the vector V, this scalar represents the amount of angular rotation about T as the axis of rotation, and wherein the baseline axis for measuring the angle is the vector N at P. Accordingly, the vector N represents 0° of roll and the rotational range extends from −180° to 180° using the right-hand rule, as one skilled in the art will understand. Regarding the magnitude component of vector V, this is simply the length of the vector V. Note that any vector expressed in terms of three-dimensional Cartesian coordinates can be transformed one-for-one into the roll, yaw, mag notation for a given T and N.

Note that the vector N may be selected from among vectors in the plane normal to T. However, this does not precisely define N. Thus, several methods may be used to define N. A first such method for defining N is simply to choose a constant vector VC and then determine N by the following equation: $N=T \times VC$. This method, however, produces an undefined value for N when T and VC are colinear. To provide appropriate values for N where this equation yields a zero vector, N can be approximated in a topological neighborhood of the colinearity. Alternatively, in a second method of generating N, the Frenet-Serrat frame of the underlying curve may be chosen, as one skilled in the art will understand. However, the Frenet-Serrat frame may be discontinuous at inflection points along the curve. Accordingly, the present disclosure provides a method for creating a minimally rotating reference frame for a complex (i.e., three-dimensional) curve that obviates difficulties in defining the vector N regardless of the orientation or shape of the curve and its tangent vector T.

Figure 44:
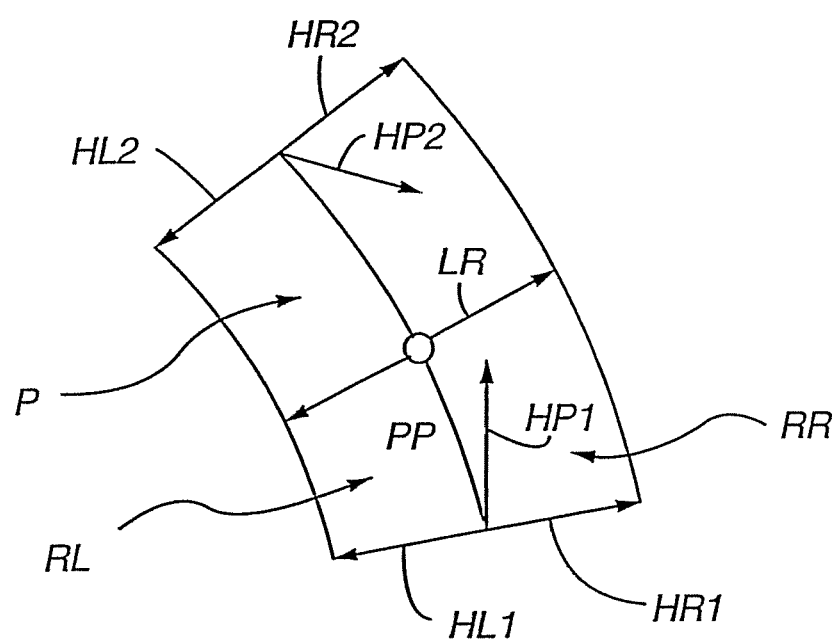
FIG. 44 shows a profile P, associated isocline ribbons RL and RR, and various handles used in describing the conditions for achieving G1 continuity on P.
Figure 45:
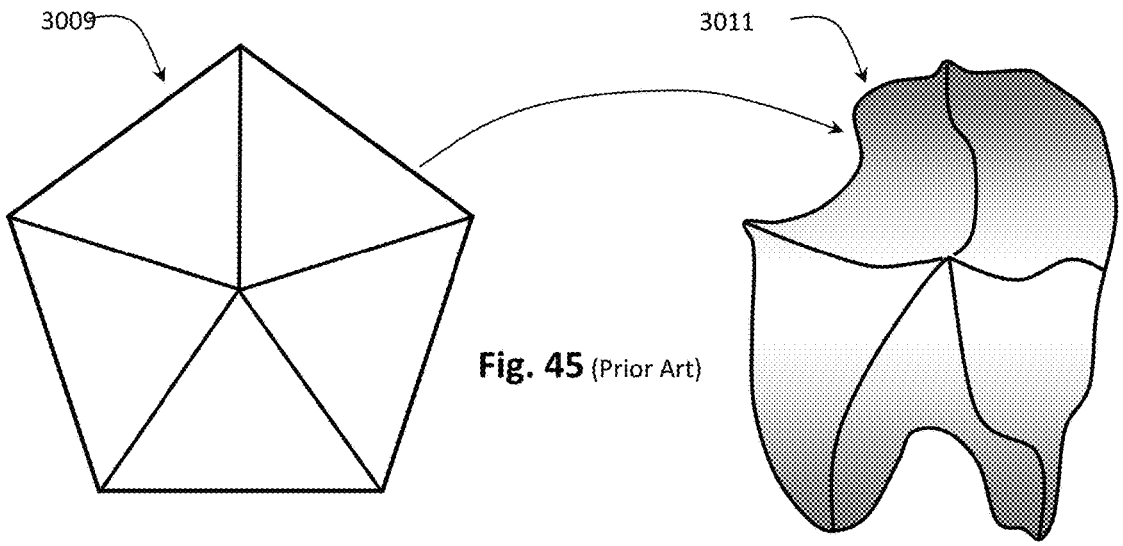
FIG. 45 illustrates a prior art mapping of a pentagon 10 into an object surface 11 for the dividing of a 5-sided patch into five 3-sided patches.
Figure 46:
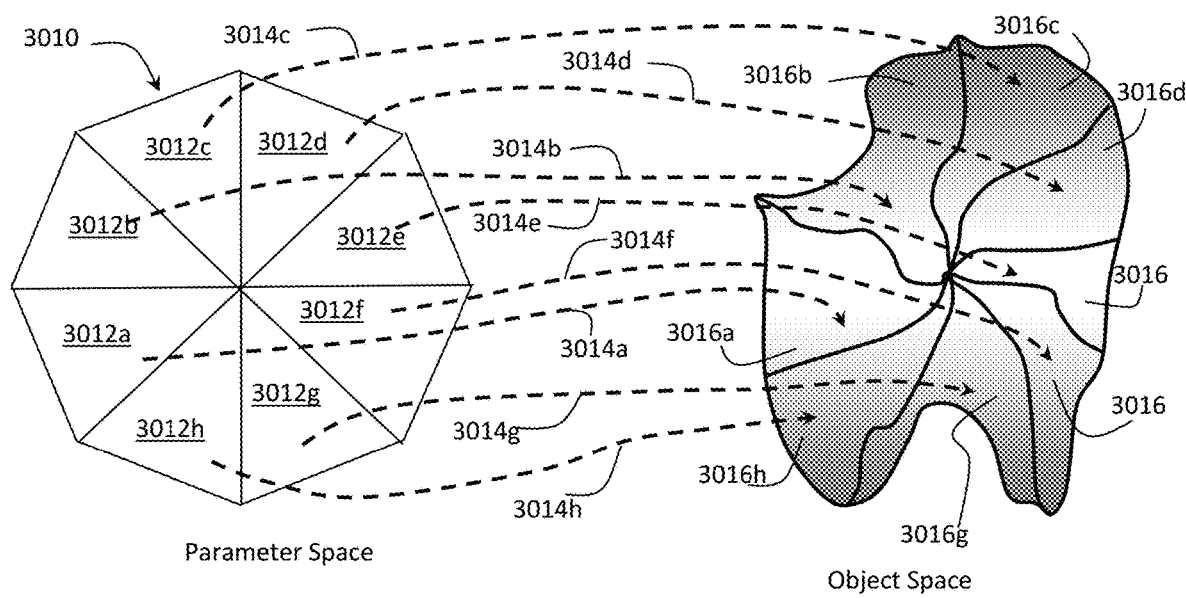
FIG. 46 provides an illustration of the subdivision of an octagon in parameter space into eight triangles, and the mappings of each such triangle into object space according to the present disclosure.

As previously mentioned the roll-yaw method provides a novel way to achieve G1 continuity across a profile. As an example, consider the geometry illustrated in FIG. 44, wherein a profile P along with left and right isocline ribbons LR and RR are shown. Each of the isocline ribbons LR and RR has two corresponding isocline handles at its ends, i.e., HL1 and HL2 for LR, and HR1 and HR2 for RR. Assuming the profile P endpoints have handles denoted HP1 and HP2, for any point pp on the profile, continuity across the profile for surfaces bounded thereby is determined by the interpolated isocline values IL and IR. Further, IR is interpolated (according to the techniques of the present disclosure) from HR1 and HR2, and IL is interpolated from HL1 and HL2. Thus, one skilled in the art will understand that for G1 continuity across the profile P, IL and IR must at least be in opposite (colinear) directions. Further, it can be shown by one skilled in the art that if IR and IL are formed using a cubic Hermite interpolation between HL1 and HL2 for IL, and, HR1 and HR2 for IR that the conditions for G1 continuity are that HL1 and HR1 must be equal and opposite vectors. Further, the same must be true for HL2 and HR2. However, if instead of interpolating the isocline values IL and IR in Cartesian space, the interpolation is performed in (roll, yaw, mag) space, G1 continuity can be achieved with a less strict condition, namely, that the roll value of HL1 and HL2 must be the same. Accordingly, this is equivalent to saying that HL1, HR1 and HP1 must be no more than coplanar (with the same being true for HL2, HR2 and HP2) in order to guarantee G1 continuity everywhere on the profile P. Further, note that similar conditions may be imposed if the isocline handles are curved rather than straight. In particular, tangent vectors to the isocline handles at their common points with the profile P may be used in place of any corresponding isocline handle vector represented in FIG. 44. Thus, as one skilled in the art will appreciate, computational steps can be provided that embody the roll-yaw method for, if necessary, converting from Cartesian vectors to roll, yaw, mag vectors, and then assuring that the above described coplanar constraint is satisfied for guaranteeing that surfaces are G1 continuous across the profile P.

4.6. Embedding Models within Models

The present disclosure allows parts of a surface bounded by profiles to be designed separately from one another. For example, a triangular portion of a surface may be designed as a free standing surface model. That is, a designer may add profiles and isocline ribbons as desired until a satisfactory design of the model is obtained (using barycentric mappings as one skilled in the art will understand). Afterwards this piece may be distorted, rotated and fit into a triangular portion of another model. Hence, a finely detailed model may be designed and embedded into another model. By maintaining links this process can be used for level of detail management. That is, for example, when the model is viewed from a distance, the detailed portion is unneeded for display, but as the viewer moves closer the embedded object is linked in for the extra detail it affords. Two examples of types of embeddings follow in the next subsections.

4.6.1. A Rounderizing Technique

Figure 19:
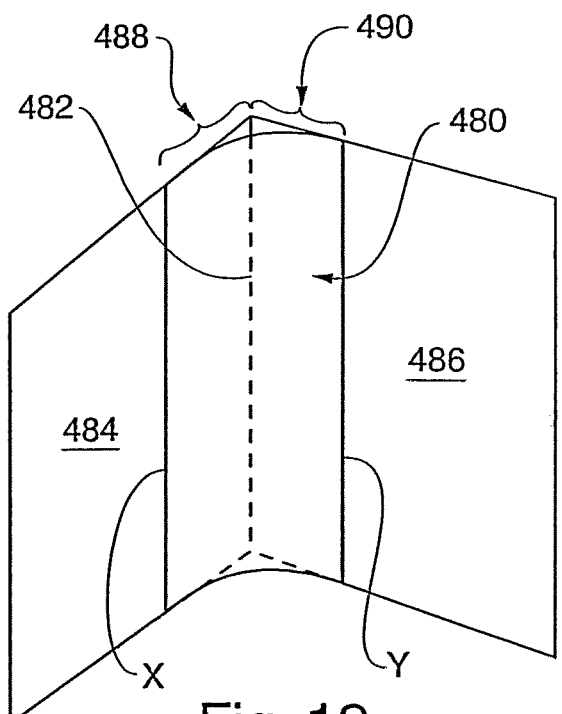
FIG. 19 shows profile curves x and y that define a surface 480 which forms a fillet between surfaces 484 and 486. Typically, profiles x and y are defined using distances 488 and 490 from the intersection curve 482 of surfaces 484 and 486.

Referring to FIG. 19, a small blended surface rounds an edge 482 between two intersecting surfaces 484 and 486. This blended surface 480 is blended from the thin surface strips 488 and 490 whose pre-images are a "small" offset from the pre-image of the edge 482 in parameter space. This process is a straightforward application of Formula (1) where the two surfaces 484 and 486 are blended using their common parameter space (not shown).

The new surface types lead to new evaluation routines that are especially efficient in special cases described.

5. Evaluation

We will first consider the evaluation of the two-edge blend, recognizing that other forms derive from this fundamental form. Because of its importance we will recall Formula (1), which is $$S(u,v)=S_1(u,v)B_1(u,v)+S_2(u,v)B_2(u,v). \quad (1)$$

There are both blending functions $B_i$ and isocline ribbons $S_i$ to determine when evaluating the surface S. The blending function is calculated as a univariate function of distance in the parameter space. As discussed in Section 2, the evaluation of the distance function varies considerably depending on how complex the pre-image is in parameter space. Once determined, the actual blending value can be calculated by a simple table look up; that is, the blending functions are tabulated to a sufficiently high resolution and stored in memory where they can be indexed by the input variable. Consider the function of $B_i(x)$ of Formula (3). Evaluate this function at x=0, 0.01, 0.02, . . . , 0.99, and 1. These 1001 values are stored as an array. When a point X is given, it is used to locate the nearest point in the array, e.g., between 0.52 and 0.53. Subsequently, B(0.52) or B(0.53) are used as the function value.

Figure 20:
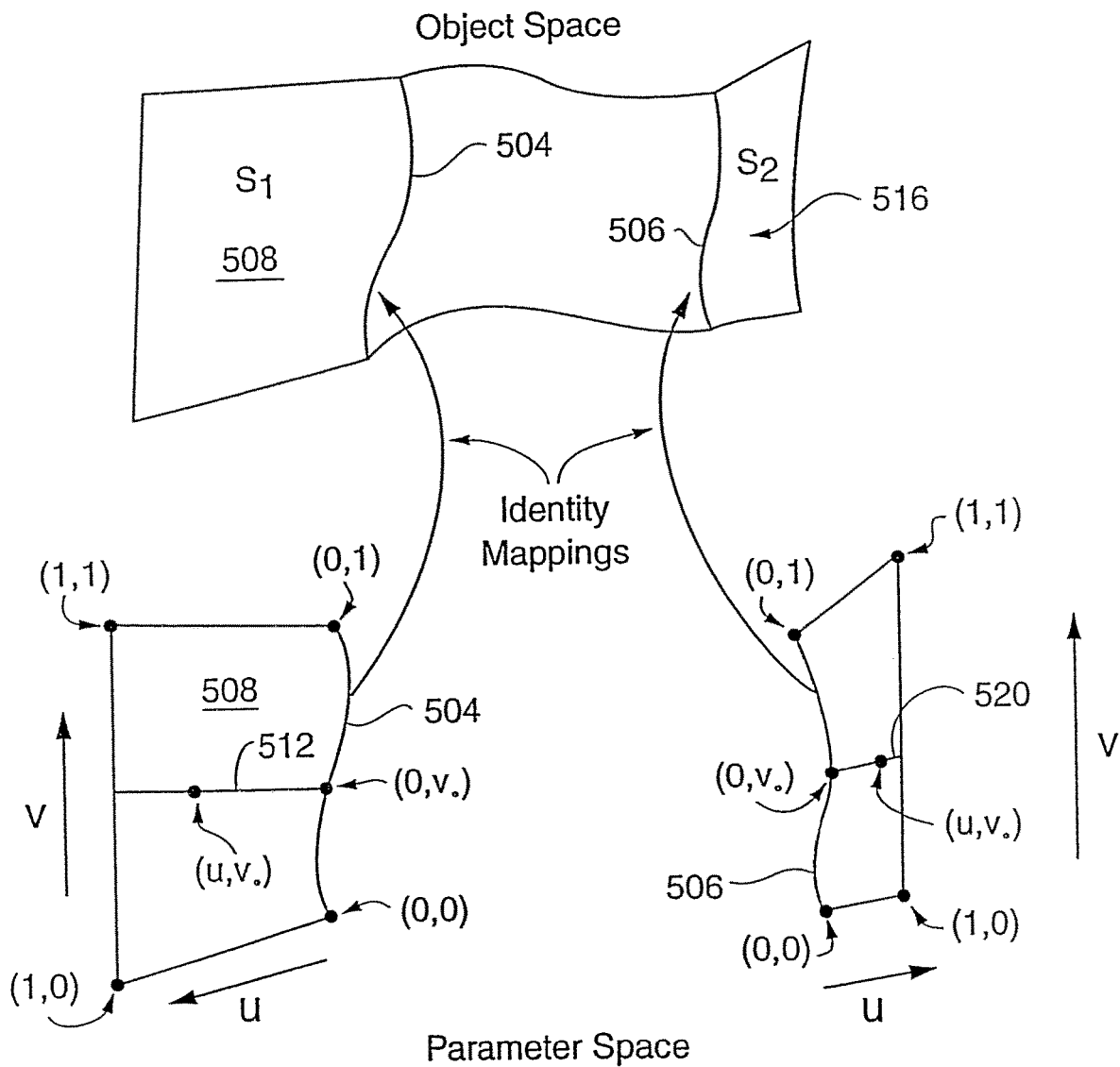
FIG. 20 illustrates one embodiment for computing a blended surface from isocline ribbons 508 and 516 according to the present disclosure.

There are many techniques that may apply based on what the distance and isocline ribbon functions are. The present discussion is focused on a method that assumes a simple model computationally, but nevertheless, retains considerable design flexibility. The isocline ribbons 508 ($S_1$) and 516 ($S_2$) will be given as in FIG. 20. These are parameterized from 0 to 1 in both u and v parameters. For each fixed value of v along the profile line 504, if the corresponding picket on isocline ribbon 508 is a straight line segment (e.g., line segment 512), the isocline ribbon is a ruled surface as one skilled in the art will understand. Accordingly, the parameter u provides a distance-like measurement along the ruling where the point (u,v) is found. Assume that each of the isocline ribbons 508 and 516 are ruled surfaces. Further assume that the pre-image of each of the profiles 504 and 506 in parameter space are the profiles themselves and the distance-like measurement is the parametric u value of a point $(u,v_0)$ on the $v_0$ ruling of the isocline. Because the isocline ribbons 508 and 516 are ruled surfaces, for the constant $v_0$ parameter we can scan out a set of equidistant points along line segments 512 and 520 by simply adding the appropriate offset vector to the previous value. The initial value is $S_i(0,v_0)$. The offset vector is obtained as $$T_0=[S_i(1,v_0)-S_i(0,v_0)]/n, \quad (10)$$

where n is the number of points desired on the ruling line to scan from one isocline ribbon (pre-image) edge to the opposing other edge.

If we impose the restriction that the blending functions are a partition of unity, i.e., $B_1=1-B_2$, which is desirable from a design perspective, then the Formula (1) yields $$S(u,v)=[S_1(u,v)-S_2(u,v)]\cdot B_1(u,v)+S_2(u,v) \quad (11)$$

In one embodiment, this form and with the previous simplifications, it is seen that each point requires three vector adds (for $S_1$, $S_2$ and the "+"), one table look up (for $B_1(u,v)$) and one scalar multiply. This is after initialization which consists of finding each $S_i(0,v)$ and computing $T_0$, the offset vector (using Formula (10)). To scan out a set of points on S, one simply increments through the parameter v, and then computes points along the rulings in u. In the case of the defined four-edge surface (as in Section 2.2), some $S_i$ are as the two edge case above, but the others blend longitudinally across the ribbon first. Specifically, in FIG. 34 the v-loft case is the same as FIG. 35 with re-labeling, while the u-loft of FIG. 34 is a horizontal blend of isocline ribbons. The four-edge surface results from the barycentric blend of all four.

Figure 33:
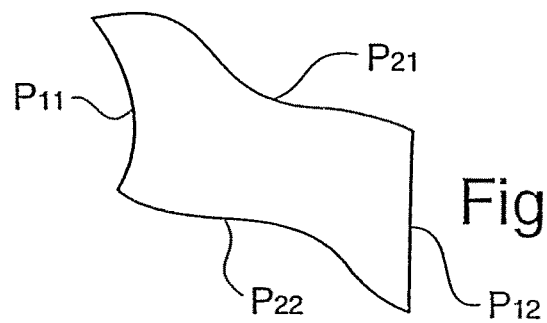
FIG. 33 shows four profile curves $P_{11}$, $P_{12}$, $P_{21}$ and $P_{22}$ wherein it is desired to generate a surface, bounded by these profiles and wherein the surface is defined by these four profiles (and their associated isocline ribbons).

In FIG. 33, four profile curves $P_{11}$, $P_{12}$, $P_{21}$ and $P_{22}$ are shown between which a surface is desired to be placed. In FIG. 34, the profiles $P_{11}$ and $P_{12}$ together with their corresponding respective isocline ribbons $R_{11}$ and $R_{12}$, are used to create the blended surface $S_1$.

While $S_1$ evaluates exactly as the two-edge case already described, the generation of $S_2$ (FIG. 35) differs because the u and v parameters are reversed. In this case, the straight line segment on the isoclines $R_{21}$ and $R_{22}$ corresponds to fixing u and scanning in v; a situation which is incompatible to rapid scanning. However, it is desirable to fix just one parameter and scan the other in both FIGS. 34 and 35. In one embodiment, this can be resolved by defining the isoclines $R_{21}$ and $R_{22}$ differently. That is, each such ribbon becomes a blend of two ruled surfaces defined by simple user inputs. For example, consider isocline ribbon $R_{21}$. It may be defined by blending two bilinear surfaces 1950 and 1952 in a manner similar to the surface generation techniques described in section 2.2 and illustrated in FIGS. 37 through 39. That is, the edges of the bilinear surfaces 1950 and 1952, that are tangent on the profile $P_{21}$, are the profile handles 1956 and 1960; the boundary handles 1964 and 1968 are tangent to the ribbon boundary 1972 and form the opposite edges of the bilinear surfaces. The other two line segments 1976 and 1980 are user inputs.

It is now possible to fix v in the second (u-loft) as well and scan by adding a single vector offset. This effort produces points on the isocline ribbons, $R_{21}$ and $R_{22}$, each at the identical cost of producing points on the v-loft. Additionally, we must blend the new points to compute the point on $S_2$. In operation counts, there are, therefore, eleven vector additions, five scalar multiplies and one table look-up. The additions include three for the v-loft, three each for the u-loft isoclines, one for blending these isoclines and one for blending the two lofts.

For the general N-sided surface it is first necessary to compute-a distance on each ribbon. The parameters are calculated using the N-sided parameterization technique from Section 2.2. These distances are then plugged into the blending functions of Formula (6). They are adjusted so they vary from 0 to 1.

The parameters for the ribbons must be set from the distance so given. That is, one parameter will be the distance (from the profile). The other parameter can be deduced by determining where the parameter line of FIG. 12 crosses the edge of the N-sided polygon. It is assumed that the polygon has edges of length 1. After these parameters are figured then Formula (4) has all constituents needed for calculation.

6. Conversion of N-Sided Object Space Surfaces to Standard NURBS Form

Figure 47:
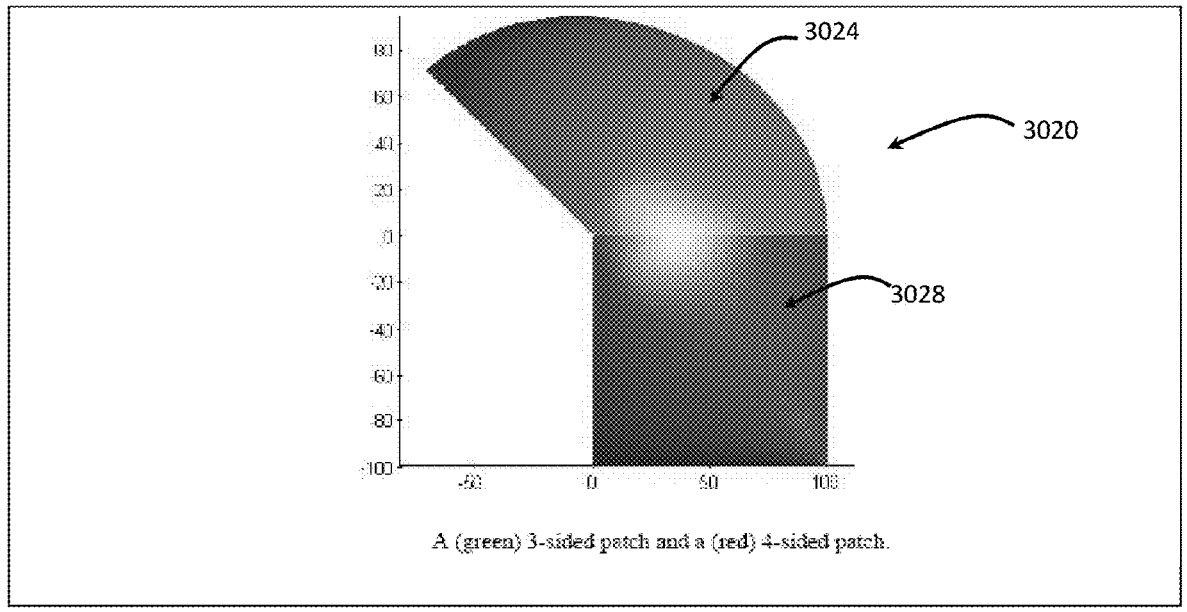
FIG. 47 illustrates a surface 3020 subdivided into a (green) 3-sided patch and a (red) 4-sided patch according to the present invention.
Figures 48A, 48B:
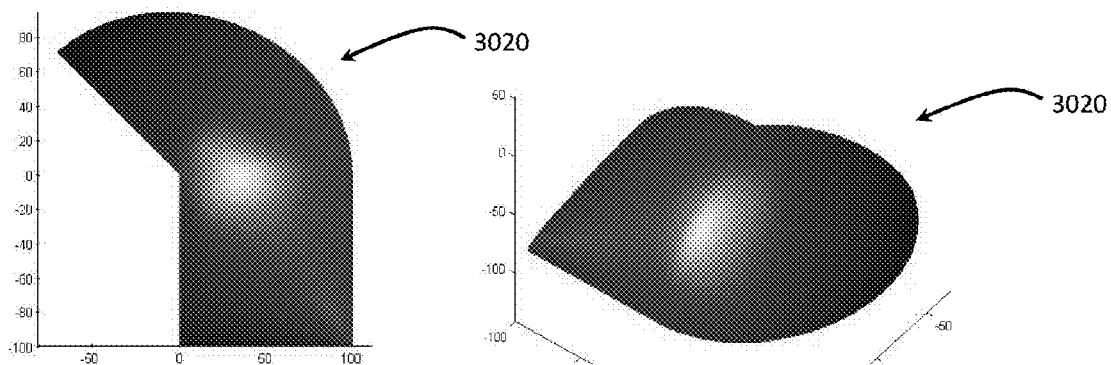
FIGS. 48A and 48B show the smoothness of the surface of FIG. 47, wherein mach bands are shown.

Referring to FIGS. 47-50, these figures show the same image surface 3020 generated by a novel N-sided surface generation technique, wherein the green 3-sided patch 24 (FIG. 47) is of polynomial degree 8, while the red 4-sided patch 3028 (FIG. 47) is of polynomial degree 10; both of respectably low degree. In particular, it is believed that surfaces generated by polynomials of degrees such as these do not pose difficulties for engineering applications such as computer aided part/model design (e.g., of auto bodies, bottle shape, prosthetics, aircraft frames, ship hulls, animation objects such as faces, etc.). Note that the 4-sided patch 3028 has a sharp corner at the lower right vertex (FIG. 47). Of particular interest is where the patches abut with identical tangency. Moreover, the surface 3020 is visually watertight. Moreover, note that an embodiment of this novel N-sided surface generation technique is provided in Appendix A hereinbelow which shows MATLAB code for implementing this technique.

Figure 49A:
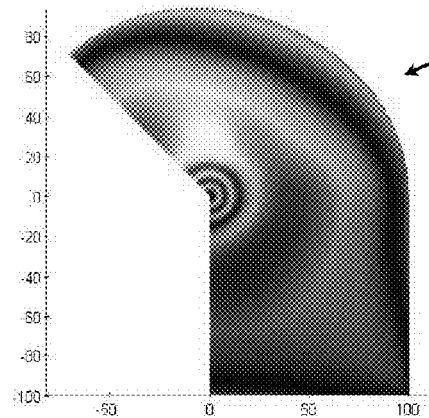
FIGS. 49A and 49B show isophote strips illustrating the smoothness between both patches shown in FIG. 47.
Figure 49B:
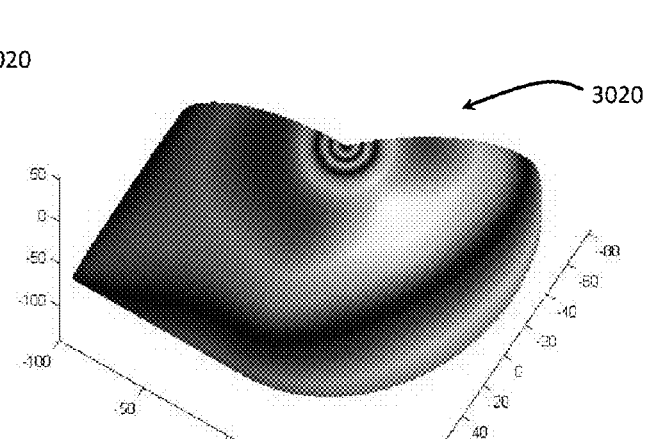

Referring to FIGS. 49A and 49B, these figures show the smoothness across the boundary between the two patches 3024 and 3028 of FIG. 47. In particular, isophote stripes are displayed on the surface, wherein the isophote stripes extend across the boundary joining both patches 3024 and 3028. As can be seen, the patches appear to smoothly deform into one another across their mutual boundary.

Note that isophotes paint all parts of the surface that have an equal angle to the direction of a spot light with the same color. They are very sensitive to discontinuities and unwanted variations in the surface. Auto stylists use them to help shape surfaces with good reflection properties. The sharp point at the lower right vertex is apparent with this method of rendering. Notice especially the smooth transition between the patches.

Figure 50:
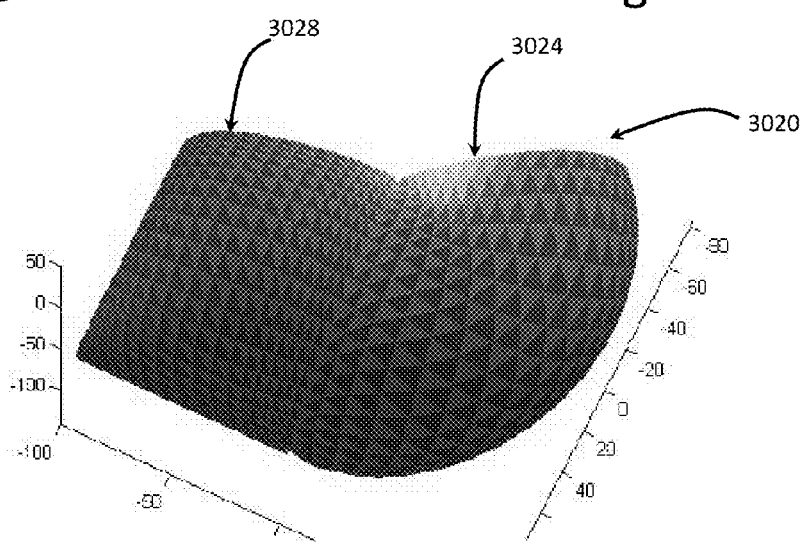
FIG. 50 use triangular texture tiles to show the even parameterization of the 3 and 4-sided patch of the surface 3020.

FIG. 50 renders the patches 3024 and 3028 with alternating red and green triangular facets, wherein the variation in the parameterizations across the surfaces of both of the 3-sided patch 3024 and the 4-sided patch 3028 are illustrated. In particular, each of the red and green triangles correspond to an area extent in the parameter space that is of identical size and shape, and, the smoothly deforming contour curves defined by the triangles are the images of uniformly spaced parallel lines in the parameter space.

6.1 Low Degree Patch Description

To make exposition of the novel surface generation technique simpler an illustrative surface S(u,v) is defined hereinbelow that interpolates to object space boundary curves, i.e., the object space surface S(u,v) defined by Formula (12) below has interior points that are smoothly interpolated from the surface's boundary curves, and the image (in object space) of a polygon in the domain parameter space for the surface S(u,v) matches exactly these boundary curves. Note, such a surface may be generated according to the disclosure in U.S. Pat. No. 7,236,167 incorporated herein by reference which describes the surface generating Formula of (12) below.

Using Formula (12) below, a technique for generating N-sided patches can be provided. Moreover, by matching patch tangency constraints, a $G^1$ composite surface can be generated.

Referring to Formula (12) below, for points (u,v) of a parameter space object (e.g., a polygon), the corresponding object space surface S(u,v) may be defined:

$$S(u,v)=\Sigma_{i=1,N}[f_i(t_i(u,v))\Pi_{j=1,N} W(d_j(u,v))] \quad (12)$$

where the functions $d_j(u,v)$ are distance-like functions in parameter space from the $j^{th}$ parameter space polygonal edge as described in U.S. Pat. No. 7,236,167, and wherein a possible additional weight function W(x) may be:

$$W(x)=x^2, \quad (13)$$

and a function for each of the boundary curves $f_i$ through which the surface S(u,v) must pass (each such curve also referred to as a "feature curve") is:

$$f_i(t)=RW(t)L_i(t)+(1-RW(t))R_i(t) \quad (14)$$

for the weighting function R W that is smooth and satisfies the conditions that:

$$RW(0)=1, RW(1)=0, RW'(0)=Q \text{ and } RW'(1)=0.$$

An example of such a function is:

$$RW(t)=(1-t)^2/(2t^2-2t+1). \quad (15)$$

Figure 51:
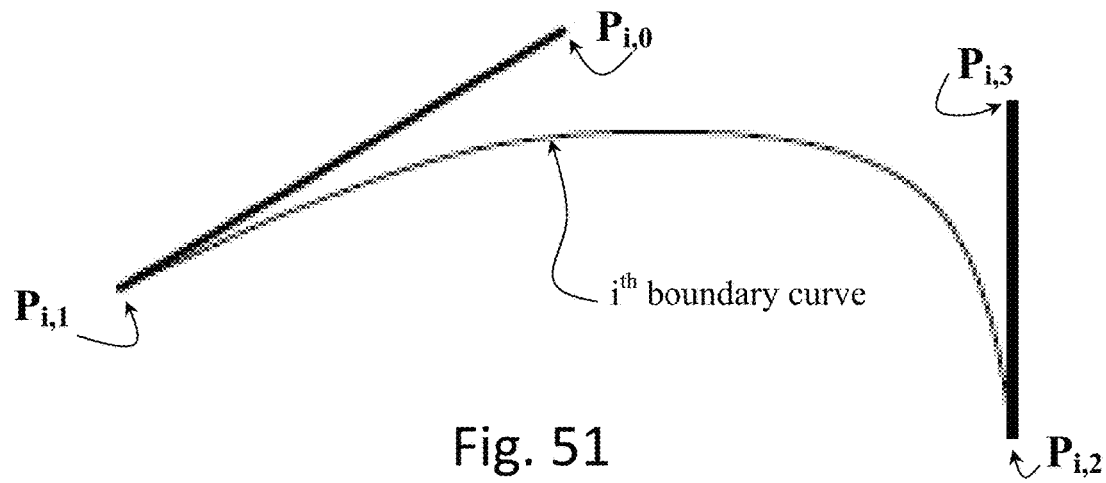
FIG. 51 shows a boundary curve generated linearly from interpolating points.

Also in (3), $L_i$ and $R_i$ may be defined as the following linear interpolants $$L_i(t)=(1-t)p_{i,0}+tp_{i,1}, \text{ where } 0 \leq t \leq 1 \quad (16)$$

and $$R_i(t)=(1-t)p_{i,3}+tp_{i,2} \text{ where } 0 \leq t \leq 1 \quad (17)$$

with points $\{p_{i,0}, p_{i,1}, p_{i,2}, p_{i,3}\}_3$ for defining the $i^{th}$ boundary curve $f_i$ of a patch (in object space) as in FIG. 51, wherein the $i^{th}$ boundary curve and these points are the end points of, e.g., profile handles as disclosed in U.S. Pat. No. 7,236,167. Note that by making such boundary curves $f_i$ sufficiently small in length, any arbitrary curve in object space can be approximated to a predetermined tolerance as described in U.S. Pat. No. 7,236,167.

Figure 52:
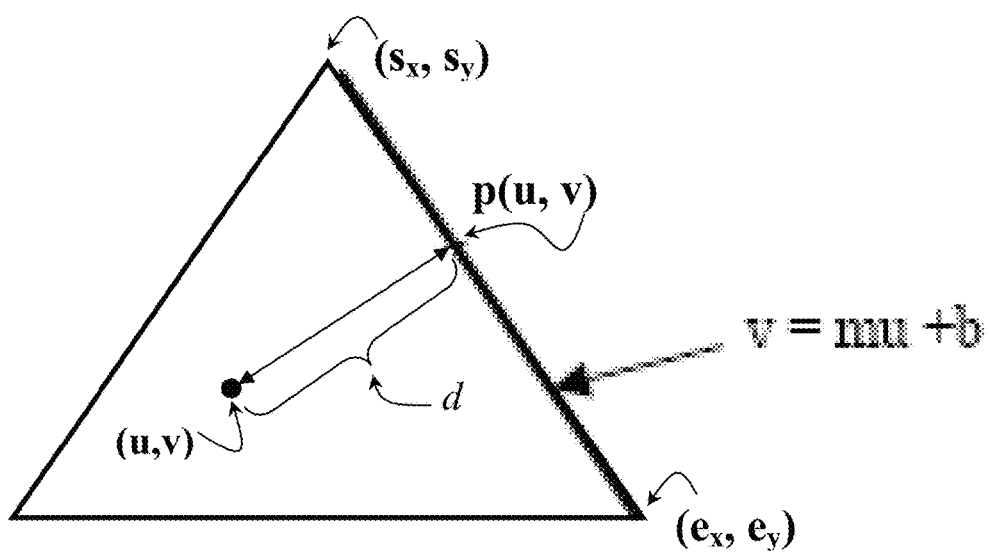
FIG. 52 shows a configuration for computing the parameter functions.
Figure 53:
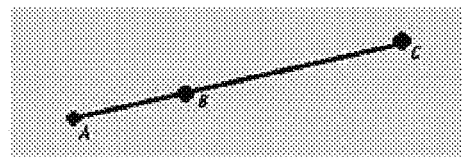
FIG. 53 shows a line with three points A, B, and C thereon, wherein f(u)=A+u(B−A) and g(v)=B+v(C−B), and wherein f(u) and g(v) are obviously $C^0$ continuous at the join B, but may not be $C^1$ continuous at B.

Furthermore, the parameter functions $t_i(u,v)$ and $d_i(u,v)$ of Formula (12) above, are each derived from the $i^{th}$ edge of a base polygon in (u,v) parameter space as shown in FIG. 52. Note that as shown in FIG. 52, the base polygon may be a triangle. However, such a base polygon may be a quadrilateral for the 4-sided case, a pentagon for the 5-sided case, and so forth.

The "t-value" function of (1) may be defined as follows $$t_i(u,v)=((s_x-u)(s_x-e_x)+(s_y-v)(s_y-e_y))/((e_x-s_x)^2+(e_y-s_y)^2) \quad (18)$$

Note that Formula (18) computes $t_i(u,v)$ to be the parameterization value (between 0 and 1) for a point p(u,v) (FIG. 52) on the $i^{th}$ side of the base polygon in parameter space, wherein p(u,v) is the perpendicular drop point or projection of (u,v) onto the side as is shown in FIG. 52. Moreover, $t_i$ is linear in u and v.

Various alternative computations for $t_i(u,v)$ are also within the scope of the present disclosure. In particular, referring again to FIG. 52, $t_i(u,v)$ may be alternatively defined as follows:

$$t_i(u,v)=|(mu+b)-v|, \text{ or, } t_i(u,v)=|(v-b)/m-u|.$$

The "distance" function $d_i(u,v)$ may be defined as follows:

$$d_i(u,v)=(mv+b-u)\sin(\arctan(m)). \quad (19)$$

Note that $d_i(u,v)$ may be considered a distance from (u,v) to the line v=mu+b (FIG. 52) with slope m and v-intercept b. Further note that if the slope m is vertical, then the distance $d_i$ is defined to be b-u. However, various alternative computations for $d_i(u,v)$ are within the scope of the present disclosure. In particular, $d_i(u,v)=[(mv+b-u)\sin(\arctan(m))]^2$ for m not vertical, and $(b-u)^2$ otherwise. However, due to the increased polynomial degree of this alternative embodiment, Formula (19) is preferable. Note that Formula (19) is linear in u and v (low degree) since the sine term is constant for the entire edge.

Although various weight functions (W) and distance functions ($d_i$) may be used for the composition $W(d_i(u,v))$ in Formula (12) above, each such composition function must be 1 when (u,v) is on the $i^{th}$ side of the base polygon, since this condition implies that $(1-W(d_i(u,v)))$ is zero, and accordingly the influence of the other boundary curves is nullified thereby enabling smooth interpolation between surface patches, as one skilled in the art will understand.

The weight function W in Formula (13) may be replaced by RW in Formula (15). Such replacement raises the denominator degree, but not the max degree, which is in the numerator (see below).

The reason for preferring Formula (14) for defining curves over a standard form, such as a Bezier form, is that Formula (14) reproduces exact extrusions of its curves. This is due to the fact that Formula (14) is the curve form of Formula (12) if RW is used instead of W defined in Formula (13). However, Bezier, or any other parametric form could be used as one of skill in the art will understand. Note, the form of RW in Formula (15) was devised to satisfy R W(0)=1, R W(1)=0, and RW'(0)=RW'(1)=0, while being of low degree.

Most distance forms use a square and square root. However, Formula (19) is linear in u and v. The factor sin(arctan(m)) is constant for u and v, and may be only computed once per base polygon edge, thus additionally increasing computational efficiency.

In at least some preferred embodiments, the base polygons for each patch should be determined so that their sides roughly correspond in length to the lengths of the boundary curves.

6.2 Reckoning the Surface Degrees

Starting at the interior of the surface S(u,v) of Formula (12), it can be seen that both the t-value and distance of Formulas (18) and (19), respectively, are linear in u and v; thus each are of degree 1. In Formula (12), each instance of the feature curve function $f_i(t_i)$ of Formula (14) is a sum of two products, where each product is a quadratic function (according to Formula (15)) times one of the linear functions of Formulas (16) or (17). Thus, $f_i(t_i)$ has polynomial degree 3 over degree 2 in parameter t (and accordingly, also in u and v since t may be linear in u and v).

Composing the t-value function $t_i(u,v)$, which as noted above is of degree 1, into Formula (14) does not raise the degree of the resulting function $f_i(t_i(u,v))$. Each product of the weight functions $\Pi_{j=1,N,i\neq j} W(d_j(u,v))(1-W(d_i(u,v)))$ in Formula (12) is multiplied by a corresponding feature curve function, $f_i(t_i(u,v))$. Since the linear distance functions $d_i(u,v)$ adds nothing to the degree of the weights W and (1-W), the weight functions $W(d_i(u,v))$ and $(1-W(d_i(u,v)))$ are each quadratic, i.e., of degree 2. In the case where the parameter space polygon is a triangle, each term $\Pi_{j=1,N,j\neq i} W(d_j(u,v))$ of Formula (12) is the product of two weight factor pairs W(a(u,v)) each of order 4 (in u and v), thereby yielding a polynomial of degree 8. For the rectangular case, each term $\Pi_{j=1,N,i\neq j} W(d_j(u,v)) (1-W(d_i(u,v)))$ of Formula (12) is the product of three weight factor pairs $W(d_j(u,v)) (1-W(d_j(u,v)))$, each of order 4, thereby yielding a polynomial of degree 12. Then we see that the total degree is obtained by the multiplication of the feature curve term $f_i(t_i)$ with the weight term $\Pi_{j=1,N,i\neq j} W(d_j(u,v)) (1-W(d_i(u,v)))$. E.g., a degree 3 over 2 term multiplied by a degree 8 term (for the triangular case), and, a degree 3 over 2 term multiplied by a degree 12 term (for the rectangular case). Multiplying terms adds degrees, so the total degree of Formula (12) will be degree 11 over degree 2 for 3-sided patches and degree 15 over degree 2 for 4-sided patches. Moreover, for a 5-sided polygon (instead of a triangle or 4-sided polygon) the polynomial degree will be degree 19 over degree 2, and for a 6-sided polygon, the polynomial degree will be degree 23 over degree 2.

Accordingly, for an N-sided surface patch where, e.g., N≥7 for the number of parametric polygonal sides for the patch, wherein the patch boundary curves are represented as in Formula (14) above, then such a patch can be effectively approximated as closely as desired by:

Decompose the polygonal domain of the patch into a plurality of polygons, each having a smaller number of sides, e.g., preferably polygons having less than 5 sides; and For each of the resulting polygons from step (a) immediately above, generate a corresponding surface S(u,v) as described above.

6.3 The $G^1$ Surface

Formula (12) above can be expanded in a straightforward way to include continuity of tangency at the boundaries between subpatches sharing a common boundary curve. This is done by replacing the boundary curve $f_i$ in Formula (12) with a lofted surface, or ribbon (RB) defined using the boundary curve $f_i$ and a second curve $g_i$, wherein the surface between these two curves defines the tangency conditions at the common boundary curve between the subpatches. Such ribbons are described in U.S. Pat. No. 7,236,167. In particular, for each of the subpatches sharing the common boundary curve, there is a corresponding ribbon defined by, and having a contour and extent, containing the tangents of the subpatch at the common boundary. Thus, when ribbons for different subpatches of a common boundary are continuous across this common boundary, then these subpatches smoothly and continuous blend into one another.

Such a ribbon for a patch boundary curve $c_i$ (e.g., represented by $f_i(t_i)$ of Formula (14) above) may be defined as follows:

$$RB(s_i,t_i)=(1-s_i)f_i(t_i)+s_ig_i(t_i) \quad (20)$$

where $t_i$ is the t-value parameter in Formula (18), and $s_i$ is related linearly to the distance $d_i$ in Formula (19), such that $s_i$ varies between 0 and 1, e.g., $s_i$ may be:

the same as distance $d_i$, its negative, or in some cases, an affine transformation of $d_i$.

If there is a ribbon for each boundary curve of a (sub) patch, the form of the (sub)patch satisfying desired tangency conditions of the ribbons is:

$$S(u,v)=\Sigma_{i=1,N}[RB(s_i(u,v),t_i(u,v))\Pi_{j=1,N,i \ne j}W(d_j(u,v)) \quad (21)$$

Note that Formula (21) adds one more degree in the numerator, giving:
Degree 16 over 2 for the 4-sided patch.
Degree 12 over 2 for the 3-sided patch.

6.4 Description of the Conversion of the Novel N-Sided Surface Patches into Bezier and/or NURBS
The algorithm:
Step 1: Expand numerator of (10) as a bivariate polynomial (known art).
Step 2: Collect all the coefficients into a matrix M, so that U M V is the polynomial of Step 1.
Step 3: Multiply M by PB on both sides—PB M PB, where PB is the matrix of binomial coefficients.
Step 4: Do Steps 1-3 for the denominator.

The result of this process is a matrix of coefficients Bz that represent the Bezier coefficients of 10. From this conversion to B-splines is known art.

The surface patch needs trimming by the surface functions which are mappings of the base polygon.

7. G2 Surface Models for N-sided Patches

7.1 Patch Description

A requisite for a $G^2$ surface is a $G^1$ surface as one skilled in the art will understand. We therefore begin with a description of a $G^1$ surface, from which we then describe techniques to create a $G^2$ surface.

We start by constructing a plurality of lofted surfaces, $R_i$, according to the following formula:

$$R_i(s_i,t_i)=(1-s_i)f_i(t_i)+s_ig_i(t_i), \quad (22)$$

In Formula (22) hereinabove, the parameter $s_i$ parameterizes the $i^{th}$ loft, where $0 \le s_i \le 1$, i.e., $s_i$ is the distance to the $i^{th}$ footprint $f_i(t_i)$ with respect to u. Each $g_i(t)$ is a user given parametric curve that is used to define the boundary of the loft. We call the loft a "ribbon". With $s_i$ and $t_i$ given as functions of u, we can give the following variation of Formula (22) to obtain the following formula used for computing a $G^1$ surface:

$$F(u)=\Sigma_i[R_i(s_i,t_i))](W_i(u)/\Sigma W_i(u))^2 \quad (23)$$

wherein $W_i(u)$ is $(1/s_i)^p$, p an exponent, and Formula (23) contains Formula (22)

We modify Formula (23) for computing a $G^2$ surface by replacing the curve $f_i$ with a new "ribbon" function $Q_i(t_i(u,v))$ resulting in $$S(u,v)=\Sigma_{i=1,N}[Q_i(t_i(u,v))\Pi_{j=1,N}W(d_j(u,v)/\Sigma_{i=1,N}W(d_j(u,v)) \quad (24)$$

where the functions $d_j(u,v)$ are distance-like functions in parameter space from the $j^{th}$ parameter space polygonal edge, the functions $t_j(u,v)$ are parameter functions, both described in U.S. Pat. No. 7,236,167, and wherein a possible additional weight function W(x) may be:

$$W(x)=x^n, \quad (25)$$

Where n>2, and a function for each of the boundary curves $f_i$ through which the surface S(u,v) must pass is:

$$Q_i(t)=(1-t)^2 f_i+(1-t)tg_i+t^2 h_i \quad (26)$$

with points $\{p_{i,0}, p_{i,1}, p_{i,2}, p_{i,3}\}$ for defining the $i^{th}$ boundary curve $f_i$ of a patch (in object space wherein the $i^{th}$ boundary curve and these points are the end points of, e.g., profile handles as disclosed in U.S. Pat. No. 7,236,167.

Two further user given curves $g_i$ and $h_i$ are constructed in a fashion similar to $f_i$ in such a way as to give a ribbon surface $Q_i(t_i(u,v))$ with a parabolic cross-section The "t-value" function of (1) may be defined as follows $$t_i(u,v)=((s_x-u)(s_x-e_x)+(s_y-v)(s_y-e_y))/((e_x-s_x)^2+(e_y-s_y)^2) \quad (27)$$

Note that Formula (25) computes $t_i(u,v)$ to be the parameterization value (between 0 and 1) for a point p(u,v) on the $i^{th}$ side of the base polygon in parameter space, wherein p(u,v) is the perpendicular drop point or projection of (u,v) onto the side of the base polygon. Moreover, $t_i$ is linear in u and v.

Various alternative computations for $t_i(u,v)$ are also within the scope of the present disclosure. In particular, $t_i(u,v)$ may be alternatively defined as follows:

$$t_i(u,v)=|(mu+b)-v|, \text{ or, } |t_i(u,v)=|(v-b)/m-u|.$$

The "distance" function $d_i(u,v)$ may be defined as follows:

$$d_i(u,v)=(mv+b-u)\sin(\arctan(m)). \quad (28)$$

Various alternative computations for $d_i(u,v)$ are within the scope of the present disclosure. In particular, $d_i(u,v)=[(mv+b-u)\sin(\arctan(m))]^2$ for m not vertical, and $(b-u)^2$ otherwise.

7.2 Results

Figure 54:
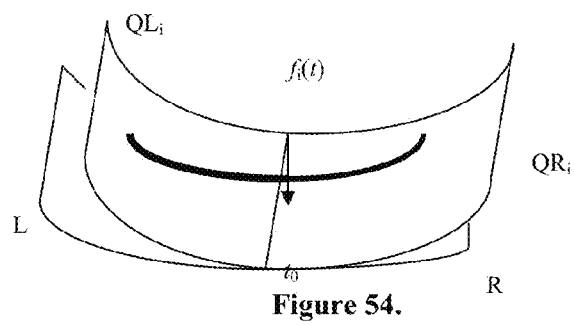
FIG. 54 shows how surface continuity follows the ribbon continuity, in particular, two ribbons $QL_i$ and $QR_i$ meet with $G^2$ continuity, i.e., any curve (bold) crossing the boundary is $G^2$ continuous, then the surfaces L and R will be $G^2$ continuous.

If two patches abut and their ribbon curves have $G^2$ continuity as shown in FIG. 54, then it can be shown that the surfaces will also have $G^2$ continuity.

Figures 55A, 55B:
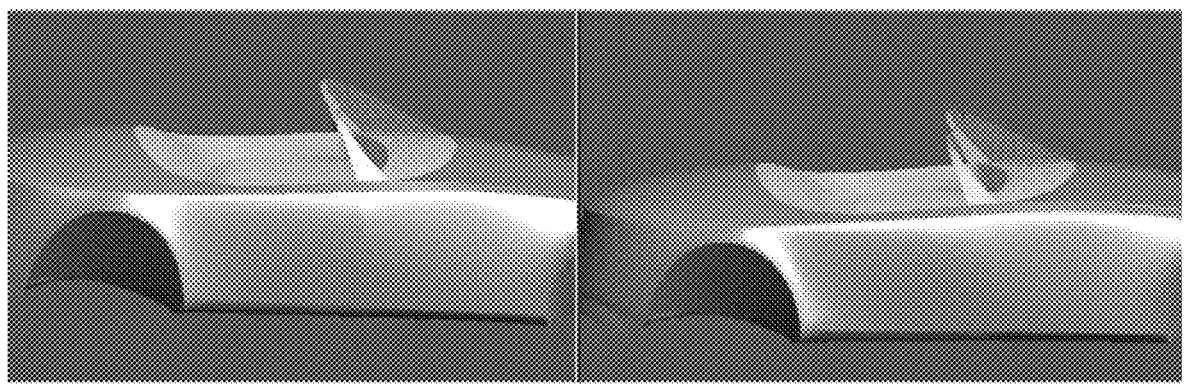
FIGS. 55A and 55B show, respectively, $G^1$ and $G^2$ geometric continuity surfaces of a car body.

FIGS. 55A and 55B compare the effect of the $G^1$ embodiment (the left auto body) to the $G^2$ embodiment (the right auto body). One will note the smoother appearance of the model with $G^2$ computation.

Figures 56A, 56B:
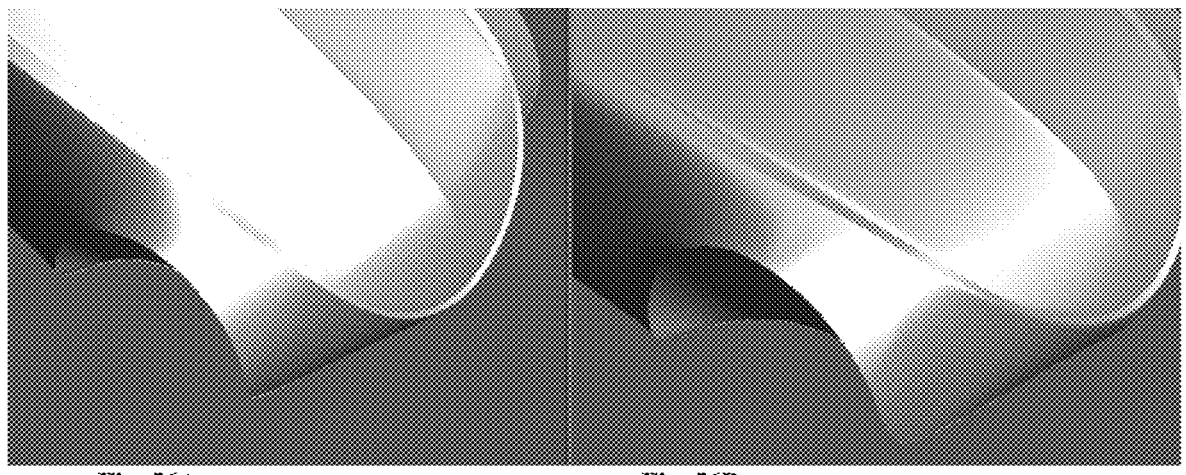
FIGS. 56A and 56B show, respectively, $G^1$ and $G^2$ geometric continuity surfaces of a car hood.

FIGS. 56A and 56B show yet another comparison of $G^1$ and $G^2$, wherein the left auto body front (FIG. 56A) was computed with $G^1$ and the right auto body front (FIG. 56B) was computed with $G^2$.

7.3 Defining the Ribbons

Lastly we discuss methods of defining the ribbons so that there are $G^2$ continuous as needed to make the surfaces $G^2$ continuous.

Figure 57A:
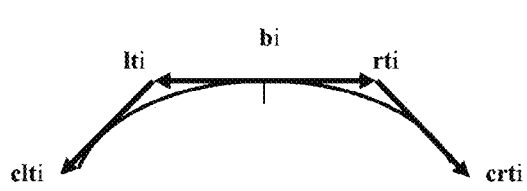
FIG. 57A shows offset vectors to create curve control points where the control points of the lofts are easily defined by offsetting the attribute curves control points b; with symmetric displacement vectors.
Figure 57B:
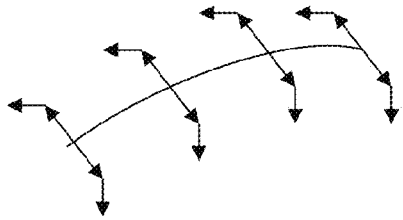
FIG. 57B shows offset vectors applied across a curve to create curve control points for ribbons in along the curve.

The particular method to define lofts in general with the requisite tangents or curvatures depends on the curve types chosen as boundary curves. we used B-spline curve boundaries where the control points of the lofts are easily defined by offsetting the attribute curves control points $b_i$ with symmetric displacement vectors as in the individual case in FIG. 57A. If the $rt_i$ and $lt_i$ are anti-parallel it guarantees $G^1$ continuity. If the parabolas defined by $crt_i$, $rt_i$ and $b_i$ have the same curvature as $clt_i$, $lt_i$ and $b_i$ for all i, then the patches will meet with $G^2$ continuity. Similar techniques apply to other parametric curves like Bezier, etc. FIG. 57B shows this technique applied to all the control points along a curve. The foregoing discussion of the invention has been presented for purposes of illustration and description. Further, the description is not intended to limit the invention to the form disclosed herein. Consequently, variation and modification commiserate with the above teachings, within the skill and knowledge of the relevant art, are within the scope of the present invention. The embodiment described hereinabove is further intended to explain the best mode presently known of practicing the invention and to enable others skilled in the art to utilize the invention as such, or in other embodiments, and with the various modifications required 55 by their particular application or uses of the invention.

8. Applications

A computational system according to the present disclosure may be used in a large number of computational design domains. In particular, the following list provides brief, descriptions of some of the areas where such a computational system can be applied.

8.1 Container Design

Free-form design of containers such as bottles has been heretofore non-intuitive and tedious. The present disclosure shows how to alleviate these drawbacks.

8.2 Automotive Design

In the automotive industry, the present disclosure can be used for auto body design as well as for auto component design. In particular, the ease with which deformations of parts and contours can be performed with a computational system according to the present disclosure allows for straightforward deformation of components and recesses so that the fitting of components in particular recesses is more easily designed.

8.3 Aerospace

The present disclosure provides high precision trimming and surface patching operations which are required by the aerospace industry.

8.4 Shipbuilding

Unique to the shipbuilding industry is the need for the design of ship hulls and propellers. Designs of both hulls and propellers may be driven by the physics of the constraints related to water flow. The satisfaction of such constraints can be incorporated into a computational system according to the present disclosure.

8.5 Traditional CAD/CAM Applications

Applications for the design of engines, piping layouts and sheet metal products typically require trimming and blending capabilities. Thus, since the present disclosure is particularly efficient at providing such operations as well as providing easy deformations of surfaces, its effectiveness in these areas may be of particular merit.

8.6 Other Applications

The following is a list of other areas where the present disclosure may be used for computational design. These are: home electronic and appliance design, plastic injection mold design, tool and die design, toy design, geological modeling, geographical modeling, mining design, art and entertainment, animation, sculpture, fluid dynamics, meteorology, heat flow, electromagnetics, plastic surgery, burn masks, orthodontics, prosthetics, clothing design, shoe design, architectural design, virtual reality design, scientific visualization of data, geometric models for training personnel (e.g., medical training).

The foregoing discussion of the invention has been presented for purposes of illustration and description. Further, the description is not intended to limit the invention to the form disclosed herein. Consequently, variations and modifications commensurate with the above teachings, within the skill and knowledge of the relevant art, are within the scope of the present disclosure. The embodiment described hereinabove is further intended to explain the best mode presently known of practicing the invention and to enable others skilled in the art to utilize the invention as such, or in other embodiments, and with the various modifications required by their particular application or uses of the invention. It is intended that the appended claims be construed to include alternative embodiments to the extent permitted by the prior art.

APPENDIX A

MATLAB Code for Patches

The following encodes the previous mathematics with MATLAB, and was used to generate the images.

```
% Lowest possible degree(?) power surface for triangular and
rectangular patches.
function gone = Convert( )
cla reset;
axis vis3d;
light('Position',[−50 0 50],'Style','infinite');
hold on
step = 0.05; % For display resolution
% Triangular patch
for v = 0:step:1-step
for u = 0:step:(1-v-step/2)
% 4 corners of the display rectangle, out of which we make 2 triangles
bl = PtoF(1,u,v); br = PtoF(1,u+step,v); % Find value on surface
ul = PtoF(1,u,v+step); ur = PtoF(1,u+step,v+step);
M1 = [bl;ul;br]; M2 = [ul;ur;br]; %Make display triangles
fill3(M1(:,1),M1(:,2),M1(:,3),'g','EdgeColor','none'); % shade
fill3(M2(:,1),M2(:,2),M2(:,3),'r','EdgeColor','none');
end
end
% Rectangular patch
for v = 0:step:1-step
for u = 0:step:1-step
% 4 corners of a display rectangle, out of which we make 2 triangles
bl = PtoF(2,u,v); br = PtoF(2,u+step,v); % Find value on surface
ul = PtoF(2,u,v+step); ur = PtoF(2,u+step,v+step);
M1 = [bl;ul;br]; M2 = [ul;ur;br]; % Make display triangles
fill3(M1(:,1),M1(:,2),M1(:,3),'g','EdgeColor','none'); % shade
fill3(M2(:,1),M2(:,2),M2(:,3),'r','EdgeColor','none');
end
end
% end of function Convert
function vert = PtoF(pat_idx,u,v) %Computes Point on Function
nm_sum = 0; dnm_sum = 0;
switch pat_idx
case 1
ft_num = 3; %Triangle
case 2
ft_num = 4; %Rectangle
end
for i = 1:ft_num % Final weighted sum
nm_sum = nm_sum+Weight(pat_idx,i,u,v)*Ribbon(pat_idx,i,u,v);
dnm_sum = dnm_sum+Weight(pat_idx,i,u,v);
end
vert = nm_sum/dnm_sum;
% end of function PtoF
% Cubic Rock Function - pi are control points
function pt = RockCub(p1,p0,p3,p2,t) %different order in arguments
than Bezier
Lt = (1-t)*p1+t*p0; Rt=(1-t)*p3+t*p2; %left and right tangents
pt = (1-RW(t))*Rt + RW(t)* Lt;
%end of RockCub function
% Distance function for base polygons - triangle and rectangle
function dt = DisTri(ft_idx,u,v)
switch ft_idx
case 1
dt = v;
case 2
dt = u;
case 3
% given a line v=mu+b, the distance from (u,v) to the line is
% (mv + b − u)*sin(arctan(m)) We choose m = −1, b = 1
dt = (−v + 1 − u)*0.707;
end % of function DisTri
function t = Trit(ft_idx,u,v) %t value on triangle
switch ft_idx
case 1
t = 1−u;
case 2
t = v;
case 3
t = (1+u-v)/2; % Expects line as in DisTri
end % of function Trit
function t = Rect(ft_idx,u,v) %t value on rectangle
switch ft_idx
case 1
t = 1−u;
```

APPENDIX A-continued

MATLAB Code for Patches

```
case 2
t = v;
case 3
t = u;
case 4
t= 1-v;
end % of function Rect
function dt = DisRec(ft_idx,u,v)
switch ft_idx
case 1
dt = v;
case 2
dt = u;
case 3
dt= 1-v;
case 4
dt= 1-u;
end % of function DisRec
function wt = Weight(pat_idx,ft_idx,u,v)
wt = 1.0;
switch pat_idx % Weights as in FreeDimension
case 1
for i=1:3
d = DisTri(i,u,v);
if i == ft_idx
dfac = 1-d^2;
else
dfac = d^2;
end %if
wt= wt*dfac;
end %for
case 2
for i=1:4
d = DisRec(i,u,v);
if i == ft_idx
dfac= 1-d^2;
else
dfac = d^2;
end %if
wt = wt*dfac;
end %for
end %switch
% end of function Weight
function wt = RW(t) %Rational weight function
wt = (t-1)^2/(2*t^2 - 2*t + 1);
%end of function RW
% Define curves and ribbon boundaries
function rib = Ribbon(pat_idx,ft_idx,u,v)
switch pat_idx
case 1 %triangle
A = [100 0 -90; 0 0 0; -70.7 70.7 -90]; % Curves
B = [100 0 0; -35 35 0; 20 150 -90]
C = [50 0 0; -70.7 70.7 0; 100 120 -90];
D = [0 0 0; -70.7 70.7 -90; 100 0 -90];
RA = [0 100 0; 100 100 0; 0 0 60]; % Boundaries
RB = [0 100 0; 100 100 0; 0 0 60];
RC = [0 100 0; 100 100 0; 0 0 60];
RD = [0 100 0; 100 100 0; 0 0 60];
dt = DisTri(ft_idx,u,v);
t = Trit(ft_idx,u,v);
case 2 %rectangle
A = [0 -100 -90; 0 0 0; 100 0 -90;100 -100 -90]; % Curves
B = [0 100 0; 50 0 0; 100 -33 -90; 67 -100 -90];
C = [0 -50 0; 100 0 0; 100 -67 -90; 33 -100 -90];
D = [0 0 0; 100 0 -90; 100 -100 -90; 0 -100 -90];
RA = [50 0 0; 0 -90 0; 0 0 60;0 0 60]; % Boundaries
RB = [50 0 0; 0 -90 0; 0 0 60;0 0 60];
RC = [50 0 0; 0 -90 0; 0 0 60;0 0 60];
RD = [50 0 0; 0 -90 0; 0 0 60;0 0 60];
dt = DisRec(ft_idx,u,v);
t = Rect(ft_idx,u,v);
end %switch
AR = A+RA; BR = B+RB; CR = C+RC; DR = D+RD; %Ribbons
computed by offsetting curve
a = A(ft_idx,:); b = B(ft_idx,:); %Curve
c = C(ft_idx,:); d = D(ft_idx,:);
ar = AR(ft_idx,:); br = BR(ft_idx,:); % Ribbon boundary
cr = CR(ft_idx,:); dr = DR(ft_idx,:);
rib = (1-dt)*RockCub(a,b,c,d,t)+dt*RockCub(ar,br,cr,dr,t);
%Blend of curve and ribbon
% end of function Ribbon
```

Conversion of FD Surface to Bezier

The following is an example of a 4-sided FreeDimension (FD) surface without tangency. to a Bezier surface.

The four sided FreeDimension (FD) surface was defined with 16 3D inputs, four on each curve. They are, for the ith curve:

msi=marker start mei=marker end chsi=curve handle start chei=curve handle end

The function has a numerator and denominator that are separately converted to Bezier form. The denominator is degree 4 in u and v. Just to get these things archived, we first write the FD denominator in matrix form, i.e. polynomial bases times the matrix gives us the function. The matrix is: DN:=(1)

Matrix(5, 5, {(1, 1)=−4, (1, 2)=8, (1, 3)=−2, (1, 4)=−2, (1, 5)=1, (2, 1)=8, (2, 2)=−16, (2, 3)=4, (2, 4)=4, (2, 5)=−2, (3, 1)=−2, (3, 2)=4, (3, 3)=0, (3, 4)=−2, (3, 5)=1, (4, 1)=−2, (4, 2)=4, (4, 3)=−2, (4, 4)=0, (4, 5)=0, (5, 1)=1, (5, 2)=−2, (5, 3)=1, (5, 4)=0, (5, 5)=0}) The conversion matrix that takes DN to Bezier form is Matrix(5, 5), (2)

{(1, 1)=0, (1,2)=0, (1,3)=1/6, (1,4)=0, (1,5)=0, (2, 1)=0, (2,2)=0, (2,3)=1/12, (2, 4)=0, (2, 5)=0, (3, 1)=1/6, (3, 2)=1/12, (3, 3)=0, (3, 4)=1/12, (3, 5)=1/6, (4, 1)=0, (4, 2)=0, (4, 3)=1/12, (4, 4)=0, (4, 5)=0, (5, 1)=0, (5, 2)=0, (5, 3)=1/6, (5, 4)=0, (5, 5)=0})

That is, one multiplies DN left and right by t (2) to get a new matrix, which when multiplied by the Bernstein polynomials gives a 4 by 4 Bezier surface that evaluates to the same denominator as the original form. It is

FDB4:=(3)

$(1-u)^4*(1-v)^2*v^2+2*(1-u)^3*u*(1-v)^2*v^2+6*(1-u)^2*u^2*(1/6*(1-v)^4+1/3*(1-v)^3*v+(1/3)*(1-v)*v^3+1/6*v^4)+2*(1-u)*u^3*(1-v)^2*v^2+u^4*(1-v)^2*v^2$

We now do the same things to the numerator. The matrix for the numerator in polynomial form is (4)

[[0,0,1/21 me1,3/35 che1,3/35 chs1,1/21 ms1,0,0],[0,0,5/147 me1, 3/49 che1,3/49 chs1,5/147 ms1,0,0],[1/21 ms2,5/147 ms2,1/49 me1+1/49 ms2,1/105 ms2+2/735 me4+9/245 che1,2/735 ms2+1/105 me4+9/245 chs1,1/49 me4,5/147 me4,1/21 me4],[3/35 chs2,3/49 chs2,1/105 me1+2/735 ms3+9/245 chs2,3/175 che1+3/175 chs2+6/1225 chs3+6/1225 che4,3/175 chs1+6/1225 chs2+6/1225 che3+3/175 che4,9/245 che4+1/105 ms1+2/735 me3,3/49 che4,3/35 che4],[3/35 che2,3/49 che2,2/735 me1+1/105 ms3+9/245 che2,3/175 chs3+6/1225 chs4+6/1225 che1+3/175 che2,3/175 che3+3/175 chs4+6/1225 chs1+6/1225 che2,9/245 chs4+2/735 ms1+1/105 me3,3/49 chs4,3/35 chs4], [1/21 me2,5/147 me2,1/49 ms3+1/49 me2,9/245 chs3+1/105 me2+2/735 ms4,9/245 che3+2/735 me2+1/105 ms4,1/49 me3+1/49 ms4, 5/147 ms4,1/21 ms4],[0,0,5/147 ms3,3/49 chs3,3/49 che3,5/147 me3, 0,0],[0,0,1/21 ms3,3/35 chs3,3/35 che3,1/21 me3,0,0]]

Notice that (4) has the vector control points msi, etc. The next matrix is converted to Bezier form. In other words, they are Bezier control points of the numerator, which could be used in an IGES file for transfer.

(5)
[[0,0,1/21 me1,3/35 che1,3/35 chs1,1/21 ms1,0,0],[0,0,5/147 me1, 3/49 che1,3/49 chs1,5/147 ms1,0,0],[1/21 ms2,5/147 ms2,1/49 me4+ 1/49 ms2,1/105 ms2+2/735 me4+9/245 che1,2/735 ms2+1/105 me4+ 9/245 chs1,1/49 ms1+1/49 me4,5/147 me4,1/21 me4],[3/35 chs2,3/49 chs2,1/105 me1+2/735 ms3+9/245 chs2,3/175 che1+3/175 chs2+ 6/1225 chs3+6/1225 che4,3/175 chs1+6/1225 chs2+6/1225 che3+3/175 che4,9/245 che4+1/105 ms1+2/735 me3,3/49 che4,3/35 che4],[3/35 che2,3/49 che2,2/735 me1+1/105 ms3+9/245 che2,3/175 chs3+6/1225 chs4+6/1225 che1+3/175 che2,3/175 che3+3/175 chs4+6/1225 chs1+ 6/1225 che2,9/245 chs4+2/735 ms1+1/105 me3,3/49 chs4,3/35 chs4], [1/21 me2,5/147 me2,1/49 ms3+1/49 me2,9/245 chs3+1/105 me2+ 2/735 ms4,9/245 che3+2/735 me2+1/105 ms4,1/49 me3+1/49 ms4, 5/147 ms4,1/21 ms4],[0,0,5/147 ms3,3/49 chs3,3/49 che3,5/147 me3, 0,0],[0,0,1/21 ms3,3/35 chs3,3/35 che3,1/21 me3,0,0]].
The final function is the Bezier surface obtained by multiplying (5) by the Bernstein polynomials.
FDB7:=(6)
$(1-u)^7*((1-v)^5*v^2*ms2+3*(1-v)^4*v'*chs2+3*(1-v)'*v^4*che2+(1-v)^2*v^5*me2)+7*(1-u)^6*u*(5/7*(1-v)^5*v^2*ms2+15/7*(1-v)^4*v^3*chs2+15/7*(1-v)^3*v^4*che2+5/7*(1-v)^2*v^5*me2)+21*(1-u)^5*u^2*(1/21*(1-v)^7*me1+5/21*(1-v)^6*v*me1+21*(1-v)^5*v^2*(1/49*me1+1/49*ms2)+35*(1-v)^4*v^3*(1/105*me1+2/735*ms3+9/245*chs2)+35*(1-v)^3*v^4*(2/735*me1+1/105*ms3+9/245*che2)+21*(1-v)^2*v^5*(1/49*ms3+1/49*me2)+(5/21)*(1-v)*v^6*ms3+1/21*v^7*ms3)+35*(1-u)^4*u^3*(3/35*(1-v)^7*che1+3/7*(1-v)^6*v*che1+21*(1-v)^5*v^2*(1/105*ms2+2/735*me4+9/245*che1)+35*(1-v)^4*v^3*(3/175*che1+3/175*chs2+6/1225*chs3+6/1225*che4)+35*(1-v)^3*v^4*(3/175*chs3+6/1225*chs4+6/1225*che1+3/175*che2)+21*(1-v)^2*v^5*(9/245*chs3+1/105*me2+2/735*ms4)+(3/7)*(1-v)*v^6*chs3+3/35*v^7*chs3)+35*(1-U)^3*u^4*(3/35*(1-v)^7*chs1+3/7*(1-v)^6*v*chs1+21*(1-v)^5*v^2*(2/735*ms2+1/105*me4+9/245*chs1)+35*(1-v)^4*v^3*(3/175*chs1+6/1225*chs2+6/1225*che3+3/175*che4)+35*(1-v)^3*v^4*(3/175*che3+3/175*chs4+6/1225*chs1+6/1225*che2)+21*(1-v)^2*v^5*(9/245*che3+2/735*me2+1/105*ms4)+(3/7)*(1-v)*v^6*che3+3/35*v^7*che3)+21*(1-u)^2*u^5*(1/21*(1-v)^7*ms1+5/21*(1-v)^6*v*ms1+21*(1-v)^5*v^2*(1/49*ms1+1/49*me4)+35*(1-v)^4*v^3*(9/245*che4+1/105*ms1+2/735*me3)+35*(1-v)^3*v^4*(9/245*chs4+2/735*ms1+1/105*me3)+21*(1-v)^2*v^5*(1/49*me3+1/49*ms4)+(5/21)*(1-v)*v^6*me3+1/21*v^7*me3)+7*(1-u)*u^6*(5/7*(1-v)^5*v^2*me4+15/7*(1-v)^4*v^3*che4+15/7*(1-v)^3*v^4*chs4+5/7*(1-v)^2*v^5*ms4)+u^7*((1-v)^5*v^2*me4+3*(1-v)^4*v^3*che4+3*(1-v)^3*v^4*chs4+(1-v)^2*v^5*ms4)$ It is easy to see from (6) that the degree of the numerator is 7 in both variables. The degree of the denominator for the Bezier form in (3) is only 4. Conversion of Bezier to B-spline is reasonably straightforward and changes only the knot vector. The control points are the same. Adding the tangent form doubles the number of control points, but only adds one degree to the numerator; thus degree 8 over degree 4. In general, adding a side to the surface will add 2 degrees top and bottom to the function.

What is claimed is:

1. A method for creating an optically smooth geometric model, comprising:
forming a loop from a plurality of parametrically defined curves;
creating a plurality of ribbons along each of the plurality of parametrically defined curves of the loop, each ribbon between a preceding parametrically defined curve of the loop and a subsequent parametrically defined curve of the loop; and
blending the ribbons to form a multi-sided surface patch between the parametrically defined curves, wherein a portion of each ribbon is Gkgeometric continuous with a portion of another ribbon of the plurality of ribbons, wherein k is dependent upon one or more criteria for optical smoothness of the geometric model.

2. The method of claim 1, wherein the forming the loop from the plurality of parametrically defined curves further comprises forming from a polyhedral mesh of the geometric model.

3. The method of claim 2, wherein the forming the loop from the plurality of parametrically defined curves further comprises constructing each of the plurality of parametrically defined curves between polygons of the polyhedral mesh having a common edge.

4. The method of claim 3, wherein the forming the loop from the plurality of parametrically defined curves further comprises forming the loop from a number of curves equal to a count of center points of the polyhedral mesh.

5. The method of claim 1, wherein the creating the ribbon comprises, along each parametrically defined curve, interpolating between the preceding parametrically defined curve of the loop and the subsequent parametrically defined curve of the loop.

6. The method of 1, wherein the creating the ribbon comprises, creating by forming a ribbon fiber between each parametrically defined curve, a parametrically defined midcurve and a parametrically defined opposite curve.

7. The method of claim 1, wherein the blending the ribbons comprises computing a weighted sum of the ribbons.

8. The method of claim 7, wherein the computing the weighted sum of the ribbons comprises weighting parameter points of the ribbons according to distances of the parameter points from each of the plurality of parametrically defined curves.

9. The method of claim 8, further comprising defining the distances of the parameter points relative to distances measured between points in a fundamental polygon and sides of the fundamental polygon.

10. A method for creating an optically smooth geometric model, comprising:
forming a loop from a plurality of parametrically defined curves;
creating a plurality of ribbons along each of the plurality of parametrically defined curves of the loop, each ribbon between a preceding parametrically defined curve of the loop and a subsequent parametrically defined curve of the loop; and
blending the ribbons to form a multi-sided surface patch between the parametrically defined curves, wherein a portion of each ribbon is $G^2$ geometric continuous and not $G^3$ geometric continuous with a portion of another ribbon of the plurality of ribbons.

11. A non-transitory computer-readable medium comprising computer executable code for performing the method of claim 1.

12. A non-transitory computer-readable medium comprising computer executable code for performing the method of claim 2.

13. A non-transitory computer-readable medium comprising computer executable code for performing the method of claim 3.

14. A non-transitory computer-readable medium comprising computer executable code for performing the method of claim 4.

15. A non-transitory computer-readable medium comprising computer executable code for performing the method of claim 5.

16. A non-transitory computer-readable medium comprising computer executable code for performing the method of claim 6.

17. A non-transitory computer-readable medium comprising computer executable code for performing the method of claim 7.

18. A non-transitory computer-readable medium comprising computer executable code for performing the method of claim 8.

19. A non-transitory computer-readable medium comprising computer executable code for performing the method of claim 9.

20. A non-transitory computer-readable medium comprising computer executable code for performing the method of claim 10.

\* \* \* \* \*